US008624760B2

(12) United States Patent
Ngo et al.

(10) Patent No.: US 8,624,760 B2
(45) Date of Patent: Jan. 7, 2014

(54) APPARATUSES AND METHODS FOR RATE CONVERSION AND FRACTIONAL DELAY CALCULATION USING A COEFFICIENT LOOK UP TABLE

(75) Inventors: Christopher Truong Ngo, Queen Creek, AZ (US); Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/423,649

(22) Filed: Mar. 19, 2012

(65) Prior Publication Data

US 2012/0200435 A1 Aug. 9, 2012

Related U.S. Application Data

(63) Continuation-in-part of application No. 13/367,973, filed on Feb. 7, 2012.

(60) Provisional application No. 61/454,141, filed on Mar. 18, 2011, provisional application No. 61/454,226, filed on Mar. 18, 2011, provisional application No. 61/440,089, filed on Feb. 7, 2011.

(51) Int. Cl.
*H03M 7/00* (2006.01)

(52) U.S. Cl.
USPC ............................................. 341/61; 341/122

(58) Field of Classification Search
USPC ............ 341/61, 122, 123; 375/344, 216, 240, 375/295, 355, 222, 376, 350; 700/94, 211; 370/545
See application file for complete search history.

(56) References Cited

U.S. PATENT DOCUMENTS

| 4,996,500 | A | 2/1991 | Larson et al. |
|---|---|---|---|
| 5,311,309 | A | 5/1994 | Ersoz et al. |
| 5,351,087 | A | 9/1994 | Christopher et al. |
| 5,414,614 | A | 5/1995 | Fette et al. |
| 5,420,643 | A | 5/1995 | Romesburg et al. |
| 5,486,871 | A | 1/1996 | Filliman et al. |

(Continued)

FOREIGN PATENT DOCUMENTS

| EP | 0755121 A2 | 1/1997 |
|---|---|---|
| EP | 1492227 A1 | 12/2004 |

(Continued)

OTHER PUBLICATIONS

International Search Report for PCT/US2011/054106 mailed Feb. 9, 2012, 11 pages.

(Continued)

*Primary Examiner* — Joseph Lauture
(74) *Attorney, Agent, or Firm* — Withrow & Terranova, P.L.L.C.

(57) ABSTRACT

A system and method for performing sample rate conversion and creating fractional delays to a signal is disclosed. The system comprises a filter, a look up table for storing coefficients for sample rate conversion and fractional delays, and control circuitry configured to use an indexing scheme to select one or more coefficients from the look up table for rate conversion and fractional delays. The coefficients stored in the look up table comprise the coefficients required to generate delays in desired increments of a sample rate. In the disclosed method, the one or more coefficients necessary for a desired sample rate and fractional delay are selected from a single look up table and provided to a filter to delay the signal based upon the input sample rate.

34 Claims, 28 Drawing Sheets

(56) References Cited

U.S. PATENT DOCUMENTS

| | | |
|---|---|---|
| 5,532,916 A | 7/1996 | Tamagawa |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,348,780 B1 | 2/2002 | Grant |
| 6,559,689 B1 | 5/2003 | Clark |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 * | 3/2004 | Lam .............................. 455/273 |
| 6,728,163 B2 | 4/2004 | Gomm et al. |
| 6,819,938 B2 | 11/2004 | Sahota |
| 6,995,995 B2 | 2/2006 | Zeng et al. |
| 7,058,373 B2 | 6/2006 | Grigore |
| 7,164,893 B2 | 1/2007 | Leizerovich et al. |
| 7,233,130 B1 | 6/2007 | Kay |
| 7,411,316 B2 | 8/2008 | Pai |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,907,010 B2 | 3/2011 | Wendt et al. |
| 7,923,974 B2 | 4/2011 | Martin et al. |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,068,622 B2 | 11/2011 | Melanson et al. |
| 8,081,199 B2 | 12/2011 | Takata et al. |
| 8,093,951 B1 | 1/2012 | Zhang et al. |
| 8,164,388 B2 | 4/2012 | Iwamatsu |
| 8,174,313 B2 | 5/2012 | Vice et al. |
| 8,198,941 B2 | 6/2012 | Lesso |
| 8,204,456 B2 | 6/2012 | Xu et al. |
| 8,542,061 B2 | 9/2013 | Levesque et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0122171 A1 | 6/2005 | Miki et al. |
| 2005/0156662 A1 | 7/2005 | Raghupathy et al. |
| 2005/0157778 A1 | 7/2005 | Trachewsky et al. |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0183532 A1 | 8/2007 | Matero |
| 2007/0259628 A1 | 11/2007 | Carmel et al. |
| 2008/0044041 A1 | 2/2008 | Tucker et al. |
| 2008/0081572 A1 | 4/2008 | Rofougaran |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0167260 A1 | 7/2009 | Pauritsch et al. |
| 2009/0174466 A1 | 7/2009 | Hsieh et al. |
| 2009/0190699 A1 | 7/2009 | Kazakevich et al. |
| 2009/0218995 A1 | 9/2009 | Ahn |
| 2009/0289720 A1 | 11/2009 | Takinami et al. |
| 2009/0319065 A1 * | 12/2009 | Risbo .............................. 700/94 |
| 2010/0017553 A1 | 1/2010 | Laurencin et al. |
| 2010/0171553 A1 | 7/2010 | Okubo et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2011/0018626 A1 | 1/2011 | Kojima |
| 2011/0084760 A1 | 4/2011 | Guo et al. |
| 2011/0148375 A1 | 6/2011 | Tsuji |
| 2011/0235827 A1 | 9/2011 | Lesso et al. |
| 2012/0034893 A1 | 2/2012 | Baxter et al. |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0170334 A1 | 7/2012 | Menegoli et al. |
| 2012/0176196 A1 | 7/2012 | Khlat |
| 2012/0236444 A1 | 9/2012 | Srivastava et al. |
| 2012/0299647 A1 | 11/2012 | Honjo et al. |
| 2013/0034139 A1 | 2/2013 | Khlat et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006073208 A1 | 7/2006 |

OTHER PUBLICATIONS

International Search Report for PCT/US12/40317 mailed Sep. 7, 2012, 7 pages.

(56) References Cited

OTHER PUBLICATIONS

International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html?cmp_ids=71&news_ids=222901746.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Knutson, P, et al., "An Optimal Approach To Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 20-24, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Tecnology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
International Search Report for US PCT/US2012/036858 mailed Aug. 9, 2012, 7 pages.
International Search Report for US PCT/US2012/036858 mailed Aug. 10, 2012, 8 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
International Preliminary Report on Patentability for PCT/US2011/064255, mailed Jun. 20, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Notice of Allowance for U.S. Appl. No. 13/188,024, mailed Jun. 18, 2013, 7 pages.
Advisory Action for U.S. Appl. No. 13/222,484, mailed Jun. 14, 2013, 3 pages.
Notice of Allowance for U.S. Appl. No. 13/343,840, mailed Jul. 1, 2013, 8 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

(56) References Cited

OTHER PUBLICATIONS

Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/602,856, mailed Sep. 24, 2013, 9 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Non-Final Office Action for U.S. Appl. No. 12/836,307, mailed Nov. 5, 2013, 6 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.

* cited by examiner

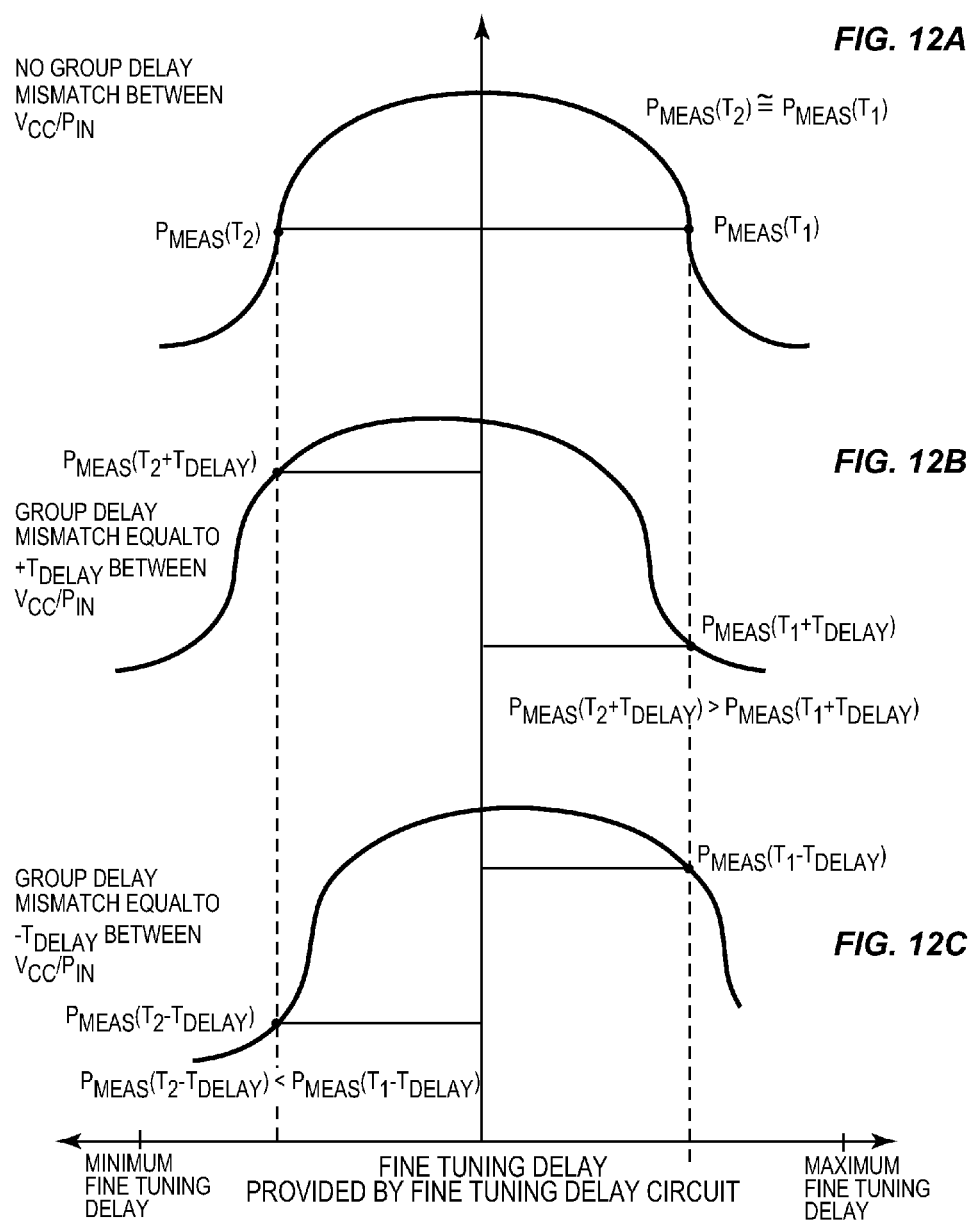

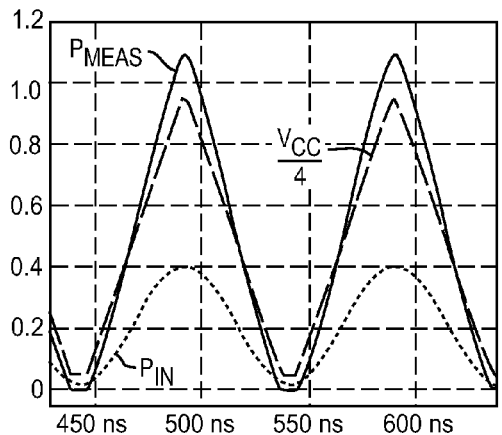

NO GROUP DELAY MISMATCH BETWEEN $V_{CC}/P_{IN}$ $P_{OUT\_MAX} \approx +25$ dBm

MODULATED SIGNAL, $P_{IN}$, IS A SUBSTANTIALLY SYMMETRIC SIGNAL HAVING A FREQUENCY OF 10 MHz

*FIG. 13A*

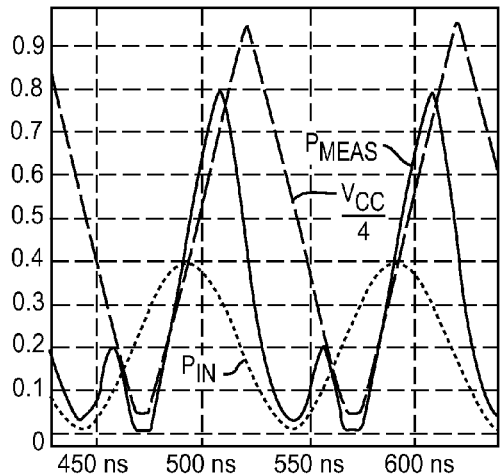

GROUP DELAY MISMATCH EQUAL TO $+T_{DELAY}$ BETWEEN $V_{CC}/P_{IN}$

MODULATED SIGNAL, $P_{IN}$, IS A SUBSTANTIALLY SYMMETRIC SIGNAL HAVING A FREQUENCY OF 10 MHz

*FIG. 13B*

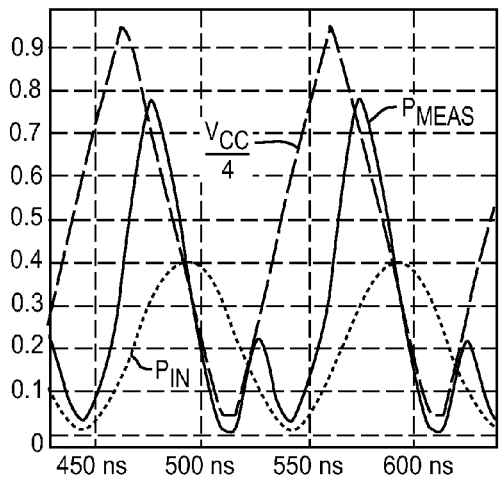

GROUP DELAY MISMATCH EQUAL TO $-T_{DELAY}$ BETWEEN $V_{CC}/P_{IN}$

MODULATED SIGNAL, $P_{IN}$, IS A SUBSTANTIALLY SYMMETRIC SIGNAL HAVING A FREQUENCY OF 10 MHz

APPARATUSES AND METHODS FOR RATE CONVERSION AND FRACTIONAL DELAY CALCULATION USING A COEFFICIENT LOOK UP TABLE

RELATED APPLICATIONS

This application claims the benefit of U.S. provisional patent application No. 61/454,141, filed Mar. 18, 2011, and U.S. provisional patent application No. 61/454,226, filed Mar. 18, 2011, the disclosures of which are both incorporated herein by reference in their entireties.

This application is also a continuation-in-part application of, and claims the benefit of, U.S. patent application Ser. No. 13/367,973, filed Feb. 7, 2012, entitled "Group Delay Calibration Method for Power Amplifier Envelope Tracking," which claims priority to U.S. provisional patent application No. 61/440,089, filed Feb. 7, 2011, the disclosures of which are both incorporated herein by reference in their entireties.

FIELD OF THE DISCLOSURE

The embodiments described herein relate to the operation, use, and calibration of an open loop envelope tracker system for sending data transmissions. The embodiments described herein are further related to systems and techniques for optimizing a calibration of a group delay of a modulated power amplifier supply voltage with respect to a modulated signal to be transmitted by a radio frequency power amplifier. The embodiments described herein are further related to systems and techniques for using a look up table (LUT) and an intelligent coefficient indexing scheme for a rate converter, such as in an open loop envelope tracker system for sending data transmissions.

BACKGROUND

Envelope tracking systems for wide bandwidth modulation systems may be sensitive to the time-alignment between the modulated power amplifier supply voltage provided to a radio frequency power amplifier and a modulated radio frequency envelope signal provided as a signal input of the radio frequency power amplifier. A delay misalignment between the modulated power amplifier supply voltage and the radio frequency modulated envelope signal provided may result in spectrum and error vector magnitude degradation at an output of the radio frequency power amplifier. As an example, in the case of an LTE signal having a 10 MHz channel bandwidth, the spectrum requirements cannot be met when the absolute delay mismatch between the modulated power amplifier supply voltage and the radio frequency modulated envelope signal received by the radio frequency power amplifier is greater than four nanoseconds.

In addition, because detectors used to measure an output power at an output of the radio frequency power amplifier include offset errors and suffer from limited or low sensitivity with respect to delay mismatch, calibration techniques based on minimizing mismatch delay by determining an offset delay that provides maximum output power may not be repeatable or reliable.

Accordingly, there is a need for a new system and technique for configuring and calibrating open loop envelope tracking systems to minimize group delay misalignment between the modulated power amplifier supply voltage and the radio frequency modulated envelope signal. In addition, there is a need to develop a new system and technique for configuring an open loop envelope tracking system during factor calibration or phone operation that minimizes or eliminates special external factory equipment or complex internal circuitries inside a communication device.

Furthermore, in an envelope tracking system, where a digital predistorted envelope signal is generated to modulate a PA supply, the input sample rate of the digital signal vramp is variable, based upon the modulation format and bandwidth. However, the final sample rate is always the same. This requires many interpolation rates to be implemented. Very fine timing control of the vramp delay is also required (as fine as 0.5 nanoseconds), where vramp is a digital signal representing the predistorted envelope signal. The fine delay control and many interpolation ratios can lead to the need or several very large coefficient look up tables (LUTs) to perform all of the required rate conversions and fractional delays. These large LUTs require a lot of digital area, consume large amounts of power, and may not be realizable from a digital timing perspective. Accordingly, there is also a need for an improved method and apparatus to decrease the size and power consumption of a rate converter in an envelope tracking system.

SUMMARY

Embodiments disclosed in the detailed description relate to an open loop envelope tracking system, calibration techniques and circuitry for calibration of the open loop envelope tracking system. The open loop envelope tracking system calibration technique and circuitry are proposed. A radio frequency power amplifier receives a modulated signal. An envelope tracker power converter generates a modulated power amplifier supply voltage for the radio frequency power amplifier based a control signal derived from the modulated signal. A first measured output power and a second measured output power of the radio frequency power amplifier are measured when the control signal is respectively delayed by a first delay period and a second delay period. A sensitivity of the output power of the radio frequency power amplifier is near a maximum near the first delay period and the second delay period. The first delay period and/or the second delay period are adjusted until the first measured output power substantially equals the second measured output power. The first delay period and the second delay period are used to obtain a calibrated fine tuning delay offset.

A first embodiment of an open loop envelope tracking system includes a digital baseband circuit configured to generate a modulated signal based on a calibration test signal and a control signal based on the calibration test signal and a fine tuning delay setting of a fine tuning delay circuit. An envelope tracker power converter generates a modulated power amplifier supply voltage based on the control signal. A radio frequency power amplifier generates a radio frequency power amplifier output signal based on the modulated signal and the modulated power amplifier supply voltage. A detector generates an output power measurement for the radio frequency power amplifier output signal. Controller circuitry may set the fine tuning delay setting to a first fine tuning delay setting in order to obtain a first measured output power from the radio frequency power amplifier output signal based on the output power measurement generated by the detector while the fine tuning delay setting is set to the first fine tuning delay setting. The controller circuitry may also set the fine tuning delay setting to a second fine tuning delay setting in order to obtain a second measured output power from the radio frequency power amplifier output signal based on the output power measurement generated by the detector while the fine tuning delay setting is set to the second fine tuning delay setting.

Thereafter, the controller circuitry may determine a calibrated fine tuning offset delay setting based on the first fine tuning delay setting and the second fine tuning delay setting. The first fine tuning delay setting and the second fine tuning delay setting may each be near a fine tuning delay setting at which an output power of the radio frequency power amplifier output signal has a maximum sensitivity to a change in the fine tuning delay setting. To determine whether the first measured output power substantially equals the second measured output power, the controller circuitry may calculate a power difference between the first measured output power and the second measured output power. The controller circuitry may compare the power difference to a maximum power difference threshold. Based on a determination that the power difference fails to exceed a maximum power difference threshold, the controller circuitry may determine that the first measured output power substantially equals the second measured output power and store the calibrated fine tuning offset delay setting in a memory associated with the controller circuitry. In some embodiments, the controller circuitry may set the calibrated fine tuning offset delay setting substantially equal to half a sum of the first fine tuning delay setting and the second fine tuning delay setting. In those embodiments where the first fine tuning delay setting is a positive fine tuning delay setting and the second fine tuning delay setting is a negative fine tuning delay setting, the controller circuitry may set the calibrated fine tuning offset delay setting substantially equal to half a sum of the positive fine tuning delay setting and the negative fine tuning delay setting. In some embodiments, the test signal provided to digital baseband circuit may generate a modulated signal that has a substantially sinusoidal envelope. Alternatively, the test signal may be selected such that the digital based band circuit generates a modulated signal that is a carrier wave tone signal. In some instances, a frequency of the modulated signal is based on a band of operation of a communication network for which a communication device is configured to operate. Upon determining a calibrated fine tuning offset delay, the controller circuitry may obtain a temperature measurement from the envelope tracker power converter. The controller circuitry may store the temperature measurement as a calibrated temperature in association with the calibrated fine tuning offset delay setting in the memory. In addition, in some embodiments, the controller circuitry may also obtain a supply voltage measurement from the envelope tracker power converter based on the determination that the power difference fails to exceed the maximum power difference threshold. Thereafter, the controller circuitry may store the supply voltage measurement as a calibrated supply voltage in association with the calibrated fine tuning offset delay setting in the memory. In some embodiments, the calibrated temperature and the calibrated supply voltage may be used to adjust a fine tuning delay setting prior to initiation of a data transmission. For example, prior to initiation of a data transmission, obtain an operational temperature of the envelope tracker power converter and determine a fine tuning delay temperature compensation adjustment based on the operational temperature and the calibrated temperature. In addition, the controller circuitry may determine a fine tuning offset delay setting for the fine tuning delay circuit based on the calibrated fine tuning offset delay setting and the fine tuning delay temperature compensation adjustment. Thereafter, the controller circuitry may set the fine tuning delay setting of the fine tuning delay circuit equal to the fine tuning offset delay setting.

In some embodiments of the open loop envelope tracking system of the controller circuitry may determine that the first measured output power is unequal to the second measured output power based a determination that the power difference exceeds the maximum power difference threshold. As a non-limiting example, in some embodiments, the controller circuitry may incrementally adjust at least one of the first fine tuning delay setting and the second fine tuning delay setting to determine the first fine tuning delay setting and the second fine tuning setting at which the first measured output power substantially equals the second measured output power. For example, the controller circuitry may incrementally adjust both the first fine tuning delay setting and the second fine tuning delay setting to determine the first fine tuning delay setting and the second fine tuning delay setting at which the first measured output power substantially equals the second measured output power. As another example, the controller circuitry may incrementally adjust only one of the first fine tuning delay setting and the second fine tuning delay setting to determine the first fine tuning delay setting and the second fine tuning delay setting at which the first measured output power substantially equals the second measured output power. In some embodiments of the open loop envelope tracking system, the controller circuitry may determine whether the first measured output power is greater than the second measured output power based on the power difference before adjusting the at least one of the first fine tuning delay setting and the second fine tuning delay setting. In some embodiments, based on a determination that the first measured output power is greater than the second measured output power, the controller circuitry incrementally adjusts only the first fine tuning delay setting to determine the first fine tuning delay setting and the second fine tuning delay setting at which the first measured output power substantially equals the second measured output power. Alternatively, in other embodiments, the controller circuitry may incrementally adjust only the second fine tuning delay setting to determine the second fine tuning delay setting at which the first measured output power substantially equals the second measured output power based on a determination that the second measured output power is less than the first measured output power. In still other embodiments, where the first fine tuning delay setting is greater than the second fine tuning delay setting, the controller circuitry may incrementally adjust only the first fine tuning delay setting to determine the first fine tuning delay setting at which the first measured output power substantially equals the second measured output power. Alternatively, in other embodiments, the controller circuitry may incrementally adjust only the second fine tuning delay setting to determine the second fine tuning delay setting at which the first measured output power substantially equals the second measured output power because the second fine tuning delay setting is less that the first fine tuning delay setting.

Some embodiments of the open loop envelope tracking system include a method for calibrating a group delay for an open loop envelope tracking system. As an example, the method may include generating a radio frequency power amplifier output signal having a first output power at an output of a radio frequency power amplifier based on a modulated signal as a function of a control signal delayed in time by a first delay relative to the modulated signal. In addition, the method may include generating the radio frequency power amplifier output signal having a second output power at the output of the radio frequency power amplifier as the function of the control signal delayed in time by a second delay relative to the modulated signal. Thereafter, the method may determine a calibrated offset delay as a function of the second delay and the first delay. As an example, the method may calculate a power difference between the first output power and the second output power and determine whether the first output power substantially equals the second output power based on the power difference based on the power difference. Illustratively, to determine that the first output power substantially equal the second output power based on the power difference, the method may compare a magnitude of the power difference to a maximum power difference threshold. Based on a determination that the magnitude of the power difference fails to exceed the maximum power difference threshold, the method may determine that the first output power substantially equals the second output power. A sensitivity of an output power of a radio frequency power amplifier output signal generated by the radio frequency power amplifier based on the modulated signal as the function of the control signal delayed in time by the first delay may be substantially near a maximum value. Likewise, the sensitivity of the output power of the radio frequency power amplifier output signal generated by the radio frequency power amplifier based on the modulated signal as the function of the control signal delayed in time by the second delay may also be substantially near the maximum value.

In some embodiments of the method for calibrating the group delay for the open loop envelope tracking system of claim, the calibrated offset delay is a calibrated fine tuning offset delay setting for a fine tuning delay circuit located in a baseband processing circuit in communication with an envelope tracker power converter. The method further includes adjusting a group delay between the control signal and the modulated signal based on a fine tuning delay setting of the fine tuning delay circuit. For example, in some embodiments, the calibrated offset delay is determined as the function of the second delay and the first delay. Illustratively, the calibrated offset delay may be set to substantially equal to half a sum of the second delay and the first delay. Alternatively, where the second delay is less than zero and the first delay is greater than zero, the calibrated offset delay may be determined as the function of the second delay and the first delay by setting the calibrated offset delay substantially equal to a sum of the second delay and the first delay. Alternatively, the calibrated offset delay may be determined as the function of the second delay and the first delay by setting the calibrated offset delay substantially equal to half a sum of the first delay and the second delay. In the case where the first delay is a positive fine tuning delay and the second delay is a negative fine tuning delay the calibrated offset delay may be determined as the function of the second delay and the first delay by setting the calibrated offset delay substantially equal to half a sum of the positive fine tuning delay and the negative fine tuning delay. However, in some embodiments, the calibrated offset delay may be set substantially equal to half a sum of a magnitude of the positive fine tuning delay less a magnitude of the negative fine tuning delay. The method may further include providing a test signal to a digital baseband circuit such that the based band circuit generates a modulated signal having a substantially symmetric envelope characteristic, The radio frequency power amplifier may receive the modulated signal at the radio frequency power amplifier. In some cases, the modulated signal has a substantially sinusoidal envelope. In other cases, the modulated signal may be a carrier wave tone signal. For example, the carrier wave tone signal may have a frequency at about 10 MHz. Alternatively, the frequency of the modulated signal may be based on a band of operation of a communication network.

In some embodiments, to generate the radio frequency power amplifier output signal having the first output power at the output of the radio frequency power amplifier based on the modulated signal as the function of the control signal delayed in time by the first delay relative to the modulated signal, the method includes receiving, at an envelope tracker power converter, the control signal delayed in time by the first delay, which generates a modulated power amplifier supply voltage based on the control signal delayed in time by the first delay. The radio frequency power amplifier generates the radio frequency power amplifier output signal having the first output power based on the modulated signal and the modulated power amplifier supply voltage. A detector may be used to measure an output power at the output of the radio frequency power amplifier to obtain the first output power. Similarly, to generate the radio frequency power amplifier output signal having the second output power at the output of the radio frequency power amplifier based on the modulated signal as the function of the control signal delayed in time by the second delay relative to the modulated signal, the method may include receiving, at the envelope tracker power converter, the control signal delayed in time by the second delay, which generates the modulated power amplifier supply voltage based on the control signal delayed in time by the second delay. The radio frequency power amplifier then generates the radio frequency power amplifier output signal having the second output power based on the modulated signal and the modulated power amplifier supply voltage. The detector may then measure the output power at the output of the radio frequency power amplifier to obtain the second output power.

Some embodiments of the method for calibrating the open loop envelope tracking system further include obtaining a temperature of an envelope tracker power converter upon determination of the calibrated offset delay and storing the temperature as a calibrated temperature in association with the calibrated offset delay. During normal operation of the communication device, the method may include configuring an offset delay of a fine tuning delay circuit of a digital baseband circuit based on the calibrated offset delay and providing the control signal to the envelope tracker power converter based on the offset delay of the fine tuning delay circuit. The envelope tracker power converter then generates a modulated power amplifier supply voltage based on the control signal and provides the modulated power amplifier supply voltage to the radio frequency power amplifier.

Still other embodiments of the method for calibrating the open loop envelope tracking system further include adjusting the offset delay of a fine tuning delay circuit for temperature variations prior to initiation of a data transmission. To determine a fine tuning delay temperature compensation adjustment, the method may obtain an operational temperature of the envelope tracker power converter. Upon obtaining the operational temperature of the envelope tracker power converter, the fine tuning delay temperature compensation adjustment is determined based on the operational temperature and the calibrated temperature. Thereafter, the offset delay of a fine tuning delay circuit is adjusted based on the fine tuning delay temperature compensation adjustment prior to initiating the data transmission. Some embodiments of the method may further determine a supply voltage compensation adjustment. Illustratively, the method may obtain a supply voltage measurement of the envelope tracker power converter upon determination of the calibrated offset delay, and store the supply voltage measurement as a calibrated supply voltage in association with the calibrated offset delay. Prior to initiation of a data transmission, the method determines a fine tuning delay supply voltage compensation adjustment by obtaining an operational temperature and an operational supply voltage measurement of the envelope tracker power converter. Thereafter, the method may include determining a fine tuning delay temperature compensation adjustment based on the operational temperature and the calibrated temperature and determining a fine tuning delay supply voltage compensation adjustment based on the operational supply voltage measurement and the calibrated supply voltage. The offset delay of the fine tuning delay circuit may then be adjusted based on the fine tuning delay temperature compensation adjustment and the fine tuning delay supply voltage compensation adjustment.

Another example embodiment includes a method for calibrating a group delay for the open loop envelope tracking system. The method may include obtaining an initial value for a negative fine tuning delay and an initial value for a positive fine tuning delay. The radio frequency power amplifier may receive a substantially symmetric modulated signal. Thereafter, until a determination that a negative fine tuning delay output power is substantially equal to a positive fine tuning delay output power, the method may include recursively carrying out a process including: generating a modulated power amplifier supply control signal related to the substantially symmetric modulated signal based on the positive fine tuning delay, generating a modulated power amplifier supply voltage related to the substantially symmetric modulated signal based on the modulated power amplifier supply control signal advanced in time by the negative fine tuning delay, measuring the negative fine tuning delay output power of the radio frequency power amplifier, generating the modulated power amplifier supply control signal related to the substantially symmetric modulated signal based on the positive fine tuning delay, generating a modulated power amplifier supply voltage related to the substantially symmetric modulated signal based on the modulated power amplifier supply control signal delayed in time by the positive fine tuning delay, measuring the positive fine tuning delay output power of the radio frequency power amplifier, determining whether the negative fine tuning delay output power is substantially equal to the positive fine tuning delay output power, and in response to a determination that the negative fine tuning delay output power is substantially unequal to the positive fine tuning delay output power, adjusting the negative fine tuning delay and the positive fine tuning delay based on the negative fine tuning delay output power and the positive fine tuning delay output power. After the determination that the negative fine tuning delay output power is substantially equal to the positive fine tuning delay output power, the method may include determining a calibrated fine tuning delay based on the negative fine tuning delay and the positive fine tuning delay.

Further, a method and system is disclosed for calibrating the group delay for a power amplifier envelope tracking system. The described system includes a fine tuning delay circuit which can be used in a method for setting the fine tuning delay of the $V_{RAMP}$ delay where $V_{RAMP}$ is a digital signal representing the pre-distorted envelope signal used to control generation of the modulated supply voltage, $V_{CC}$, generated by the envelope tracker. $V_{CC}$ is provided to the collector of the RF amplifier.

In another embodiment, the fine tuning delay circuit may be combined with an up-converter. In one embodiment, an interpolator in combination with a FIFO both up samples the incoming data stream to create a $V_{RAMP}$ signal for driving the envelope tracker and temporally adjusts the $V_{RAMP}$ signal relative to the RF modulated signal provided to the RF power amplifier. The fine tuning delay setting can be combined with an interpolator delay and sample rate conversion with respect to setting up group delay of the overall power amplifier envelope tracking system. Accordingly, in one embodiment, a method is disclosed to calibrate the fractional delay of the interpolator to provide group delay calibration for the open loop envelope tracking system, as well as a method for group delaying a signal using an interpolator or sample rate converting (up sampling) the data stream used to create $V_{RAMP}$ to drive the envelope tracker.

In another embodiment, a system and method for performing sample rate conversion and creating fractional delays to a signal is disclosed. The system comprises a filter, a look up table for storing coefficients for sample rate conversion and fractional delays, and control circuitry configured to use an indexing scheme to select one or more coefficients from the look up table for rate conversion and fractional delays. The coefficients stored in the look up table comprise the coefficients required to generate delays in desired increments of a sample rate. In the disclosed method, the one or more coefficients necessary for a desired sample rate and fractional delay are selected from a single look up table and provided to a filter to delay the signal based upon the input sample rate.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 4 depicts a 1× interpolate that is used to interpolate and delay a signal according to an exemplary embodiment.

FIG. 5 depicts a 2× interpolate that is used to interpolate and delay a signal according to an exemplary embodiment.

FIG. 6 depicts a 3× interpolate that is used to interpolate and delay a signal according to an exemplary embodiment.

FIG. 7 depicts a 9/2× interpolate that is used to interpolate and delay a signal according to an exemplary embodiment.

FIG. 8 depicts a 9× interpolate is used to interpolate and delay a signal according to an exemplary embodiment.

FIG. 12A, FIG. 12B, and FIG. 12C depict relationships between a first measured output power of the open loop envelope tracking system and a second measured output power of the open loop envelope tracking system with respect to relative positive fine tuning delay time and negative fine tuning delay time.

FIG. 13A, FIG. 13B, and FIG. 13C depict relationships between a modulated signal, a modulated power amplifier supply voltage and a measured output power of the radio frequency power amplifier with respect to relative positive fine tuning delay time and negative fine tuning delay time related to the positive fine tuning delay settings and negative fine tuning delay settings of the fine tuning delay circuit.

DETAILED DESCRIPTION

Figure 1:
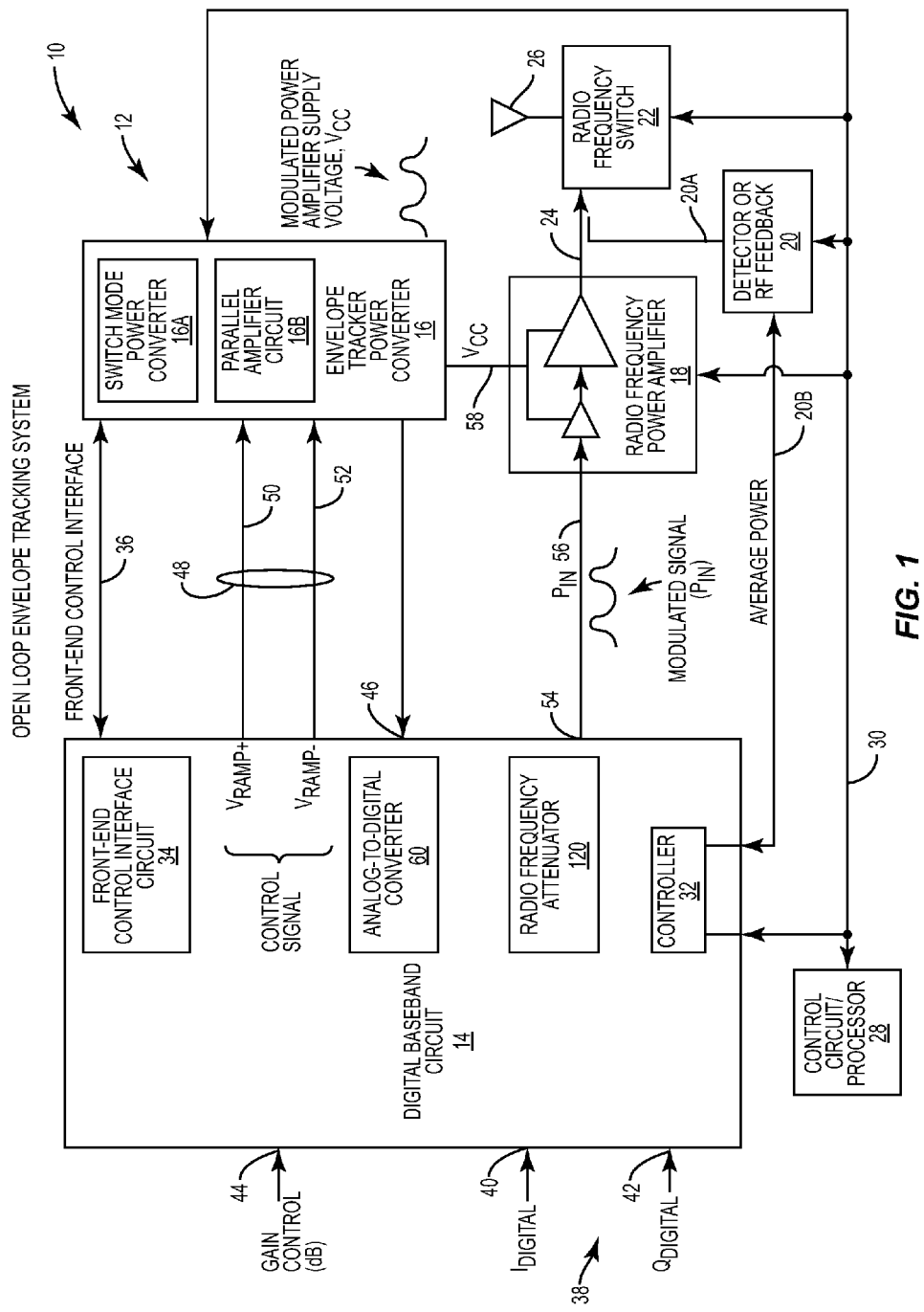
FIG. 1 depicts an open loop envelope tracking system including a digital baseband circuit, a radio frequency power amplifier, a detector, an envelope tracker power converter, and an envelope tracker power converter.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments disclosed in the detailed description relate to an open loop envelope tracking system, calibration techniques and circuitry for calibration of the open loop envelope tracking system. The open loop envelope tracking system calibration technique and circuitry are proposed. A radio frequency power amplifier receives a modulated signal. An envelope tracker power converter generates a modulated power amplifier supply voltage for the radio frequency power amplifier based a control signal derived from the modulated signal. A first measured output power and a second measured output power of the radio frequency power amplifier are measured when the control signal is respectively delayed by a first delay period and a second delay period. A sensitivity of the output power of the radio frequency power amplifier is near a maximum near the first delay period and the second delay period. The first delay period and/or the second delay period are adjusted until the first measured output power substantially equals the second measured output power. The first delay period and the second delay period are used to obtain a calibrated fine tuning delay offset.

A first embodiment of an open loop envelope tracking system includes a digital baseband circuit configured to generate a modulated signal based on a calibration test signal and a control signal based on the calibration test signal and a fine tuning delay setting of a fine tuning delay circuit. An envelope tracker power converter generates a modulated power amplifier supply voltage based on the control signal. A radio frequency power amplifier generates a radio frequency power amplifier output signal based on the modulated signal and the modulated power amplifier supply voltage. A detector generates an output power measurement for the radio frequency power amplifier output signal. Controller circuitry may set the fine tuning delay setting to a first fine tuning delay setting in order to obtain a first measured output power from the radio frequency power amplifier output signal based on the output power measurement generated by the detector while the fine tuning delay setting is set to the first fine tuning delay setting. The controller circuitry may also set the fine tuning delay setting to a second fine tuning delay setting in order to obtain a second measured output power from the radio frequency power amplifier output signal based on the output power measurement generated by the detector while the fine tuning delay setting is set to the second fine tuning delay setting. Thereafter, the controller circuitry may determine a calibrated fine tuning offset delay setting based on the first fine tuning delay setting and the second fine tuning delay setting. The first fine tuning delay setting and the second fine tuning delay setting may each be near a fine tuning delay setting at which an output power of the radio frequency power amplifier output signal has a maximum sensitivity to a change in the fine tuning delay setting. To determine whether the first measured output power substantially equals the second measured output power, the controller circuitry may calculate a power difference between the first measured output power and the second measured output power. The controller circuitry may compare the power difference to a maximum power difference threshold. Based on a determination that the power difference fails to exceed a maximum power difference threshold, the controller circuitry may determine that the first measured output power substantially equals the second measured output power and store the calibrated fine tuning offset delay setting in a memory associated with the controller circuitry. In some embodiments, the controller circuitry may set the calibrated fine tuning offset delay setting substantially equal to half a sum of the first fine tuning delay setting and the second fine tuning delay setting. In those embodiments where the first fine tuning delay setting is a positive fine tuning delay setting and the second fine tuning delay setting is a negative fine tuning delay setting, the controller circuitry may set the calibrated fine tuning offset delay setting substantially equal to half a sum of the positive fine tuning delay setting and the negative fine tuning delay setting. In some embodiments, the test signal provided to digital baseband circuit may generate a modulated signal that has a substantially sinusoidal envelope. Alternatively, the test signal may be selected such that the digital based band circuit generates a modulated signal that is a carrier wave tone signal. In some instances, a frequency of the modulated signal is based on a band of operation of a communication network for which a communication device is configured to operate. Upon determining a calibrated fine tuning offset delay, the controller circuitry may obtain a temperature measurement from the envelope tracker power converter. The controller circuitry may store the temperature measurement as a calibrated temperature in association with the calibrated fine tuning offset delay setting in the memory. In addition, in some embodiments, the controller circuitry may also obtain a supply voltage measurement from the envelope tracker power converter based on the determination that the power difference fails to exceed the maximum power difference threshold. Thereafter, the controller circuitry may store the supply voltage measurement as a calibrated supply voltage in association with the calibrated fine tuning offset delay setting in the memory. In some embodiments, the calibrated temperature and the calibrated supply voltage may be used to adjust a fine tuning delay setting prior to initiation of a data transmission. For example, prior to initiation of a data transmission, obtain an operational temperature of the envelope tracker power converter and determine a fine tuning delay temperature compensation adjustment based on the operational temperature and the calibrated temperature. In addition, the controller circuitry may determine a fine tuning offset delay setting for the fine tuning delay circuit based on the calibrated fine tuning offset delay setting and the fine tuning delay temperature compensation adjustment. Thereafter, the controller circuitry may set the fine tuning delay setting of the fine tuning delay circuit equal to the fine tuning offset delay setting.

In some embodiments of the open loop envelope tracking system of the controller circuitry may determine that the first measured output power is unequal to the second measured output power based a determination that the power difference exceeds the maximum power difference threshold. As a non-limiting example, in some embodiments, the controller circuitry may incrementally adjust at least one of the first fine tuning delay setting and the second fine tuning delay setting to determine the first fine tuning delay setting and the second fine tuning setting at which the first measured output power substantially equals the second measured output power. For example, the controller circuitry may incrementally adjust both the first fine tuning delay setting and the second fine tuning delay setting to determine the first fine tuning delay setting and the second fine tuning delay setting at which the first measured output power substantially equals the second measured output power. As another example, the controller circuitry may incrementally adjust only one of the first fine tuning delay setting and the second fine tuning delay setting to determine the first fine tuning delay setting and the second fine tuning delay setting at which the first measured output power substantially equals the second measured output power. In some embodiments of the open loop envelope tracking system, the controller circuitry may determine whether the first measured output power is greater than the second measured output power based on the power difference before adjusting the at least one of the first fine tuning delay setting and the second fine tuning delay setting. In some embodiments, based on a determination that the first measured output power is greater than the second measured output power, the controller circuitry incrementally adjusts only the first fine tuning delay setting to determine the first fine tuning delay setting and the second fine tuning delay setting at which the first measured output power substantially equals the second measured output power. Alternatively, in other embodiments, the controller circuitry may incrementally adjust only the second fine tuning delay setting to determine the second fine tuning delay setting at which the first measured output power substantially equals the second measured output power based on a determination that the second measured output power is less than the first measured output power. In still other embodiments, where the first fine tuning delay setting is greater than the second fine tuning delay setting, the controller circuitry may incrementally adjust only the first fine tuning delay setting to determine the first fine tuning delay setting at which the first measured output power substantially equals the second measured output power. Alternatively, in other embodiments, the controller circuitry may incrementally adjust only the second fine tuning delay setting to determine the second fine tuning delay setting at which the first measured output power substantially equals the second measured output power because the second fine tuning delay setting is less that the first fine tuning delay setting.

Some embodiments of the open loop envelope tracking system include a method for calibrating a group delay for an open loop envelope tracking system. As an example, the method may include generating a radio frequency power amplifier output signal having a first output power at an output of a radio frequency power amplifier based on a modulated signal as a function of a control signal delayed in time by a first delay relative to the modulated signal. In addition, the method may include generating the radio frequency power amplifier output signal having a second output power at the output of the radio frequency power amplifier as the function of the control signal delayed in time by a second delay relative to the modulated signal. Thereafter, the method may determine a calibrated offset delay as a function of the second delay and the first delay. As an example, the method may calculate a power difference between the first output power and the second output power and determine whether the first output power substantially equals the second output power based on the power difference based on the power difference. Illustratively, to determine that the first output power substantially equal the second output power based on the power difference, the method may compare a magnitude of the power difference to a maximum power difference threshold. Based on a determination that the magnitude of the power difference fails to exceed the maximum power difference threshold, the method may determine that the first output power substantially equals the second output power. A sensitivity of an output power of a radio frequency power amplifier output signal generated by the radio frequency power amplifier based on the modulated signal as the function of the control signal delayed in time by the first delay may be substantially near a maximum value. Likewise, the sensitivity of the output power of the radio frequency power amplifier output signal generated by the radio frequency power amplifier based on the modulated signal as the function of the control signal delayed in time by the second delay may also be substantially near the maximum value.

In some embodiments of the method for calibrating the group delay for the open loop envelope tracking system of claim, the calibrated offset delay is a calibrated fine tuning offset delay setting for a fine tuning delay circuit located in a baseband processing circuit in communication with an envelope tracker power converter. The method further includes adjusting a group delay between the control signal and the modulated signal based on a fine tuning delay setting of the fine tuning delay circuit. For example, in some embodiments, the calibrated offset delay is determined as the function of the second delay and the first delay. Illustratively, the calibrated offset delay may be set to substantially equal to half a sum of the second delay and the first delay. Alternatively, where the second delay is less than zero and the first delay is greater than zero, the calibrated offset delay may be determined as the function of the second delay and the first delay by setting the calibrated offset delay substantially equal to a sum of the second delay and the first delay. Alternatively, the calibrated offset delay may be determined as the function of the second delay and the first delay by setting the calibrated offset delay substantially equal to half a sum of the first delay and the second delay. In the case where the first delay is a positive fine tuning delay and the second delay is a negative fine tuning delay the calibrated offset delay may be determined as the function of the second delay and the first delay by setting the calibrated offset delay substantially equal to half a sum of the positive fine tuning delay and the negative fine tuning delay. However, in some embodiments, the calibrated offset delay may be set substantially equal to half a sum of a magnitude of the positive fine tuning delay less a magnitude of the negative fine tuning delay. The method may further include providing a test signal to a digital baseband circuit such that the based band circuit generates a modulated signal having a substantially symmetric envelope characteristic, The radio frequency power amplifier may receive the modulated signal at the radio frequency power amplifier. In some cases, the modulated signal has a substantially sinusoidal envelope. In other cases, the modulated signal may be a carrier wave tone signal. For example, the carrier wave tone signal may have a frequency at about 10 MHz. Alternatively, the frequency of the modulated signal may be based on a band of operation of a communication network.

In some embodiments, to generate the radio frequency power amplifier output signal having the first output power at the output of the radio frequency power amplifier based on the modulated signal as the function of the control signal delayed in time by the first delay relative to the modulated signal, the method includes receiving, at an envelope tracker power converter, the control signal delayed in time by the first delay, which generates a modulated power amplifier supply voltage based on the control signal delayed in time by the first delay. The radio frequency power amplifier generates the radio frequency power amplifier output signal having the first output power based on the modulated signal and the modulated power amplifier supply voltage. A detector may be used to measure an output power at the output of the radio frequency power amplifier to obtain the first output power. Similarly, to generate the radio frequency power amplifier output signal having the second output power at the output of the radio frequency power amplifier based on the modulated signal as the function of the control signal delayed in time by the second delay relative to the modulated signal, the method may include receiving, at the envelope tracker power converter, the control signal delayed in time by the second delay, which generates the modulated power amplifier supply voltage based on the control signal delayed in time by the second delay. The radio frequency power amplifier then generates the radio frequency power amplifier output signal having the second output power based on the modulated signal and the modulated power amplifier supply voltage. The detector may then measure the output power at the output of the radio frequency power amplifier to obtain the second output power.

Some embodiments of the method for calibrating the open loop envelope tracking system further include obtaining a temperature of an envelope tracker power converter upon determination of the calibrated offset delay and storing the temperature as a calibrated temperature in association with the calibrated offset delay. During normal operation of the communication device, the method may include configuring an offset delay of a fine tuning delay circuit of a digital baseband circuit based on the calibrated offset delay and providing the control signal to the envelope tracker power converter based on the offset delay of the fine tuning delay circuit. The envelope tracker power converter then generates a modulated power amplifier supply voltage based on the control signal and provides the modulated power amplifier supply voltage to the radio frequency power amplifier.

Still other embodiments of the method for calibrating the open loop envelope tracking system further include adjusting the offset delay of a fine tuning delay circuit for temperature variations prior to initiation of a data transmission. To determine a fine tuning delay temperature compensation adjustment, the method may obtain an operational temperature of the envelope tracker power converter. Upon obtaining the operational temperature of the envelope tracker power converter, the fine tuning delay temperature compensation adjustment is determined based on the operational temperature and the calibrated temperature. Thereafter, the offset delay of a fine tuning delay circuit is adjusted based on the fine tuning delay temperature compensation adjustment prior to initiating the data transmission. Some embodiments of the method may further determine a supply voltage compensation adjustment. Illustratively, the method may obtain a supply voltage measurement of the envelope tracker power converter upon determination of the calibrated offset delay, and store the supply voltage measurement as a calibrated supply voltage in association with the calibrated offset delay. Prior to initiation of a data transmission, the method determines a fine tuning delay supply voltage compensation adjustment by obtaining an operational temperature and an operational supply voltage measurement of the envelope tracker power converter. Thereafter, the method may include determining a fine tuning delay temperature compensation adjustment based on the operational temperature and the calibrated temperature and determining a fine tuning delay supply voltage compensation adjustment based on the operational supply voltage measurement and the calibrated supply voltage. The offset delay of the fine tuning delay circuit may then be adjusted based on the fine tuning delay temperature compensation adjustment and the fine tuning delay supply voltage compensation adjustment.

Another example embodiment includes a method for calibrating a group delay for the open loop envelope tracking system. The method may include obtaining an initial value for a negative fine tuning delay and an initial value for a positive fine tuning delay. The radio frequency power amplifier may receive a substantially symmetric modulated signal. Thereafter, until a determination that a negative fine tuning delay output power is substantially equal to a positive fine tuning delay output power, the method may include recursively carrying out a process including: generating a modulated power amplifier supply control signal related to the substantially symmetric modulated signal based on the positive fine tuning delay, generating a modulated power amplifier supply voltage related to the substantially symmetric modulated signal based on the modulated power amplifier supply control signal advanced in time by the negative fine tuning delay, measuring the negative fine tuning delay output power of the radio frequency power amplifier, generating the modulated power amplifier supply control signal related to the substantially symmetric modulated signal based on the positive fine tuning delay, generating a modulated power amplifier supply voltage related to the substantially symmetric modulated signal based on the modulated power amplifier supply control signal delayed in time by the positive fine tuning delay, measuring the positive fine tuning delay output power of the radio frequency power amplifier, determining whether the negative fine tuning delay output power is substantially equal to the positive fine tuning delay output power, and in response to a determination that the negative fine tuning delay output power is substantially unequal to the positive fine tuning delay output power, adjusting the negative fine tuning delay and the positive fine tuning delay based on the negative fine tuning delay output power and the positive fine tuning delay output power. After the determination that the negative fine tuning delay output power is substantially equal to the positive fine tuning delay output power, the method may include determining a calibrated fine tuning delay based on the negative fine tuning delay and the positive fine tuning delay.

FIG. 1 depicts a communication device 10 including an open loop envelope tracking system 12. As a non-limiting example, the communication device 10 may be a mobile terminal, a cellular telephone, a networked appliance hardware, a network connected computing device, and/or a combination thereof. The communication device may be configured to operate in a communication system. As an example, the communication device 10 may be configured to operate in a band of operation having an assigned wideband modulation bandwidth. The communication device 10 may be configured to operate in various modes of operation depending upon a band of operation, a channel bandwidth, a wideband modulation bandwidth, channel conditions, a location of the communication device 10 relative to communication hubs, points, towers, and hot-spots, signal modulation techniques, expected envelope characteristics, the peak-to-average ratio of the envelope of the signal to be transmitted, the data rate, the bandwidth of the channel, error vector magnitude, and/or desired transmit spectrum characteristics.

The open loop envelope tracking system 12 may include a digital baseband circuit 14, an envelope tracker power converter 16, a radio frequency power amplifier 18, and a detector 20. The radio frequency power amplifier 18 may be a linear radio frequency power amplifier. In other embodiments, the radio frequency power amplifier 18 may be a non-linear power amplifier. The detector 20 may also be referred to as either a power detector or a radio frequency output power feedback circuit. Some embodiments of the open loop envelope tracking system 12 further includes a radio frequency switch 22 configured to receive an radio frequency power amplifier output signal 24, which is also in communication with the detector 20. The detector 20 may be either a linear power detector or a non-linear power detector. The detector 20 may include a sensor 20A in communication with an output of the radio frequency power amplifier 18. The detector 20 measures an output power generated by the radio frequency power amplifier. In some embodiments, the detector 20 may include a measured power output 20B. As depicted in FIG. 1, the measured power output 20B may provide an average power measurement. The detector 20 may be configured to provide the average power measurement based upon various averaging techniques. In some embodiments, the detector 20 may be configured to provide a peak power measurement. In some embodiments, the detector 20 may be configured as a linear power detector. In other embodiments, the detector 20 may be a logarithmic power detector. In still other embodiments, the detector 20 may be a non-linear power detector.

The radio frequency switch 22 includes a closed state of operation and an open state of operation. In the closed state of operation, the radio frequency switch 22 couples the radio frequency power amplifier 18 to an antenna 26, which permits the radio frequency power amplifier output signal 24 to pass through the radio frequency switch 22 to the antenna 26 to transmit the radio frequency power amplifier output signal 24. In the open state of operation, the radio frequency switch 22 substantially attenuates the radio frequency power amplifier output signal 24 to minimize transmission of the radio frequency power amplifier output signal 24. Ideally, in the open state of operation, the radio frequency switch 22 has infinite impedance. In some embodiments, the radio frequency switch 22 may provide antenna switch isolation around +25 dBm. In some embodiments, the communication device 10 may include at least one control circuit/processor 28 configured to coordinate the functions of the various components of the open loop envelope tracking system 12. For the sake of simplicity, the control circuit/processor 28 will be hereinafter referred to as the processor 28. As an example, and not by way of limitation, the processor 28 may be include a communication interface 30 in communication with the digital baseband circuit 14, envelope tracker power converter 16, the controller 32 of the digital baseband circuit 14, the detector 20, the radio frequency switch 22, and/or some combination thereof. For the sake of simplicity, and not by limitation, the communication interface 30 is only depicted as being in communication with each component depicted in FIG. 1. Even so, one of ordinary skill in the art will understand that this is by way of example and not by way of limitation. For example, the processor 28 may be in communication with various other elements to be described in the digital baseband circuit 14.

The processor 28 may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices. As an example, a combination of computing devices may include a combination of a DSP and a microprocessor, a plurality of microprocessors, one or more microprocessors in conjunction with a DSP core, or any other such configuration.

The processor 28 may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an Application Specific Integrated Circuit (ASIC).

In addition, FIG. 1 depicts that the digital baseband circuit 14 includes a controller 32 and a front-end control interface circuit 34. The front-end control interface circuit 34 is in communication with the envelope tracker power converter 16 via a front-end control interface 36. In some embodiments, the front-end control interface circuit 34 may be configured to operate with a Mobile Industry Processor Interface® standard based device via the front-end control interface 36. As an example, the front-end control interface circuit 34 and the front-end control interface 36 may be configured to control devices based on a Radio Frequency Front-End control interface specification.

In some embodiments, the processor 28 may cooperatively interoperate with the controller 32 and/or the front-end control interface circuit 34 to configure and control the envelope tracker power converter 16. In still other embodiments, the control circuit or processor 28 may be a supervisory processor that governs controller 32. The controller 32 may include configurable firmware, a processor, a sub-controllers, control logic, control circuitry, one or more state machines, a Digital Signal Processor (DSP), an ASIC, a Field Programmable Gate Array (FPGA) or other programmable logic device, discrete gate or transistor logic, discrete hardware components, or any combination thereof designed to perform the functions described herein. The controller 32 may include firmware, executable program code, read only memory, fusible memory, a memory processor, a microprocessor, conventional processor, controller, microcontroller, or state machine. A processor may also be implemented as a combination of computing devices. As an example, a combination of computing devices may include a combination of a DSP and a microprocessor, a plurality of microprocessors, one or more microprocessors in conjunction with a DSP core, or any other such configuration. The controller 32 may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an Application Specific Integrated Circuit (ASIC).

The digital baseband circuit 14 includes a digital IQ signal interface 38 configured to receive a signal to be transmitted by the radio frequency power amplifier 18. For example, the digital IQ signal interface 38 may be configured to receive a digital data signal to be transmitted over a communication network. Alternatively, the digital IQ signal interface 38 may be configured to receive test signals that may be used to calibrate various parts of the open loop envelope tracking system 12. In some embodiments, the digital IQ signal interface 38 may be configured to receive a digital in-phase component 40, $I_{DIGITAL}$, and a digital quadrature component 42, $Q_{DIGITAL}$. The digital in-phase component 40, $I_{DIGITAL}$, and a digital quadrature component 42, $Q_{DIGITAL}$, where the digital in-phase component 40, $I_{DIGITAL}$, and a digital quadrature component 42, $Q_{DIGITAL}$, represent the in-phase and quadrature components of a signal to be transmitted. The digital IQ signal interface 38 may receive various types of test signals to generate a modulated signal 56, $P_{IN}$, having a desired envelope characteristic. In addition, the digital IQ signal interface 38 may be configured to receive a test signal that generates modulated signal 56, $P_{IN}$, having a desired frequency characteristic or periodicity. For example, dependent upon a band of operation of a communication network to which a communication device 10 is assigned or a wideband modulation technique associated with the band of operation, the test signal received by the digital IQ signal interface 38 may have various frequency characteristics. As an example, for the case where a wideband modulation technique includes a particular modulation bandwidth, the digital IQ signal interface 38 may receive a test signal at the digital IQ signal interface 38 to generate the modulated signal 56, $P_{IN}$, that has a bandwidth substantially similar to bandwidth associated with the wideband modulation technique or the band of operation assigned to the communication device 10.

The digital baseband circuit 14 further includes a gain control interface 44 and an analog-to-digital converter interface 46. The gain control interface 44 is configured to receive a gain control, $G_{CONTROL}$. The value of the gain control may vary depending upon various factors related to the operation of the communication device 10. As a non-limiting example, the gain control may be set based on various operating conditions of the communication device 10, the open loop envelope tracking system 12, the envelope characteristics of the signal to be transmitted, and an attenuation or gain of various components in the communication device. The analog-to-digital converter interface 46 provides an input to receive analog data that may be used by the controller 32, the processor 28, or other portions of the digital baseband circuit 14. For example, in some embodiments, the envelope tracker power converter 16 may be in communication with the analog-to-digital converter interface 46 to provide various types of measurements. As an example, in some embodiments, the envelope tracker power converter may selectively provide an analog temperature measurement signal or an analog power supply voltage signal. In other embodiments, the analog power supply voltage signal may be related to a voltage of a battery (not shown) that is used to power the communication device 10.

The digital baseband circuit 14 further includes various outputs. For example, the digital baseband circuit 14 may provide a control signal 48 that is in communication with the envelope tracker power converter 16. In some embodiments, the control signal 48 may be a differential control signal. The digital baseband circuit 14 may use the control signal 48 to control the operation of the envelope tracker power converter 16. As a non-limiting example, the control signal 48 may be a differential control signal. For example, the control signal 48 may be a differential $V_{RAMP}$ signal. Although depicted in FIG. 1 as an analog differential $V_{RAMP}$ signal, the control signal 48 may be either an analog or a digital control signal. As one of many examples embodiments, the control signal 48 may provide a non-inverted control signal 50 and an inverted control signal 52 to the envelope tracker power converter 16. As an example, in some embodiments, the non-inverted control signal component may be a non-inverted $V_{RAMP}$ signal component, $V_{RAMP}+$. As an additional example, the inverted control signal component may be an inverted $V_{RAMP}$ signal component, $V_{RAMP}-$. While depicted as analog signals, in some embodiments, the digital baseband circuit 14 may provide the control signal 48 as a digital control signal. The digital baseband circuit 14 may further include a modulated interface 54 to provide a modulated signal 56, $P_{IN}$, to an input of the radio frequency power amplifier 18.

Based on the received control signal 48, the envelope tracker power converter 16 generates a modulated power amplifier supply voltage 58, $V_{CC}$, which is provided to the radio frequency power amplifier 18. Based on the received modulated signal 56, $P_{IN}$, and the modulated power amplifier supply voltage 58, $V_{CC}$, the radio frequency power amplifier 18 generates a radio frequency power amplifier output signal 24. As will be discussed, the modulated signal 56, $P_{IN}$, and modulated power amplifier supply voltage 58, $V_{CC}$, may be temporally aligned to minimize spectrum and error vector magnitude degradation.

In some embodiments, the modulated signal 56, $P_{IN}$, may be a test signal. As an example, the modulated signal 56, $P_{IN}$ may be a carrier wave having a desired frequency. In some embodiments, the carrier wave may have a frequency of about 10 MHz. Alternatively, in some embodiments, the test signal may have a frequency that is selected or depends upon the wideband modulation associated with the band of operation in which the communication device 10 is configured to operate within a communication network. For example, in the case where wideband modulation associated with the band of operation of the communication device 10 is 20 MHz, the modulated signal 56, $P_{IN}$, may be a symmetrical signal or a substantially symmetrical signal having a fundamental frequency of about 20 MHz. In some instances, a carrier wave may be used to provide a substantially symmetrical test signal. In this case, the modulated signal 56, $P_{IN}$, may be a carrier wave of a desired frequency. In other embodiments, an envelope of the modulated signal 56, $P_{IN}$, may be triangular in shape. In still other embodiments, the modulated signal 56, $P_{IN}$, may be similar to a carrier wave tone signal. As another non-limiting example, in some embodiments, the modulated signal 56, $P_{IN}$, may have a substantially symmetrical modulated envelope characteristic. As another non-limiting example, the modulated signal 56, $P_{IN}$, may include a triangular shaped modulated envelope characteristic. In still some embodiments, the modulated signal 56, $P_{IN}$, may have an envelope that includes some asymmetric features. The digital baseband circuit 14 further includes an analog-to-digital converter 60 configured to receive an analog signal via the analog-to-digital converter interface 46 from the envelope tracker power converter 16. As a non-limiting example, the envelope tracker power converter 16 may provide a temperature measurement, a supply voltage, or other analog signal to the analog-to digital converter 60. The supply voltage may be a battery voltage or a voltage derived from a battery voltage. As an example, the envelope tracker power converter 16 may provide one of several current or voltage measurements to the digital baseband circuit t 14 as a feedback signal to the digital baseband circuit 14. The analog-to-digital converter 60 converts the analog signal received from the analog-to-digital converter 60 into a digital signal that may be provided to the controller 32, the processor 28, and/or a combination thereof. In some alternative embodiments, the digital baseband circuit 14 may be configured to automatically provide the digital output to other functional blocks within the digital baseband circuit 14 directly. As an example alternative embodiment, the envelope tracker power converter 16 may include an analog-to-digital converter (not shown) that may provide measured voltages and currents to the digital baseband circuit 14 via the communication interface 30 or the front-end control interface 36.

The envelope tracker power converter 16 may include various circuits to generate the modulated power amplifier supply voltage 58, $V_{CC}$. As a non-limiting example, some embodiments of the envelope tracker power converter 16 may include a switch mode power supply converter 16A and a parallel amplifier circuit 16B. In some embodiments, the switch mode power supply converter 16A may be a buck converter. In other embodiments, the switch mode power supply converter 16A may include a multi-level charge pump buck converter configured to buck and/or boost a supply voltage to provide a switching voltage at different voltages dependent upon the control signal 48. As a non-limiting example, in some embodiments, the switch mode power supply converter 16A may provide a shunt voltage substantially equal to a reference voltage. In some embodiments, the reference voltage may be ground. The switch mode power supply converter 16A may be further configured to generate a switching voltage substantially equal to a fractional output of a supply voltage. For example, the switching voltage provided by the switch mode power supply converter 16A may be a bucked voltage substantially equal to one-half a supply voltage provided to the envelope tracker power converter 16. The envelope tracker power converter 16 may use the switching voltage to generate the modulated power amplifier supply voltage 58, $V_{CC}$. In still other embodiments, the switching voltage may be a boosted voltage substantially equal to three halves or twice the supply voltage.

The envelope tracker power converter 16 may further include a parallel amplifier circuit 16B configured to regulate the modulated power amplifier supply voltage 58, $V_{CC}$. As an example, the parallel amplifier circuit 16B may include a parallel amplifier configured to regulate the modulated power amplifier supply voltage 58, $V_{CC}$, based on the control signal 48. As another non-limiting example, in other embodiments, the envelope tracker power converter 16 may include other power converting means. For example, in some embodiments, the envelope tracker power converter 16 may be configured as a linear power supply or a charge pump.

Figure 2:
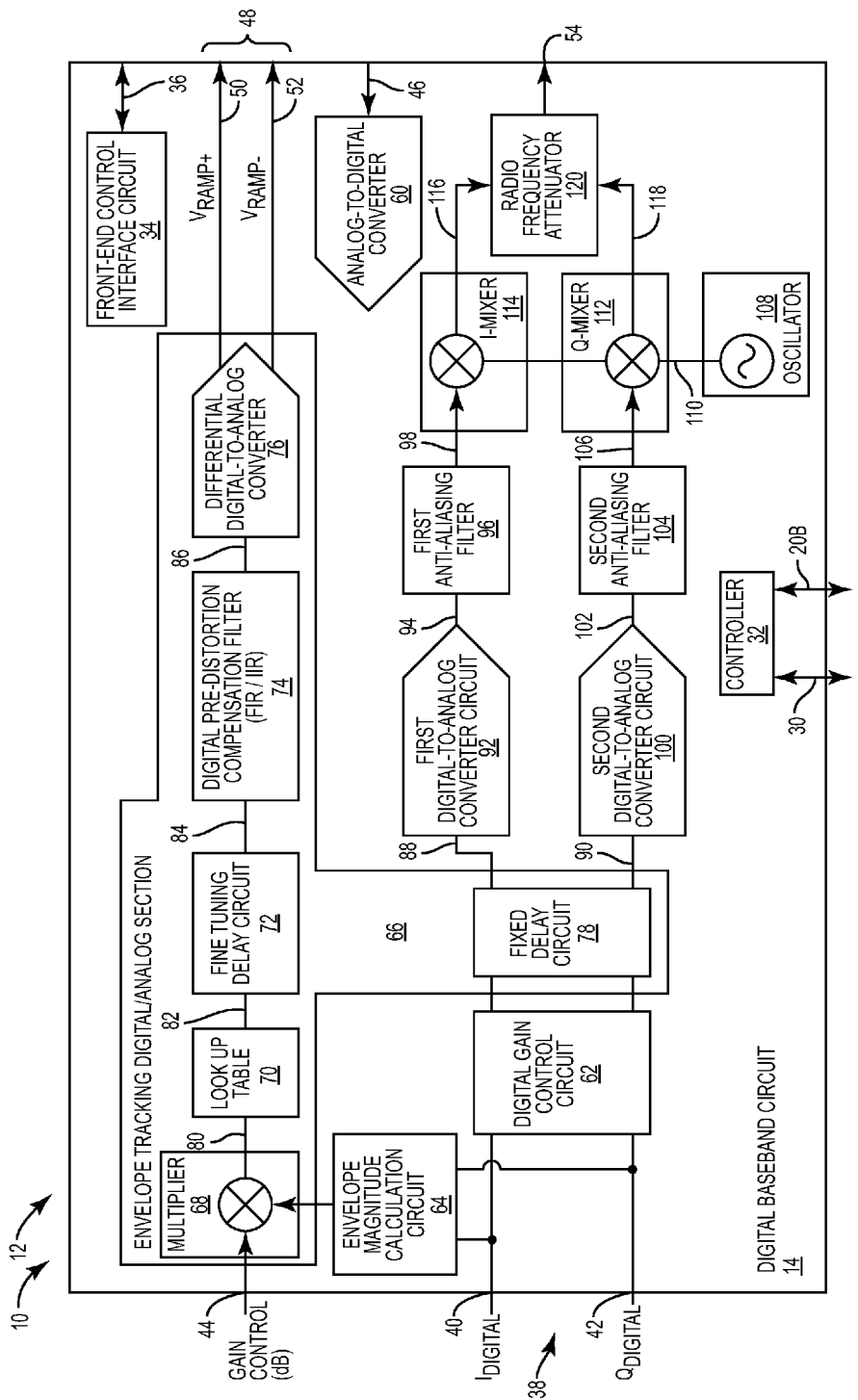
FIG. 2 depicts an embodiment of the digital baseband circuit of FIG. 1.

FIG. 2 depicts an embodiment of the digital baseband circuit 14 that includes a digital gain control circuit 62, an envelope magnitude calculation circuit 64, and an envelope tracking digital/analog section 66. The digital gain control circuit 62 and the envelope magnitude calculation circuit 64 each receive the digital in-phase component 40, $I_{DIGITAL}$, and the digital quadrature component 42, $Q_{DIGITAL}$. The envelope magnitude calculation circuit 64 calculates an envelope magnitude, $\zeta_{MAGNITUDE}$, of an expected envelope of the modulated signal 56, $P_{IN}$. As an example, the envelope magnitude calculation circuit 64 may generate the envelope magnitude, $\zeta_{MAGNITUDE}$, based on the digital in-phase component 40, $I_{DIGITAL}$, and digital quadrature component 42, $Q_{DIGITAL}$. In some embodiments, the envelope magnitude, $\zeta_{MAGNITUDE}$, may be proportional to the magnitude of the envelope of the modulated signal 56, $P_{IN}$. As a non-limiting example, the envelope magnitude, $\zeta_{MAGNITUDE}$, may be described by equation (1) as follows:

$$\zeta_{MAGNITUDE} = \sqrt{I_{DIGITAL}^2 + Q_{DIGITAL}^2} \quad (1)$$

The envelope magnitude calculation circuit 64 provides the envelope magnitude, $\zeta_{MAGNITUDE}$, to the envelope tracking digital/analog section 66. The digital gain control circuit 62 digitally adjusts the magnitude of each of the digital in-phase component 40, $I_{DIGITAL}$, and the digital quadrature component 42, $Q_{DIGITAL}$ to provide a gain adjusted digital in-phase component, $I_{DIGITAL\_GAIN\_ADJUSTED}$, and the gain adjusted digital quadrature component, $Q_{DIGITAL\_GAIN\_ADJUSTED}$, as inputs to the envelope tracking digital/analog section 66.

The envelope tracking digital/analog section 66 includes a multiplier 68, a look up table 70, a fine tuning delay circuit 72, a digital pre-distortion compensation filter 74, a differential digital-to-analog converter 76, and a fixed delay circuit 78. The multiplier 68 includes a first input in communication with the gain control interface 44 and a second input in communication with the envelope magnitude calculation circuit 64. The first input of the multiplier 68 receives the gain control, $G_{CONTROL}$. The second input of the multiplier 68 receives the envelope magnitude, $\zeta_{MAGNITUDE}$. The multiplier 68 multiplies the envelope magnitude, $\zeta_{MAGNITUDE}$, by the gain control, $G_{CONTROL}$ to generate a gain control adjusted envelope magnitude signal 80. In some embodiments, the gain control, $G_{CONTROL}$, is adjusted to compensate for variations in a setup of the digital baseband circuit 14. For example, the value of the gain control, $G_{CONTROL}$, may be adjusted to increase or decrease the modulated power amplifier supply voltage 58, $V_{CC}$, generated by the envelope tracker power converter 16. The multiplier 68 provides the gain control adjusted envelope magnitude signal 80 to the look up table 70.

The look up table 70 may include one or more tables to translate the gain control adjusted envelope magnitude signal 80 into a look up table compensated envelope signal 82. For example, depending upon a band of operation, a power mode of operation of the communication device 10, a spectrum target, and/or an error vector magnitude target, the controller 32 or the processor 28 may configure the look up table 70 to select a particular set of look up values depending upon an operational mode of the communication device 10, the digital baseband circuit 14, the envelope tracker power converter 16, the envelope tracking digital/analog section 66, and/or a combination thereof. The look up table 70 provides a look up table compensated envelope signal 82 to the fine tuning delay circuit 72.

The fine tuning delay circuit 72 may be configured to delay propagation of the look up table compensated envelope signal 82 based on a programmable delay parameter. The programmable delay parameter may be controlled by the control circuit or processor 28 and/or the controller 32. Depending upon the programmable delay parameter, the fine tuning delay circuit 72 may delay the delay propagation of the look up table compensated envelope signal 82 based on a programmable delay parameter by a fine tuning delay time, $T_{FINE\_TUNING}$. The granularity of the fine tuning delay time, $T_{FINE\_TUNING}$, may depend upon a clock of the digital baseband circuit 14. The fine tuning delay circuit may include a minimum fine tuning delay time, $T_{FINE\_TUNING\_DELAY\_MIN}$, and a maximum fine tuning delay time, $T_{FINETUNING\_DELAY\_MAX}$. For example, in some embodiments, the minimum fine tuning delay may be zero. In other embodiments, the minimum fine tuning delay time, $T_{FINE\_TUNING\_DELAY\_MIN}$, may correlate to a particular minimum delay needed to properly time align the group delay of the control signal 48 with the modulated signal 56, $P_{IN}$, under certain operational conditions. The center of the fine tuning delay circuit 72 may correspond to a mid-point fine tuning delay time, $T_{FINE\_TUNING\_CENTER}$, as described in equation (2) as follows:

$$T_{FINE\_TUNING\_CENTER} = \frac{T_{FINE\ TUNING\ DELAY\ MIN} + T_{FINE\ TUNING\ DELAY\ MAX}}{2} \quad (2)$$

Figure 3:
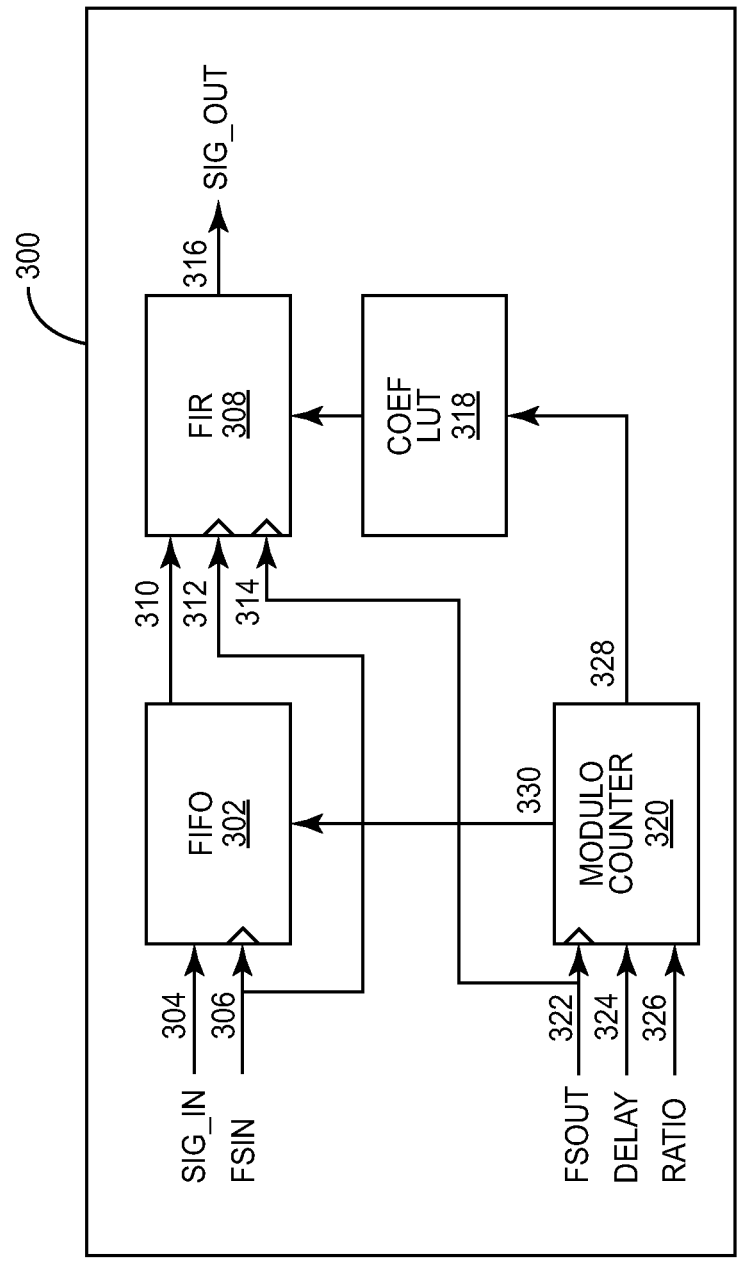
FIG. 3 depicts a block diagram of a digital filter according to one embodiment.

The center fine tuning delay may also be referred to as a mid-point of the fine tuning delay circuit. For example, in some embodiments, the mid-point fine tuning delay time, $T_{FINE\_TUNING\_CENTER}$, has a reference value of zero. In this case, as depicted in FIG. 3, the fine tuning delay time, $T_{FINE\_TUNING}$, may be divided into a negative fine tuning delay time, $T_{NEGATIVE\_FINE\_TUNING}$, and a positive fine tuning delay time, $T_{POSITIVE\_FINE\_TUNING}$. As an example, a signal delayed by the fine tuning delay circuit 72 by a negative fine tuning delay time, $T_{NEGATIVE\_FINE\_TUNING}$, arrives earlier than a signal delayed by a positive fine tuning delay time, $T_{POSITIVE\_FINE\_TUNING}$. The negative fine tuning delay time, $T_{NEGATIVE\_FINE\_TUNING}$, may correspond to a negative fine tuning delay setting of the fine tuning delay circuit 72 that is less than zero. The positive fine tuning delay time, $T_{NEGATIVE\_FINE\_TUNING}$, may correspond to a negative fine tuning delay setting of the fine tuning delay circuit 72 that is greater than zero.

For example, a fine tuning delay setting equal to one corresponds to 1.08 nanoseconds of delay relative to a mid-point fine tuning delay time, $T_{FINE\_TUNING\_CENTER}$, where the mid-point fine tuning delay time, $T_{FINE\_TUNING\_CENTER}$, is assumed to have a fine tuning delay time, $T_{FINE\_TUNING}$, equal to zero. Alternatively, for example, a fine tuning delay setting equal to negative four corresponds to −4.32 nanoseconds of delay relative to the mid-point fine tuning delay time, $T_{FINE\_TUNING\_CENTER}$. Accordingly, a negative fine tuning delay time, $T_{NEGATIVE\_FINE\_TUNING}$, corresponds to a fine tuning delay time, $T_{FINE\_TUNING}$, which is less than zero relative to the mid-point fine tuning delay time, $T_{FINE\_TUNING\_CENTER}$. Accordingly, relative to the receipt of the digitally delayed control signal without pre-distortion compensation 84, the fine tuning delay circuit 72 will provide the digital control signal 86 earlier in time when the fine tuning delay time, $T_{FINE\_TUNING}$, is at least equal to zero. A positive fine tuning delay, $T_{POSITIVE\_FINE\_TUNING}$, corresponds to a fine tuning delay, $T_{FINE\_TUNING}$, greater than zero relative to the mid-point fine tuning delay, $T_{FINE\_TUNING\_CENTER}$.

Returning to FIG. 2, the digitally delayed control signal without pre-distortion compensation 84 may be provided to the digital pre-distortion compensation filter 74. The digital pre-distortion compensation filter 74 may be either an infinite impulse response filter (IIR) or a finite impulse response filter (FIR). In some embodiments, the coefficients of the digital pre-distortion compensation filter 74 may be configured by either the controller 32 or the processor 28. In addition, the propagation delay through the digital pre-distortion compensation filter 74 may vary depending upon the various modes of operation of the communication device 10. For example, the propagation delay through the digital pre-distortion compensation filter 74 may depend on various factors including a band of operation, a channel bandwidth, a wideband modulation bandwidth, channel conditions, a location of the communication device 10 relative to communication hubs, points, towers, and hot-spots, signal modulation techniques, expected envelope characteristics, the peak-to-average ratio of the envelope of the signal to be transmitted, the data rate, the bandwidth of the channel, error vector magnitude, desired transmit spectrum characteristics, and/or some combination thereof. As an example application, the digital pre-distortion compensation filter 74 may be configured to equalize the frequency response of the modulated power amplifier supply voltage 58, $V_{CC}$, relative to control signal 48. The digital pre-distortion compensation filter 74 may provide a digital control signal 86 to the differential digital-to-analog converter 76. In some embodiments, the digital control signal 86 may be a digital $V_{RAMP}$ signal, $V_{RAMP\_DIGITAL}$. The differential digital-to-analog converter 76 converts the digital control signal 86 into the control signal 48. In some embodiments, the control signal 48 may be a differential control signal. For example, as described above, the control signal 48 may include the non-inverted control signal component 50 and the inverted control signal component 52. In some embodiments, the non-inverted control signal component 50 may be the non-inverted $V_{RAMP}$ signal component, $V_{RAMP}+$, and the inverted control signal component 52 may be the inverted $V_{RAMP}$ signal component, $V_{RAMP}-$. Although not depicted in FIG. 2, the differential digital-to-analog converter 76 may further include anti-aliasing filters to accomplish proper image rejection after converting digital data into an analog signal.

The fixed delay circuit 78 is configured to provide a fixed delay to offset the propagation delay of the of the envelope magnitude, $\zeta_{MAGNITUDE}$, signal through the envelope tracking digital/analog section 66 and provide a range of delay for the fine tuning delay circuit 72. The fixed delay circuit 78 receives the gain adjusted digital in-phase component, $I_{DIGITAL\_GAIN\_ADJUSTED}$, and the gain adjusted digital quadrature component, $Q_{DIGITAL\_GAIN\_ADJUSTED}$ from the digital gain control circuit 62. The fixed delay circuit 78 provides a delay adjusted digital in-phase component 88 and a delay adjusted quadrature component 90 as outputs.

The first digital-to-analog converter circuit 92 is configured to receive the delay adjusted digital in-phase component 88. The first digital-to-analog converter circuit 92 converts the delay adjusted digital in-phase component 88 into an analog signal to generate a pre-reconstruction in-phase component 94, which is provided to the first anti-aliasing filter 96. The first anti-aliasing filter 96 filters the pre-reconstruction in-phase component 94 to provide an analog in-phase component 98 to be mixed.

Similarly, the second digital-to-analog converter circuit 100 is configured to receive the delay adjusted quadrature component 90. The second digital-to-analog converter circuit 102 converts the delay adjusted quadrature component 90 into a pre-reconstruction quadrature component 102, which is provided to the second anti-aliasing filter 104. The second anti-aliasing filter 104 filters the pre-reconstruction quadrature component 102 to provide an analog quadrature component 106 to be mixed.

The digital baseband circuit 14 further includes an oscillator 108, a quadrature component mixer 112, Q-Mixer, and an in-phase component mixer 114, I-Mixer. The oscillator 108 is configured to generate a carrier frequency for a band of operation 110, which is provided to the quadrature component mixer 112, Q-Mixer, and the in-phase component mixer 114, I-Mixer. The quadrature component mixer 112, Q-Mixer, mixes the analog quadrature component 106 to generate a modulated quadrature component 116. The in-phase component mixer 114, I-Mixer, mixes the analog in-phase component 98 to generate a modulated in-phase component 118. The modulated quadrature component 116 and the modulated in-phase component 118 are provided to a radio frequency attenuator 120. The radio frequency attenuator 120 may be adjusted to a magnitude of the modulated quadrature component 116 and the modulated in-phase component 118 used to provide the modulated signal 56, $P_{IN}$, to the modulated interface 54. The radio frequency attenuator 120 may be either a digital radio frequency attenuator or an analog radio frequency attenuator.

The fine tuning delay time, $T_{FINE\_TUNING}$, of the fine tuning delay circuit 72 may be configured to adjust the group delay relationship between the control signal 48 provided to the envelope tracker power converter 16 and the modulated signal 56, $P_{IN}$, provided to the radio frequency power amplifier 18. The output power of radio frequency power amplifier output signal 24 may depend on the relative group delay mismatch between the control signal 48, provided to the envelope tracker power converter 16, and the modulated signal 56, $P_{IN}$, provided to the radio frequency power amplifier 18.

As described above in FIG. 2, a method and system is disclosed for calibrating the group delay for a power amplifier envelope tracking system. The described system of FIG. 2 includes a fine tuning delay circuit 72. Thus, the system of FIG. 2 can be used in a method for setting the fine tuning delay of the $V_{RAMP}$ delay where $V_{RAMP}$ is a digital signal representing the pre-distorted envelope signal used to control generation of the modulated supply voltage, $V_{CC}$, generated by the envelope tracker. $V_{CC}$ is provided to the collector of the RF amplifier.

In another embodiment, the fine tuning delay circuit may be combined with an up-converter. In one embodiment, an interpolator in combination with a FIFO both up samples the incoming data stream to create a $V_{RAMP}$ signal for driving the envelope tracker and temporally adjusts the $V_{RAMP}$ signal relative to the RF modulated signal provided to the RF power amplifier. A relationship exists between the fine tuning delay setting described above with respect to FIG. 2 and the interpolator delay and sample rate conversion described below with respect to setting up group delay of the overall power amplifier envelope tracking system. For example, FIG. 3 shown below may be an exemplary embodiment of the fine tuning delay circuit 72 of FIG. 2.

As a result, in one embodiment, a method is disclosed to calibrate the fractional delay of the interpolator to provide group delay calibration for the open loop envelope tracking system, as well as a method for group delaying a signal using an interpolator or sample rate converting (up sampling) the data stream used to create $V_{RAMP}$ to drive the envelope tracker.

Furthermore, in an envelope tracking system as described above, where a digital predistorted envelope signal is generated to modulate a PA supply, the input sample rate of the digital signal vramp is variable, based upon the modulation format and bandwidth. However, the final sample rate is always the same. This requires many interpolation rates to be implemented. Very fine timing control of the vramp delay is also required (as fine as 0.5 nanoseconds), where vramp is a digital signal representing the predistorted envelope signal. The fine delay control (which is 1/36 in one embodiment) and many interpolation ratios can lead to the need or several very large coefficient look up tables (LUTs) to perform all of the required rate conversions and fractional delays. These large LUTs require a lot of digital area, consume large amounts of power, and may not be realizable from a digital timing perspective. Accordingly, there is also a need for an improved method and apparatus to decrease the size and power consumption of a rate converter in an envelope tracking system.

In one embodiment, an improvement to an existing rate converter with a variable fractional delay is disclosed. For example, a rate converter is often needed with variable fractional delay. The rate converter can interpolate and create fractional delays to a signal. One known way to accomplish this is to use a brute force method to generate a coefficient look up table (LUT) for each rate and fractional delay. This requires a very large LUT, or multiple LUTs, each of which may be large. In addition, in certain envelope tracking systems, there are many interpolation rates and a very fine fractional delay needed. In one embodiment, it may be as fine as 1/36. In another embodiment, it may be 1/18. The large number of coefficients needed to implement these functions can be prohibitively large.

This may be addressed by using a small LUT and an intelligent coefficient scheme to decrease the size and power consumption of the rate converter. To interpolate n delay, the proper coefficients must be selected for the delay. In one embodiment, the small LUT includes the coefficients required to generate delays in 1/36 increments of the output sample rate. The coefficient set is like a circular buffer. Only one output period of delay coefficients is needed for the fractional delay. In this manner, in one embodiment, if a 0.25 nanosecond (ns) delay is desired, this corresponds to a 1/36 delay. In this embodiment, only 36 sets of coefficients need to be stored in the LUT. In another embodiment, LUT includes the coefficients required to generate delays in 1/18 increments of the output sample rate, so there would be 18 sets of coefficients stored in the LUT. The integer delays are implemented with a low cost and low power FIFO. Coefficient selection is reduced to a modulo counter with a programmable reset, an increment, and a FIFO control. The preset is a function of desired delay. The increment is a function of the interpolation rate. The FIFO is used to handle the coefficient LUT wrap. Although this method is described herein with respect to 1/36 fractional delay, it can be generalized to any fractional delay 1/N resolution, with 1/18 being just a single other non-limiting example.

A sample rate converter can be implemented as a finite impulse response filter (FIR). Depending on interpolation rate, the coefficient table can become quite large. In addition to the sample rate conversion, coefficient selection can also be used to implement delays of the signal that are a fraction of the sample rate. In particular, the digital filter may need several very large coefficient tables to perform all the required rate conversions and fractional delay calculations. These tables will require a lot of digital area, consume a lot of power, and may not be realizable from a digital timing perspective. To implement both sample rate conversion and fractional delays of the signal, the tables can grow exponentially. In the method described herein, several large coefficient tables are condensed into a small LUT and an indexing scheme is used to satisfy the rate conversions and fractional delays.

In one embodiment, a minimal coefficient table using an intelligent look up algorithm can be used to accomplish both the rate conversion and the fractional delay calculation. This approach reduces the area of the digital circuits, the power consumption of the digital filter, and allows the use of a slower digital process. The described method creates a smaller table and uses an intelligent coefficient lookup to address all three areas of concern. This technique is not limited to the sizes used in the exemplary system. This method is also compact enough that programmable filters can be created and adapted to different system requirements of many standards. Although specific rates and delays in a cellular system are discussed herein, the described technique is applicable to any system that needs rate conversion and fractional delay.

Those skilled in the art will appreciate the scope of the present disclosure and realize additional aspects thereof after reading the following detailed description in association with the accompanying drawings.

Table 1 shows the various modulation formats, sample frequencies and interpolation ratios.

TABLE 1

| | Sampling Frequencies | | |
|---|---|---|---|
| Modulation | FSin | FSout | Interpolation Ratio |
| 3G | 104 MHz (312 MHz/3) | 104 MHz (312 MHz/3) | 1X |
| LTE 20 MHz | 104 MHz (312 MHz/3) | 104 MHz (312 MHz/3) | 1X |
| LTE 15 MHz | 104 MHz (312 MHz/3) | 104 MHz (312 MHz/3) | 1X |
| LTE 10 MHz | 52 MHz (312 MHz/6) | 104 MHz (312 MHz/3) | 2X |
| LTE 5 MHz | 4.66 MHz (312 MHz/9) | 104 MHz (312 MHz/3) | 3X |
| LTE 3 MHz | 23.11 MHz (312 MHz*2/27) | 104 MHz (312 MHz/3) | 9/2X |
| LTE 1.4 MHz | 11.55 MHz (312 MHz/27) | 104 MHz (312 MHz/3) | 9X |

The problem of how to implement the interpolation and fractional delay with just one filter (of small size) is approached by first looking at the requirements for the fractional delay. For a fractional delay circuit, the FIR coefficients are a function of the required delay. The system timing resolution needed is on the order of 0.5 ns for the higher modulation bandwidths, which is approximately 1/18 of 104 Mhz. However, the fractional delay circuit delays the signal based upon the input sampling rate. The input sample rate for an exemplary system can vary from 11.55 MHz to 104 MHz. A table of 36 sets of coefficients is used to provide ~2.4 ns to ~0.27 ns for the 11.55 MHz and 104 MHz rates, respectively. This provides a compromise between the delay required for the higher bandwidths and performance at the lower bandwidths.

An example of the delay table is shown in Table 2. For a given output sample, it is possible to simply index into the table by the desired delay (in −1/36 or −1/18 increments).

TABLE 2

| Delay | S(−35) | S(−34) | S(−33) | S(−32) | S(−31) | S(−30) | ... | S(−3) | S(−2) | S(−1) | S(0) |
|---|---|---|---|---|---|---|---|---|---|---|---|
| 0 | F(end − 35) | F(end − 34) | F(end − 33) | F(end − 32) | F(end − 31) | F(end − 30) | ... | F(end − 3) | F(end − 2) | F(end − 1) | F(end) |
| −1/36 | F(end) | F(end − 35) | F(end − 34) | F(end − 33) | F(end − 32) | F(end − 31) | F(end − 30) | ... | F(end − 3) | F(end − 2) | F(end − 1) |
| −2/36 | F(end − 1) | F(end) | F(end − 35) | F(end − 34) | F(end − 33) | F(end − 32) | F(end − 31) | F(end − 30) | ... | F(end − 3) | F(end − 2) |
| −3/36 | F(end − 2) | F(end − 1) | F(end) | F(end − 35) | F(end − 34) | F(end − 33) | F(end − 32) | F(end − 31) | F(end − 30) | ... | F(end − 3) |
| ... | | | | | | | | | | | |

It was recognized by the inventors of the current application that the coefficients are a function of delay. Further, it was also recognized that interpolation may be accomplished using delays. Therefore, indexing through the table faster than the sample rate at fractional increments (<36) can be used to interpolate and create fractional delays.

FIG. 3 shows one embodiment of a system employing the concepts of the present application. In one embodiment, the system illustrated in FIG. 3 may be implemented in a filter 300. The filter 300 may include a buffer or queue, such as FIFO 302; a fractional delay circuit, such as an FIR 308; a coefficient look-up table (LUT) 318; and a modulo counter 320. The FIFO 302 has an input Sig_in 304 and an input FSin 306. The FIR 308 has inputs 310, 312, and 314 and an output signal Sig_out 316. Input 310 is an output from the FIFO 302. Input 312 is the FSin 306. Input 314 is FSout 322, which is also is an input to the modulo counter 320. The modulo counter 320 may be programmable, in which case it also has a programmed delay signal 324 and a ratio signal 326 as inputs. The modulo counter 320 acts as control circuitry for selecting the proper coefficients from the coefficient LUT 318. In one embodiment, the modulo counter 320 uses the programmed delay signal 324 and the ratio 326 values to determine the counter preset and increment. The modulo counter 320 also advances and retards the FIFO 302 as necessary. In this manner, the FIFO 302 provides the integer delay and the FIR 308 provides the fractional delay.

Still referring to FIG. 3, the disclosed method is accomplished by using a small LUT as the coefficient LUT 318 and an intelligent coefficient scheme to decrease the size and power consumption of the rate converter. In one embodiment, the small LUT 318 includes the coefficients required to generate delays in 1/36 increments of the output sample rate. Only one output period of delay coefficients is needed for the fractional delay. In this manner, in one embodiment, only 36 sets of coefficients need to be stored in the LUT 318. The integer delays are implemented with the FIFO 302, which may be a low cost and low power FIFO. Coefficient selection is reduced to a modulo counter 320 with a programmable reset, an increment, and a FIFO control. The preset is a function of desired delay. The increment is a function of the interpolation rate. The FIFO 302 is used to handle the coefficient LUT wrap. Although this method is described herein with respect to 1/36 fractional delay, it can be generalized to any fractional delay 1/N resolution, with 1/18 being just a single other non-limiting example.

Figure 4:
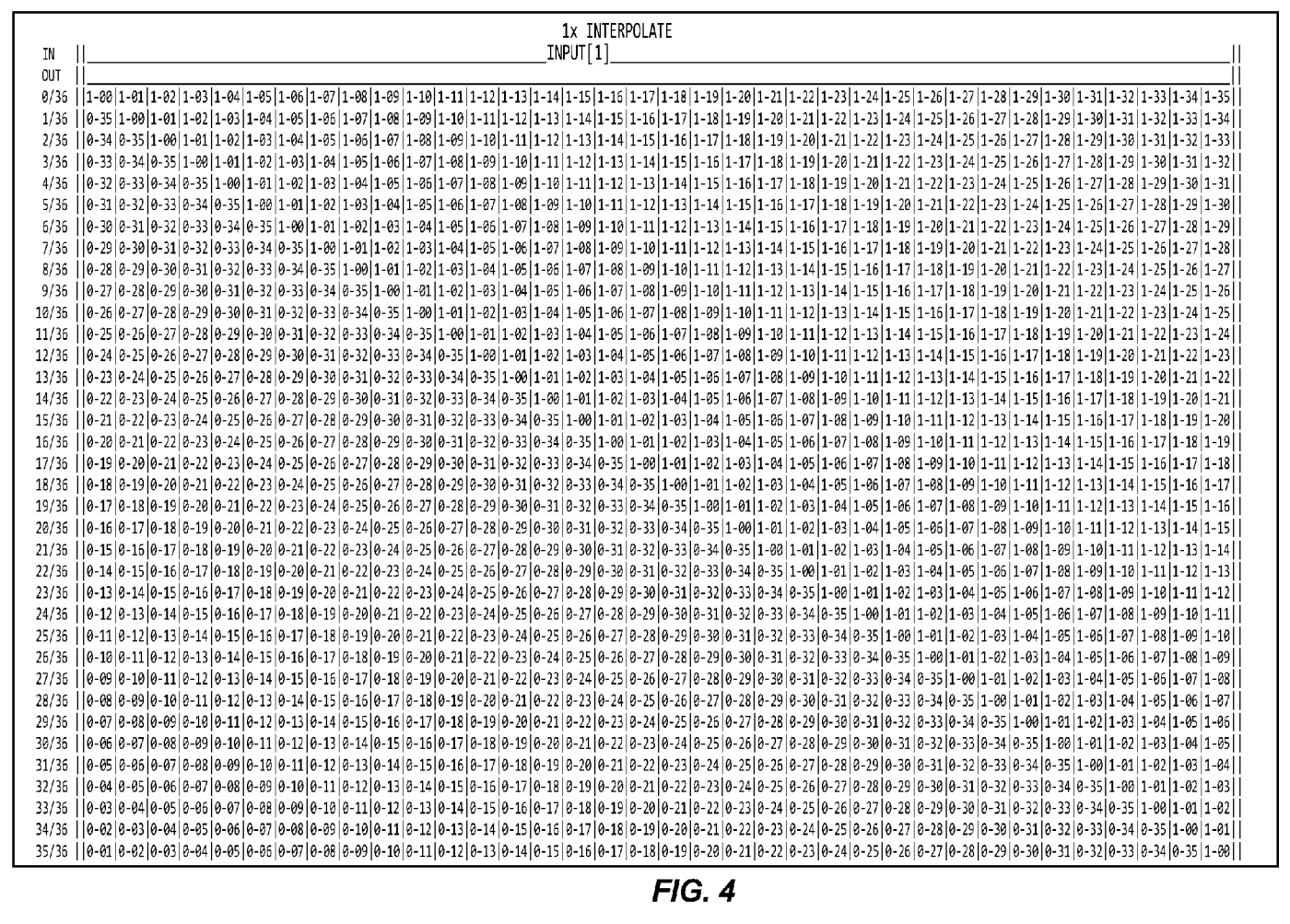
Figure 5:
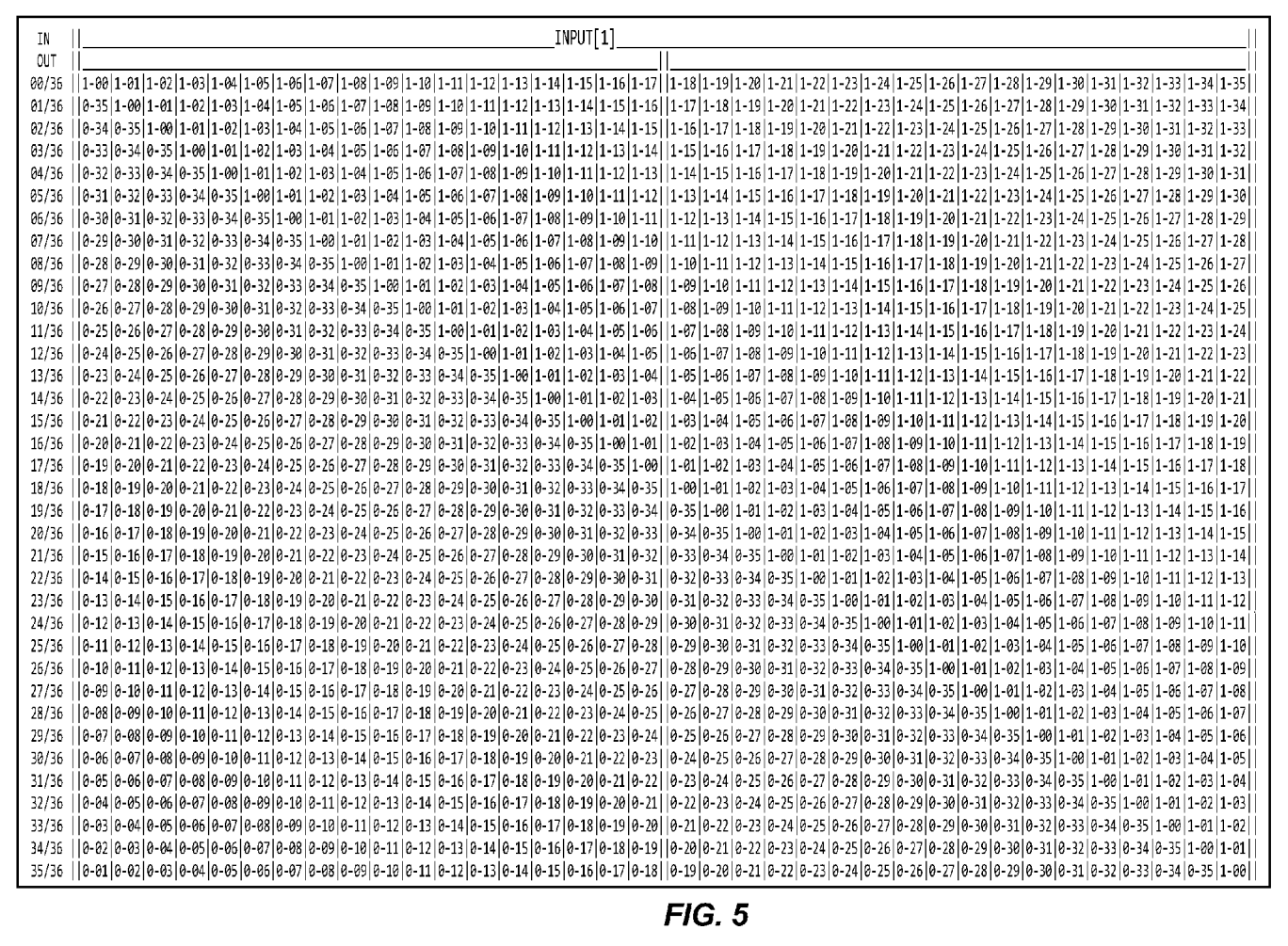
Figure 6:
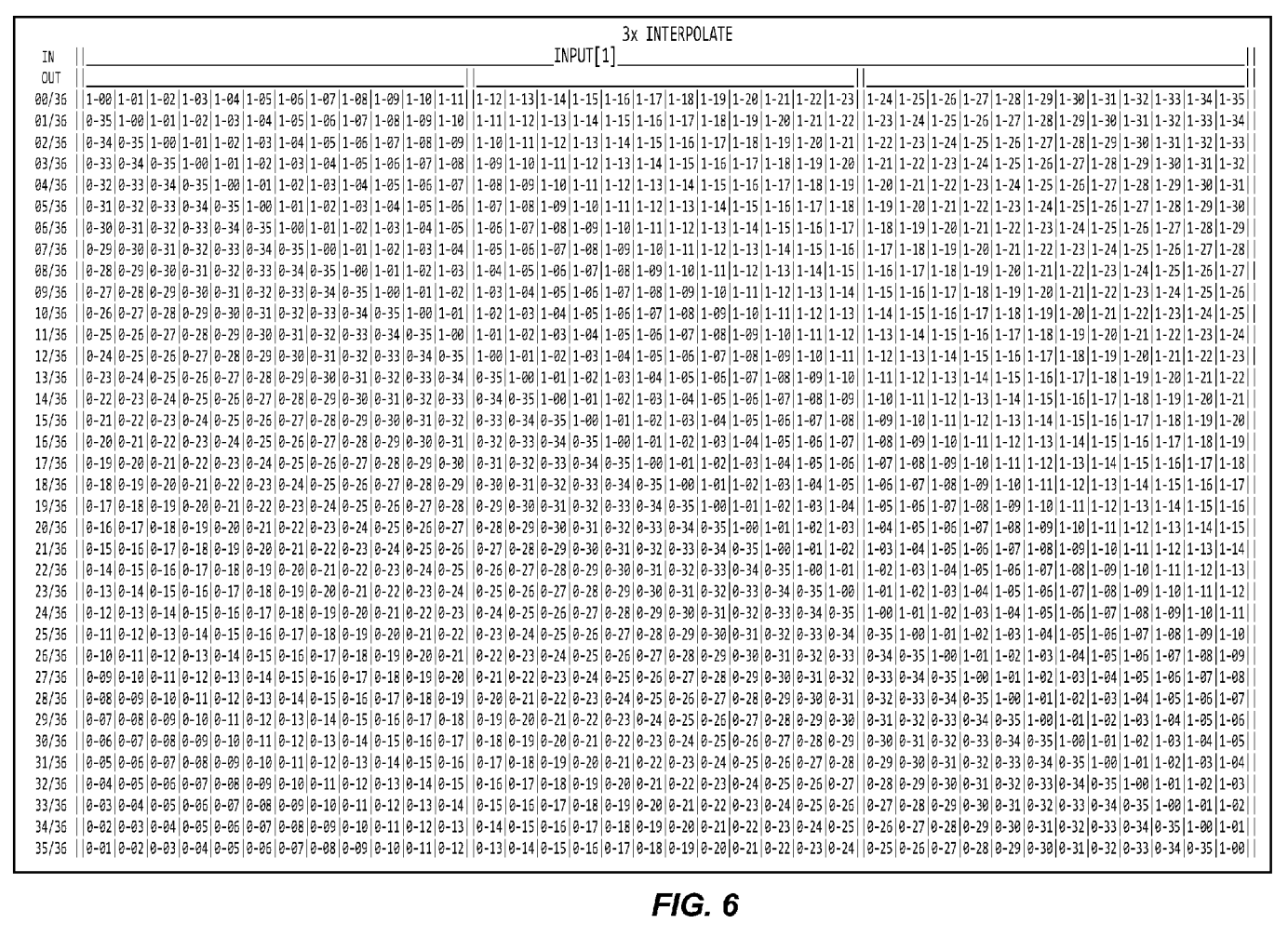
Figure 7:
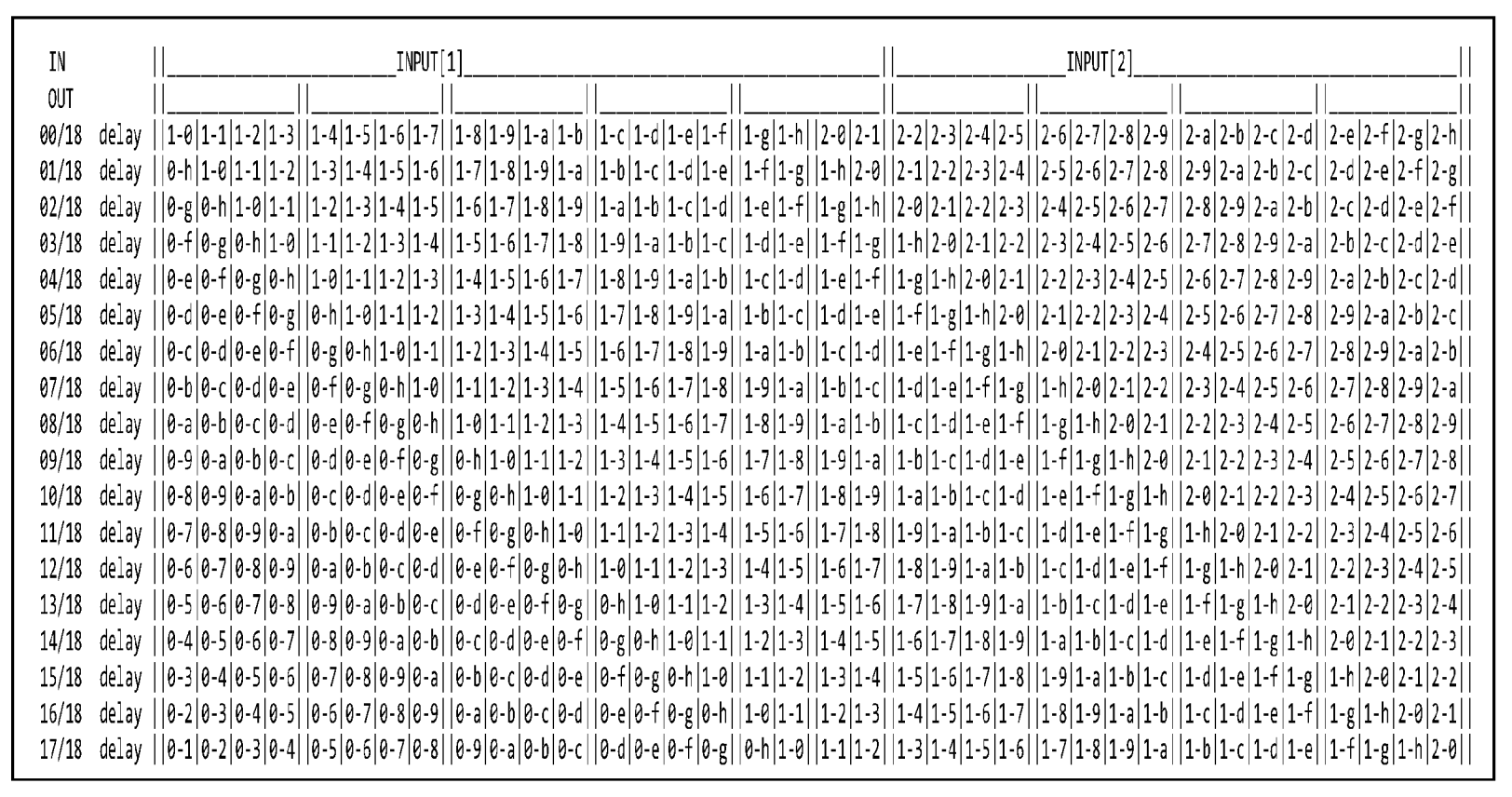
Figure 8:
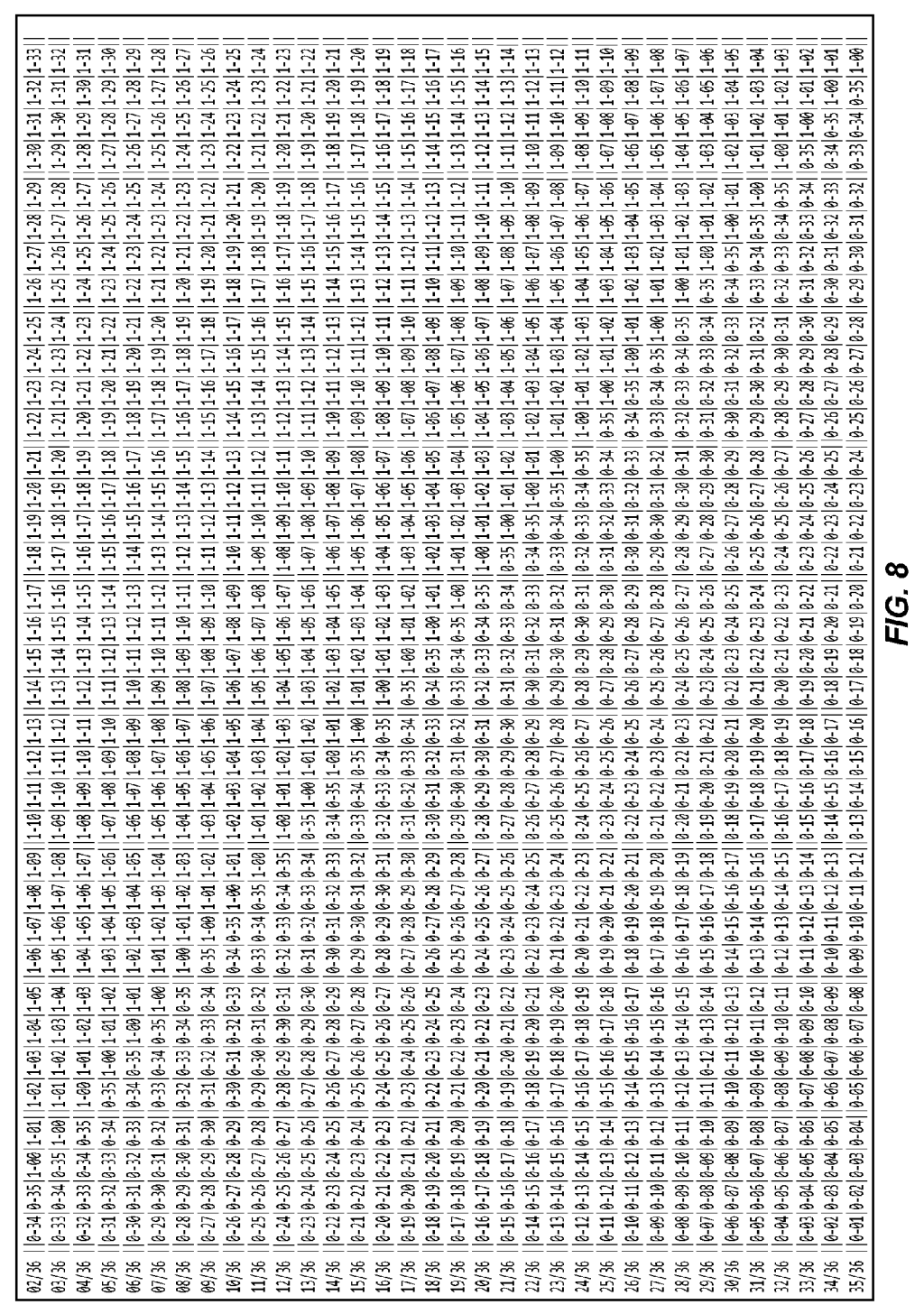

In short, the method involves using the modulo counter 320 to perform rate conversion and calculate the fractional delay. The counter preset is the desired delay. The counter increment is a function of the interpolation rate. In the embodiment where the coefficient LUT 318 has 36 sets of coefficients, and there is a 1× interpolation rate (FIG. 4), the modulo counter 320 increments by 36. In the 2× interpolation rate (FIG. 5), the modulo counter 320 increments by 18. In the 3× interpolation rate (FIG. 6), the modulo counter 320 increment is 12. In the 9/2× interpolation (FIG. 7), the increment is 8. In the 9× interpolation rate (FIG. 8), the increment is 4.

FIGS. 4-8 show how the table is used to interpolate and delay the signal. The first row shows the input signal. The second row shows the output signal. The double bars "||" show the clocks edges. The format of the samples is "S-D", where "S" is the sample and "D" is the delay. The delay ranges from 0-17 ("0"-"h"). The output sample chosen is the one shown just after the double bars. The other samples shown are just for reference.

For example, in the 1× interpolation case (FIG. 4), the current input sample is 1. So, in the 0/36 delay, the first output sample is sample[1] (x[n]) with 0 delay (1-0). For the 1/36 delay case, all samples are delayed by 1/36, so the output sample will be sample[0] (x[n−1]) with a delay of 36.

The interpolate by 2 (FIG. 5) shows two output samples for every 1 input sample. For illustration, take the case of 18/36 delay. The current input is sample[1] (x[n]). However, since there is a delay of 18/36, the first output sample will be sample[0] (x[n−1]) delayed by 18/36. The second output will be sample[1] delayed by 0/36 or 0/18. Again, note that the integer sample delay comes from the FIFO 302, not the fractional delay FIR 308.

The 9/2 interpolate (FIG. 7) is not an integer divisor of the coefficient LUT table of 36. A table of 1/36 delay (contains 36 sets of coefficients) is the least common multiple of all the interpolation rates. However, it has been shown in simulation by the inventors of the present application that it is acceptable to have this table repeat every two input samples. This allows the table to be reduced to 36 sets of coefficients. This table is large and becomes unreadable, so this is illustrated with a table with 1/18 delays.

In one embodiment, the modulo counter 320 is a modulo 36 counter. A modulo 36 counter is used to increment the counter because the coefficient table only contains 36 sets. Each time the counter rolls over, the FIFO output must change accordingly. The 9/2× interpolation case (FIG. 7) changes the calculations slightly because it spans two samples (inverse of fractional interpolation rate=1/0.5=2).

Thus, according to the described method and system, a minimal coefficient table using an intelligent look up algorithm can be used to accomplish both the rate conversion and the fractional delay calculation. This approach reduces the area of the digital circuits, the power consumption of the digital filter, and allows the use of a slower digital process. The described method creates a smaller table and uses an intelligent coefficient lookup to address all three areas of concern. This technique is not limited to the sizes used in the exemplary system. This method is also compact enough that programmable filters can be created and adapted to different system requirements of many standards. Although specific rates and delays in a cellular system are discussed herein, the described technique is applicable to any system that needs rate conversion and fractional delay. Those skilled in the art will appreciate the scope of the present disclosure and realize additional aspects thereof.

FIGS. 9-13 will now be discussed with continuing reference to FIG. 1 and FIG. 2. As discussed above, to calibrate the open loop envelope tracking system 12, the digital IQ signal interface 38 may be configured to receive a test signal that generates the modulated signal 56, $P_{IN}$. In order to generate a substantially symmetric relationship between the measured output power, $P_{MEAS}(T_{FINE\_TUNING})$, relative to the negative fine tuning delay time, $T_{NEGATIVE\_FINE\_TUNING}$, and the positive fine tuning delay time, $T_{POSITIVE\_FINE\_TUNING}$, provided by the fine tuning delay circuit 72, the test signal may be selected to generate a substantially symmetric, somewhat symmetric, or symmetric modulated signal 56, $P_{IN}$. As a result, the envelope tracking digital/analog section 66 generates the control signal 48 based on the modulated signal 56, $P_{IN}$.

Figure 9:
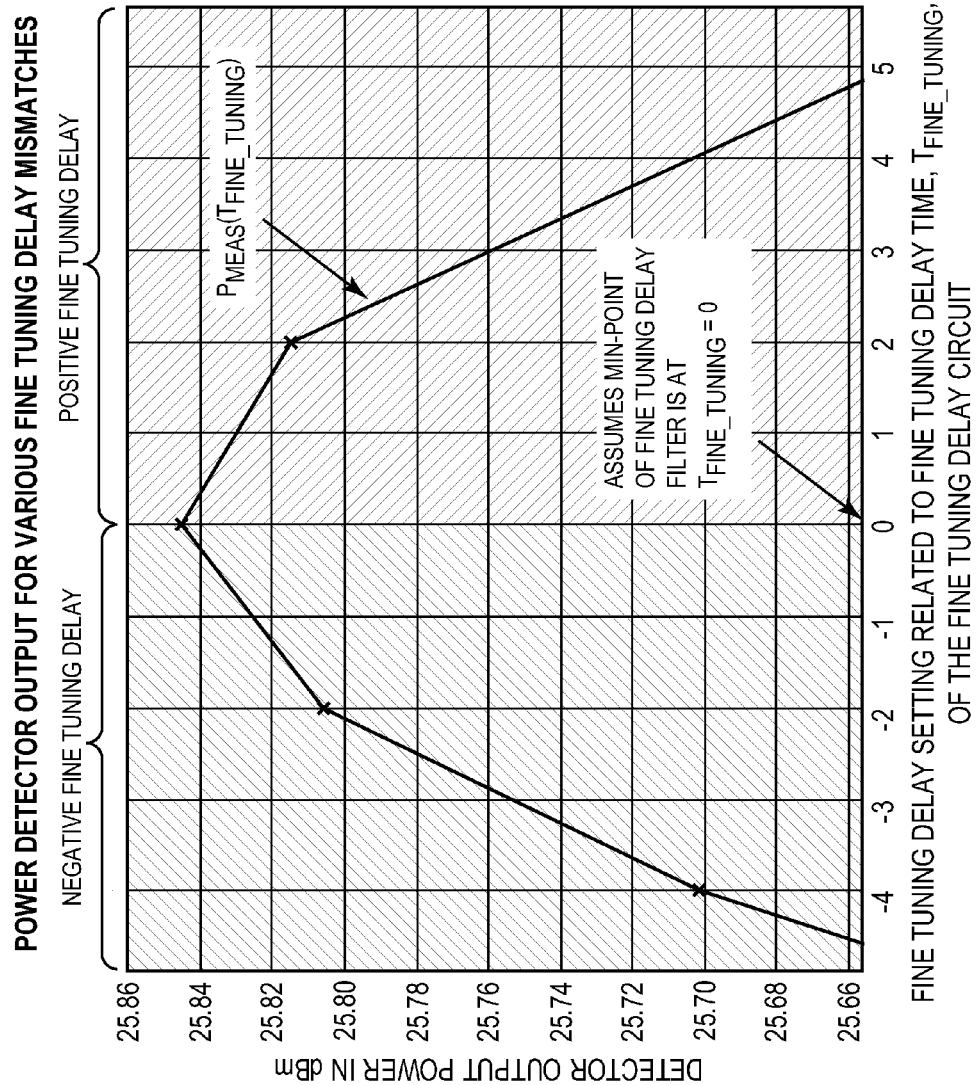
FIG. 9 depicts a measured output power at an output of the radio frequency power amplifier of the open loop envelope tracking system for a modulated signal wherein the control signal provided to the envelope tracker power converter is delayed by various values of fine tuning delay time based on the fine tuning delay settings of the fine tuning delay circuit.

As a non-limiting example embodiment, FIG. 9 depicts a measured output power, $P_{MEAS}(T_{FINE\_TUNING})$, relative to the negative fine tuning delay time, $T_{NEGATIVE\_FINE\_TUNING}$, and the positive fine tuning delay time, $T_{POSITIVE\_FINE\_TUNING}$, provided by the fine tuning delay circuit 72. The measured output power, $P_{MEAS}(T_{FINE\_TUNING})$, is the output power of the radio frequency power amplifier output signal 24 measured at the detector sensor 20A of detector 20 relative to various fine tuning delay settings of the fine tuning delay circuit 72. As a non-limiting example, in some embodiments, each of the fine tuning delay settings corresponds to a delay time of approximately 1.08 nanoseconds. For example, as described above, for a fine tuning delay setting equal to +1, the fine tuning delay time relative to the mid-point fine tuning delay time, $T_{FINE\_TUNING\_CENTER}$, where the fine tuning delay time, $T_{FINE\_TUNING}$, equals zero is approximately 1.08 ns. FIG. 9 depicts the measured output power, $P_{MEAS}$ $(T_{FINE\_TUNING})$, having zero offset delay that is centered at a fine tuning setting equal to zero. In other words, the offset delay time, $T_{OFFSET}$, is equal to zero. As a result, the magnitude of the measured output power, $P_{MEAS}(T_{FINE\_TUNING})$, is maximized for a fine tuning delay setting equal to zero.

Figure 10:
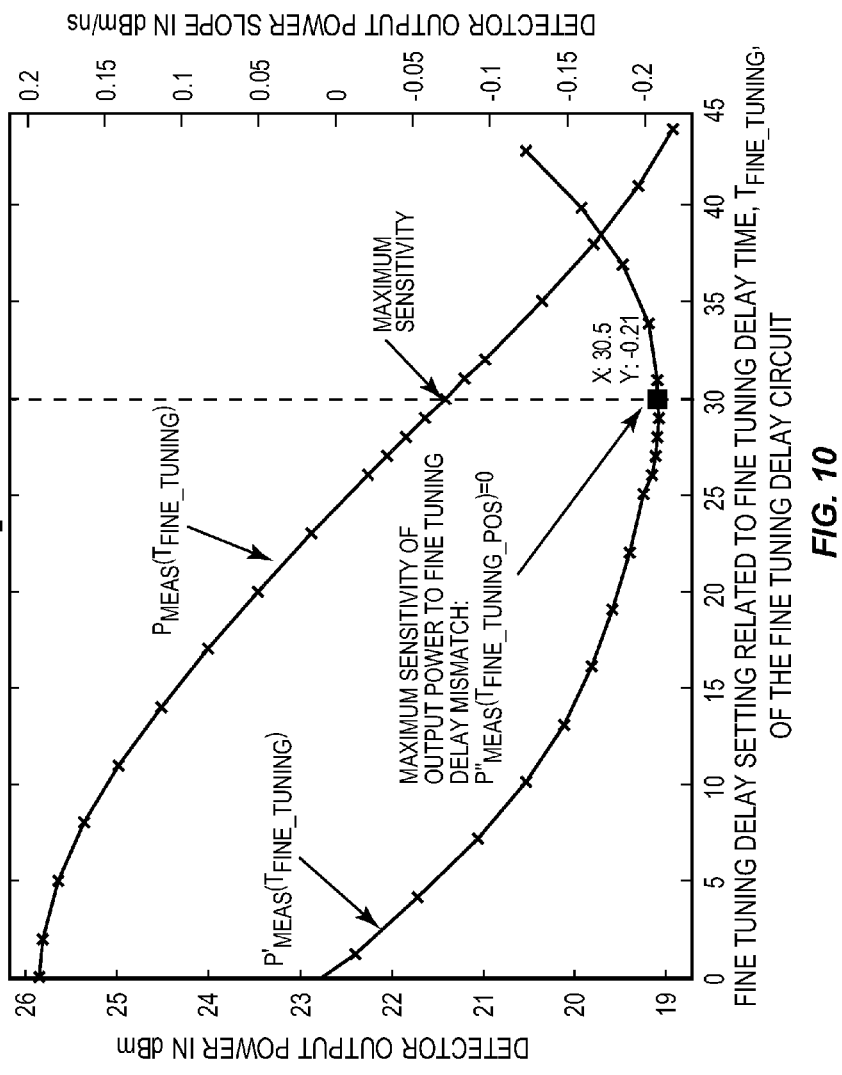
FIG. 10 depicts between the comparison of the measured output power at the output of the radio frequency power amplifier of the open loop envelope tracking system versus the measured output power sensitivity with respect to various values of fine tuning delay time related to the fine tuning delay settings of fine tuning delay circuit.

FIG. 10 depicts a relationship between the measured output power, $P_{MEAS}(T_{FINE\_TUNING})$, at the detector 20 with respect to the fine tuning delay settings of the fine tuning delay circuit 72 that correspond to various values of a fine tuning delay time, $T_{FINE\_TUNING}$, at least equal to zero. In addition, FIG. 10 depicts a first derivative of the measured output power, $P'_{MEAS}(T_{FINE\_TUNING})$ with respect to the fine tuning delay settings of the fine tuning delay circuit 72 that correspond to various values of a fine tuning delay time, $T_{FINE\_TUNING}$, at least equal to zero. The first derivative of the measured output power, $P'_{MEAS}(T_{FINE\_TUNING})$, may be used to determine a fine tuning delay time, $T_{FINE\_TUNING}$, which corresponds to a maximum sensitivity of the open loop envelope tracking system 12 to a group delay mismatch. In other words, the first derivative of the measured output power, $P'_{MEAS}$ $(T_{FINE\_TUNING})$, may be used to determine a fine tuning delay time, $T_{FINE\_TUNING}$, where the measured output power of the radio frequency power amplifier output signal 24 generated by the radio frequency power amplifier 18 is maximally sensitive to a change in the group delay mismatch. As depicted in FIG. 10, the maximum sensitivity of the measured output power, $P_{MEAS}(T_{FINE\_TUNING})$, to the group delay mismatch occurs for the fine tuning delay time, $T_{FINE\_TUNING}$, substantially equal to a positive fine tuning delay time, $T_{FINE\_TUNING\_POS}$. For a fine tuning delay setting greater than zero, the first derivative of the measured output power at the positive fine tuning delay time, $P_{MEAS}$ $(T_{FINE\_TUNING\_POS})$, corresponds to the fine tuning delay time, $T_{FINE\_TUNING}$, where the first derivative of the measured output power, $P'_{MEAS}(T_{FINE\_TUNING})$, has a minimum value and the second derivative of the measured output power at the positive fine tuning delay time, $P''_{MEAS}$ $(T_{FINE\_TUNING\_POS})$, substantially equals zero. As further depicted in FIG. 10, the fine tuning delay setting of the fine tuning delay circuit 72 that corresponds closest to the positive fine tuning delay time, $T_{FINE\_TUNING\_POS}$, is approximately 30, which corresponds to a positive fine tuning delay time, $T_{FINE\_TUNING\_POS}$, substantially equal to 32.4 nanoseconds. The maximum sensitivity of the measured output power, $P_{MEAS}(T_{FINE\_TUNING})$, to a change in the fine tuning delay time, $T_{FINE\_TUNING}$, occurs where an absolute magnitude of a slope of the measured output power, $P_{MEAS}(T_{FINE\_TUNING})$, has a maximum magnitude.

Figure 11:
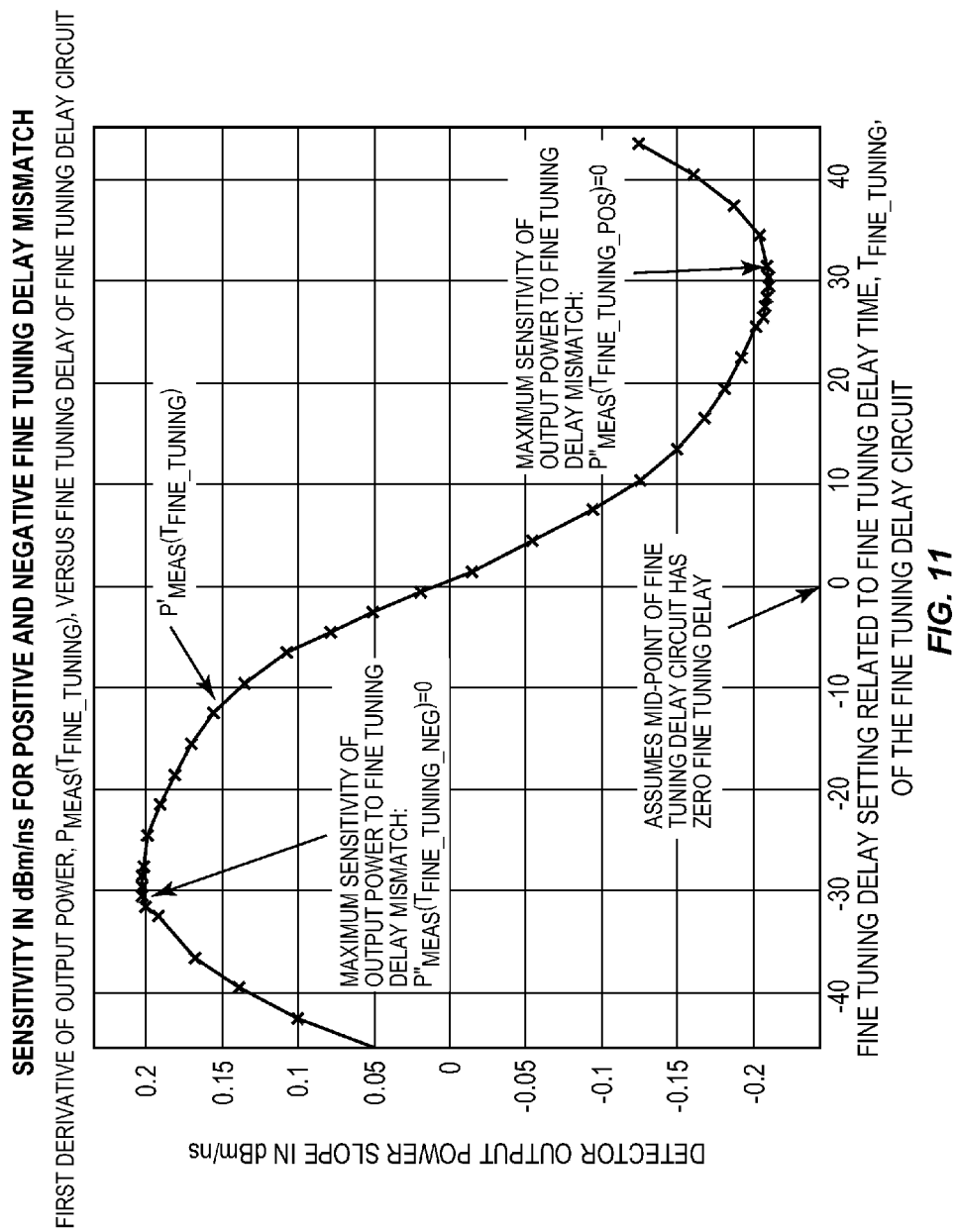
FIG. 11 depicts the sensitivity of the measured output power for the open loop envelope tracking system with respect to both positive fine tuning delay time and negative fine tuning delay time related to the positive fine tuning delay settings and negative fine tuning delay settings of the fine tuning delay circuit.

FIG. 11 depicts the first derivative of the measured output power, $P'_{MEAS}(T_{FINE\_TUNING})$, with respect to the fine tuning delay settings of the fine tuning delay circuit 72. Under the calibration conditions, as shown in FIG. 9, the measured output power, $P_{MEAS}(T_{FINE\_TUNING})$, may be substantially symmetric. FIG. 11 depicts that for a fine tuning delay setting less than zero, the first derivative of the measured output power at the negative fine tuning delay time, $P'_{MEAS}$ $(T_{FINE\_TUNING\_NEG})$, corresponds to the fine tuning delay time, $T_{FINE\_TUNING}$, where the first derivative of the measured output power, $P'_{MEAS}(T_{FINE\_TUNING})$, has a maximum value and the second derivative of the measured output power at the negative fine tuning delay time, $P''_{MEAS}$ $(T_{FINE\_TUNING\_NEG})$, substantially equals zero. As further depicted in FIG. 11, the fine tuning delay setting of the fine tuning delay circuit 72 that corresponds closest to the negative fine tuning delay time, $T_{FINE\_TUNING\_NEG}$, is approximately −30, which corresponds to a negative fine tuning delay time, $T_{FINE\_TUNING\_NEG}$, substantially equal to −32.4 nanoseconds. Accordingly, as depicted in FIG. 10 and FIG. 11, the maximum sensitivity fine tuning delay setting of the fine tuning delay circuit 72 is approximately 30. The maximum sensitivity fine tuning delay setting of the open loop envelope tracking system 12 may be obtained by either simulation of the open loop envelope tracking system 12 or gathering data for a number of communication devices 10. Alternatively, as will be discussed below, the maximum sensitivity fine tuning delay setting may be obtained by sweeping the fine tuning delay settings of the fine tuning delay circuit 72 to obtain either the fine tuning delay setting that that corresponds closest to either the positive fine tuning delay time, $T_{FINE\_TUNING\_POS}$, or the negative fine tuning delay time, $T_{FINE\_TUNING\_NEG}$.

In addition, FIG. 11 depicts that the magnitude of the negative fine tuning delay time, $T_{FINE\_TUNING\_NEG}$, and the magnitude of the positive fine tuning delay time, $T_{FINE\_TUNING\_POS}$, are substantially equal. Accordingly, as will be discussed below, a calibration method may be developed to determine a fine tuning delay setting of the fine tuning delay circuit 72 that minimizes the group delay mismatch between the modulated power amplifier supply voltage 58, $V_{CC}$, and the modulated signal 56, $P_{IN}$, based on the values of the fine tuning delay, $T_{FINE\_TUNING}$, that correspond to a maximum sensitivity of the open loop envelope tracking system 12 to group delay mismatch.

FIGS. 12A-C and 13A-C depict the relative group delay between the modulated power amplifier supply voltage 58, $V_{CC}$, and the modulated signal 56, $P_{IN}$. FIGS. 12A and 13A depict an open loop envelope tracking system 12 where the group delay mismatch between the control signal 48 and the modulated signal 56, $P_{IN}$, is minimized. The measured output power, $P_{MEAS}(T_1)$ and the measured output power, $P_{MEAS}$ $(T_2)$, are substantially equal. As depicted in FIG. 6A, the first fine tuning delay time, $T_1$, corresponds to a fine tuning delay setting of the fine tuning delay circuit 72 that is greater than the fine tuning delay setting of the fine tuning delay circuit 72 that corresponds to the second fine tuning delay time, $T_2$. Thus, referring briefly to FIGS. 9-11, the first fine tuning delay time, $T_1$, is a positive fine tuning delay time while the second fine tuning delay time, $T_2$, is a negative fine tuning delay time.

Returning to FIGS. 12A and 13A, the first fine tuning delay time, $T_1$, corresponds to a fine tuning delay time, $T_{FINE\_TUNING}$, such that the measured output power at the first fine tuning delay time, $P_{MEAS}(T_1)$, has a maximum sensitivity to group delay mismatch. The fine tuning delay time, $T_{FINE\_TUNING}$, corresponding to the maximum sensitivity to group delay mismatch for a fine tuning delay setting greater than zero may be obtained by taking the first derivative of the measured output power, $P'_{MEAS}(T_{FINE\_TUNING})$. At the first fine tuning delay time, $T_1$, $P_{MEAS}(T_1)$, has a minimum value for the fine tuning delay settings of the fine tuning delay circuit 72 that are greater than zero. The second fine tuning delay time, $T_2$, corresponds to a fine tuning delay time, $T_{FINE\_TUNING}$ where the measured output power sensitivity to group delay mismatch, $P'_{MEAS}(T_2)$, has a maximum value for the fine tuning delay setting of the fine tuning delay circuit 72 that is less than zero. As depicted in FIG. 13A, under this condition, the group delay mismatch is minimized such that the modulated signal 56, $P_{IN}$, and the modulated power amplifier supply voltage 58, $V_{CC}$, are aligned. As a result, the output power measurement, $P_{MEAS}$, is also aligned with the modulated power amplifier supply voltage 58, $V_{CC}$. Accordingly, the open loop envelope tracking system 12 provides maximum efficiency.

In contrast, FIGS. 12B-C and 13B-C depict the relative group delay between the modulated power amplifier supply voltage 58, $V_{CC}$, and the modulated signal 56, $P_{IN}$, where there is a group delay mismatch approximately equal to mismatch delay time, $T_{DELAY}$. The mismatch delay time, $T_{DELAY}$, represents a group delay mismatch. FIGS. 12B and 13B depict an open loop envelope tracking system 12 configured where the group delay mismatch between the control signal 48 and the modulated signal 56, $P_{IN}$, is equal to a positive group delay mismatch time, $+T_{DELAY}$. The output power measurements $P_{MEAS}(T_1+T_{DELAY})$ and $P_{MEAS}(T_2+T_{DELAY})$ are substantially unequal. In addition, at the first mismatch fine tuning delay time, $T_1+T_{DELAY}$, the measured output power sensitivity to group delay mismatch, $P'_{MEAS}(T_1+T_{DELAY})$, is not maximized for the fine tuning delay time, $T_{FINE\_TUNING}$, greater than zero. Also, at the second mismatch fine tuning delay time, $T_2+T_{DELAY}$, the measured output power sensitivity to group delay mismatch, $P_{MEAS}(T_2+T_{DELAY})$, is not maximized for the fine tuning delay time, $T_{FINE\_TUNING}$, greater than zero. As depicted in FIG. 13B, under this condition, the group delay mismatch is not minimized such that the modulated signal 56, $P_{IN}$, and the modulated power amplifier supply voltage 58, $V_{CC}$, are aligned. As a result, the output power measurement, $P_{MEAS}$, is not aligned with the modulated power amplifier supply voltage 58, $V_{CC}$. Accordingly, the open loop envelope tracking system 12 fails to provide maximum efficiency. In order to properly align the open loop envelope tracking system 12, the fine tuning delay circuit 72 would need to be adjusted to eliminate the positive group delay mismatch time, $+T_{DELAY}$.

FIGS. 12C and 13C depict an open loop envelope tracking system 12 configured where the group delay mismatch between the control signal 48 and the modulated signal 56, $P_{IN}$, is equal to $-T_{DELAY}$. The output power measurements $P_{MEAS}(T_2-T_{DELAY})$ and $P_{MEAS}(T_2-T_{DELAY})$ are substantially unequal. In addition, at the first mismatch fine tuning delay time, $T_1-T_{DELAY}$, the measured output power sensitivity to group delay mismatch, $P'_{MEAS}(T_1-T_{DELAY})$, is not maximized for the fine tuning delay time, $T_{FINE\_TUNING}$, greater than zero. Also, at the second mismatch fine tuning delay time, $T_1-T_{DELAY}$, the measured output power sensitivity to group delay mismatch, $P'_{MEAS}(T_2-T_{DELAY})$, is not maximized for the fine tuning delay time, $T_{FINE\_TUNING}$, greater than zero. As depicted in FIG. 13C, under this condition, the group delay mismatch is not minimized such that the modulated signal 56, $P_{IN}$, and the modulated power amplifier supply voltage 58, $V_{CC}$, are aligned. As a result, the output power measurement, $P_{MEAS}$, is not aligned with the modulated power amplifier supply voltage 58, $V_{CC}$. Accordingly, the open loop envelope tracking system 12 fails to provide maximum efficiency. In order to properly align the open loop envelope tracking system 12, the fine tuning delay circuit 72 should be adjusted to eliminate the negative group delay mismatch time, $-T_{DELAY}$.

Figure 14A:
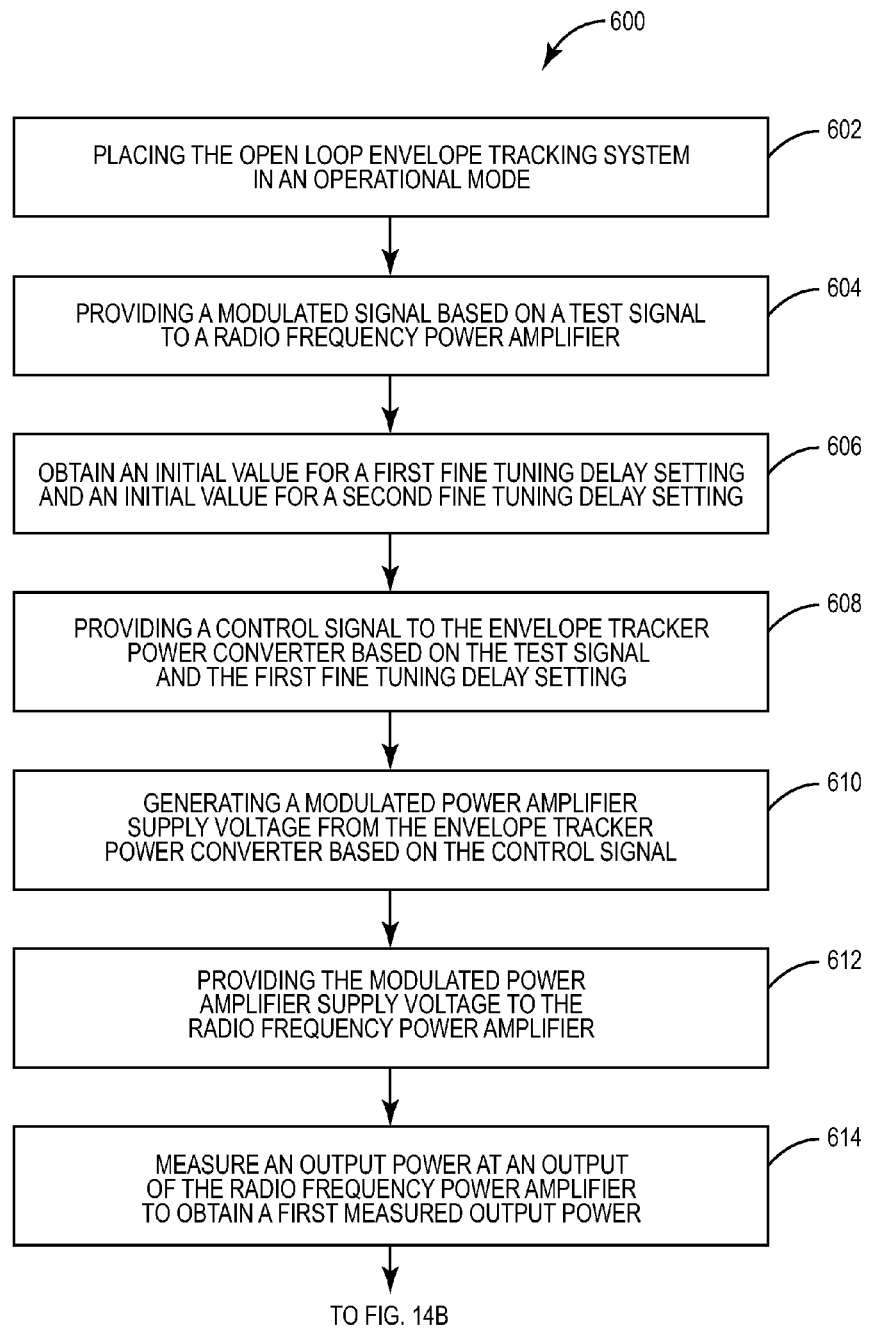
FIG. 14A, FIG. 14B, and FIG. 14C depict an example embodiment for calibrating a group delay of a power amplifier envelope tracking system.
Figure 14B:
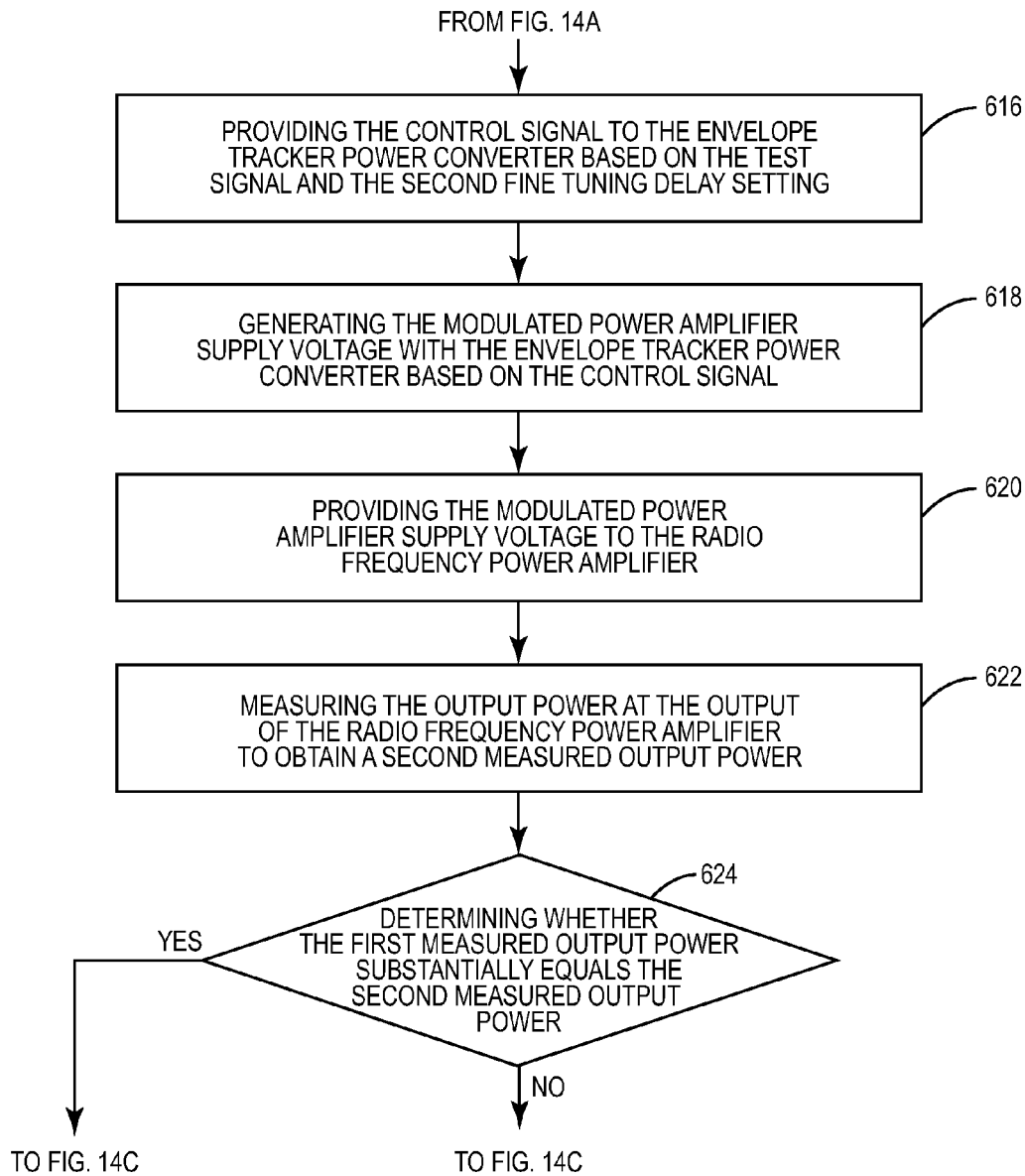
Figure 14C:
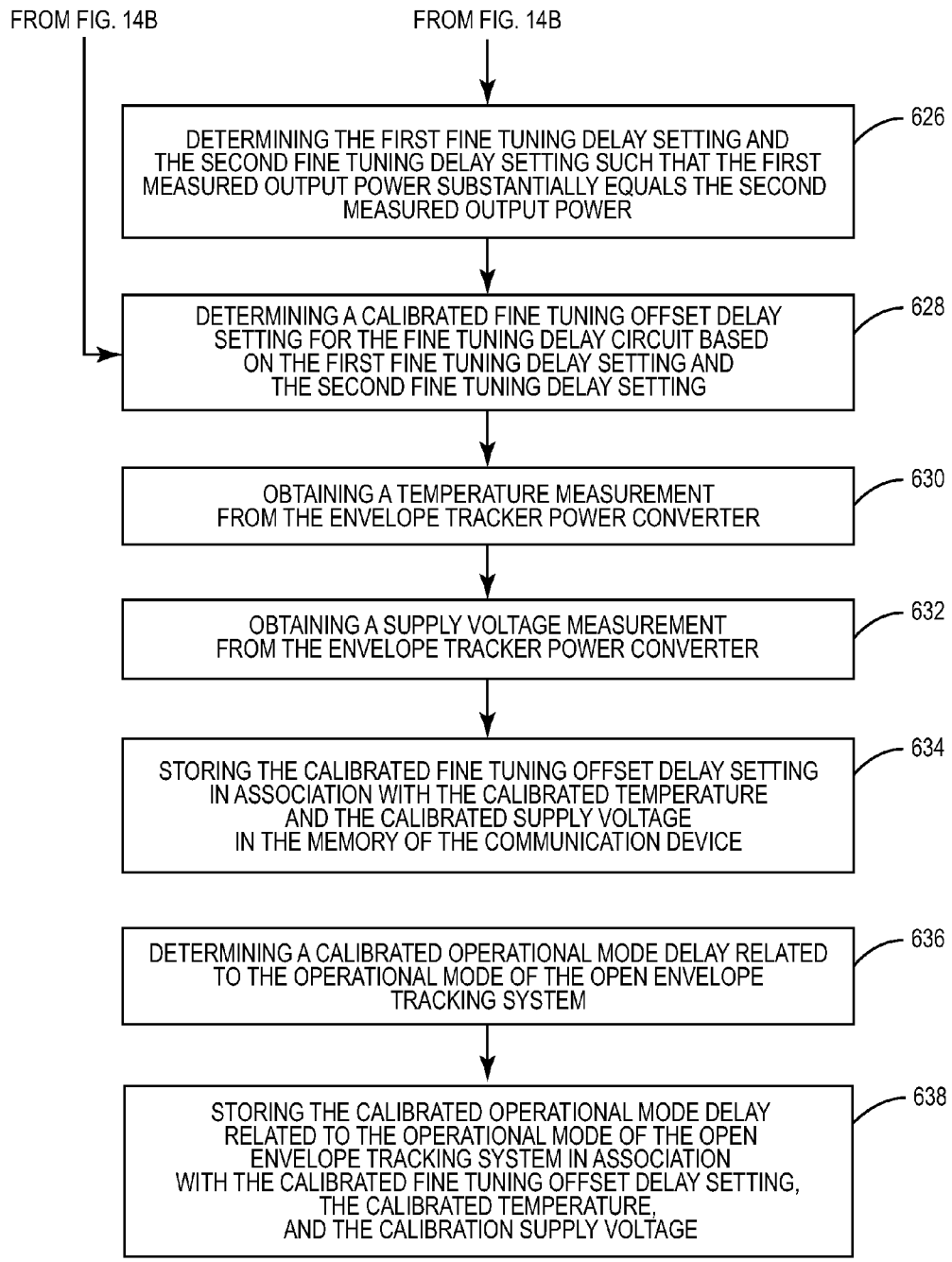

FIGS. 14A-C depict an embodiment of a calibration method 600 for determining a calibrated fine tuning offset delay that minimizes a group delay mismatch of the open loop envelope tracking system 12. The description of the method 600 will be carried out with continuing reference to FIGS. 1, 2, 9-11, FIGS. 12A-C, and FIGS. 13A-C. As depicted in FIGS. 12B-C and 13B-C, the fine tuning delay circuit 72 may be calibrated to adjust a fine tuning delay setting of the fine tuning delay circuit 72 to compensate for the mismatch delay time, $T_{DELAY}$, and thereby minimize the group delay mismatch. The calibrated fine tuning offset delay may correspond to a fine tuning delay setting of the fine tuning delay circuit 72 that minimizes the group delay mismatch between the modulated signal 56, $F_{IN}$, and the modulated power amplifier supply voltage 58, $V_{CC}$, for a particular configuration of the open loop envelope tracking system 12. In addition, the calibration of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

The calibration technique depicted in FIGS. 14A-C may be used to calibrate the open loop envelope tracking system 12 as part of a factor calibration operation or during normal operation of the communication device 10. As an example, the calibration technique may be used during inactive transmission periods or slots to ensure that neither a change in temperature nor supply voltage have changed the group delay characteristics. In addition, in some embodiments, the calibration technique may be used each time a communication device changes an operational mode or a band of operation. In addition, the calibration technique may be used periodically, before commencement of a data transmission, or initiation of a series of data transmissions. For example, the calibration technique may be used prior to commencing a telephonic communication and/or a data communication. Likewise, in some embodiments, the calibration technique may be triggered based on a detection of a change in temperature, a supply voltage, a transmission power level, a transmission power mode, and/or some combination thereof. In some embodiments, the trigger to recalibrate may be initiated due to a comparison to a threshold. An example threshold may include a battery level threshold, a supply voltage threshold, a rate of battery consumption, and/or a relative change in temperature of at least one of a plurality of devices within the communication device 10. As another example, while the transmitter is not active during a compressed period or discontinuous transmit period of operation, the communication device may initiate the calibration technique. As an example, during calibration, the communication device may be configured to operate at a power amplifier output power less than −36 dBm plus antenna switch isolation provided by the radio frequency switch 22. For example, some embodiments of the radio frequency switch 22 may have an antenna switch isolation around +25 dBm. Accordingly, as one example, during execution of the calibration technique, the calibration output power at the output of the radio frequency power amplifier 18 may be between −11 dBm and −17 dBm. In this case, the detector 20 may be configured to have an operating range between +28 dBm to −17 dBm, which provides approximately 45 dBm of dynamic range. As an example, the calibration technique may be used within various communication networks including those based on High-Speed Uplink Pack Access (HSUPA), Dual Cell High-Speed Uplink Packet Access (DC-HSUPCA), or Long Term Evolution (LTE) communication standards.

In addition, parameters used to configure the open loop envelope tracking system 12 may be obtained by simulation of the open loop envelope tracking system 12 and/or the various components of the open loop envelope tracking system 12. In other cases, the parameters used to configure the open loop envelope tracking system 12 may likewise be obtained by gathering data on a number of communication devices 10. In addition, as discussed above, in some cases, parameters used to configure the open loop envelope tracking system 12 may be obtained by gathering data from the device under configuration.

As an example, in some embodiments of the method 600, the communication device 10 may include more than one calibrated fine tuning offset delay where each calibrated fine tuning offset delay corresponding to an operational mode of the open loop envelope tracking system 12, the digital baseband circuit 14, the envelope tracker power converter 16, the radio frequency power amplifier 18, the digital pre-distortion compensation filter 74, or some other aspect of the open loop envelope tracking system 12, and/or a combination thereof. For example, a propagation delay through the digital pre-distortion compensation filter 74 may vary depending upon the various modes of operation of the communication device 10. In addition, various factors including a band of operation, a channel bandwidth, a wideband modulation bandwidth, channel conditions, a location of the communication device 10 relative to communication hubs, points, towers, and hot-spots, signal modulation techniques, expected envelope characteristics, the peak-to-average ratio of the envelope of the signal to be transmitted, the data rate, the bandwidth of the channel, error vector magnitude, desired transmit spectrum characteristics, and/or some combination thereof may impact the propagation delay of either the modulated signal 56, $P_{IN}$, and the modulated power amplifier supply voltage 58, $V_{CC}$. Thus, some embodiments of the open loop envelope tracking system 12 may include an operational mode delay related to the operation mode of the open loop envelope tracking system 12. The operational mode delay may be related to an operational propagation delay of the envelope tracker power converter 16. Alternatively, the operational mode delay may be related to an operational propagation delay through the digital baseband circuit 14. As an example, the operational propagation delay between the fixed delay circuit 78 and the modulated interface 54 may vary depending upon an operational mode of the digital baseband signal. Similarly, operational propagation delay of the envelope tracking digital/analog section 66 may vary depending upon various settings and configurations. In addition, the communication device 10 may include various calibration modes of operation for which a calibrated fine tuning offset delay and corresponding calibrated fine tuning offset delay setting are determined.

Accordingly, the controller 32 and/or processor 28 may place the open loop envelope tracking system 12 in a desired operational mode. (Step 602) As an example, depending upon whether the communication device 10 is being calibrated in a factor setting or in a field setting, either the processor 28 may be configured to radio frequency switch to isolate the antenna 26 from the radio frequency power amplifier output signal 24 and configure the digital baseband circuit 14 or the radio frequency power amplifier 18 to generate a radio frequency power amplifier output signal 24 in the operating range between +28 dBm to −17 dBm. In addition, the processor 28 may configure the digital baseband circuit 14, the envelope tracker power converter 16, the radio frequency power amplifier 18, and the detector 20 to operate in a desired operational mode. In some cases, the operational mode may depend upon the operational mode of the communication device 10. As an example, the communication device 10 may be placed in a selected operational mode based on a band of operation assigned to the communication device 10. Alternatively, the open loop envelope tracking system 12 may be placed in various operational modes to calibrate the open loop envelope tracking system 12 to operate in various configurations and support various bands of operation during the configuration process.

The controller 32, the processor 28, or a combination of the controller 32 and processor 28 may configure the digital baseband circuit 14 to receive a test signal at the digital IQ signal interface 38. The test signal may include a digital in-phase component 40, $I_{DIGITAL}$, and a digital quadrature component 42, $Q_{DIGITAL}$. Based on the test signal, the digital baseband circuit 14 may provide a modulated signal 56, $P_{IN}$, to the radio frequency power amplifier 18. (Step 604) The modulated signal 56, $P_{IN}$, may be a carrier wave having a desired frequency or some other modulated signal having a substantially symmetrical envelope characteristic. In addition, the test signal used to generate the modulated signal 56, $P_{IN}$, may be based on a band of operation which the communication device 10 is configured to operate within a communication network, a wideband modulation scheme associated with a band of operation, or a desired frequency characteristic or periodicity. As an example, the modulated signal 56, $P_{IN}$, may have a substantially sinusoidal envelope characteristic. In other embodiments, the modulated signal 56, $P_{IN}$, may be substantially based on a carrier wave tone signal. The carrier wave tone signal may be at 10 MHz. In other embodiments, the carrier wave tone may be selected to have a frequency between 5 MHz and 20 MHz.

The processor 28 or the controller 32 may obtain an initial value for a first fine tuning delay setting and an initial value for a second fine tuning delay. (Step 606) As depicted in FIG. 10 and FIG. 11, the initial value for the first fine tuning delay setting may be based on a previously determined first maximum sensitivity fine tuning delay setting that corresponds to a maximum sensitivity of the output power of the radio frequency power amplifier 16. The initial value for the second fine tuning delay setting may be based on a previously determined second maximum sensitivity fine tuning delay setting that corresponds to a maximum sensitivity of the output power of the radio frequency power amplifier 16. As an example, referring to FIG. 11, the initial value for the first fine tuning delay setting may equal 30 and the initial value for the second fine tuning delay setting may equal −30. For example, the fine tuning delay setting equal to 30 may be a first maximum sensitivity fine tuning delay setting. The fine tuning delay setting equal to −30 may be a second maximum sensitivity fine tuning delay setting. In some embodiments, the initial values for the first fine tuning delay setting and the second fine tuning delay setting may be adjusted based on the operational mode of either the communication device 10 or the open loop envelope tracking system 12 being calibrated. For example, the operational mode of either the communication device 10 or the open loop envelop tracking system 12 from which the initial value for the first fine tuning delay setting equal to 30 and the initial value for the second fine tuning delay setting equal to −30 may be different from the operational mode of the device being calibrated. In such a case, the initial values for the first fine tuning delay setting and the second fine tuning delay setting may be adjusted based on the operational mode of the device being calibrated and the known operational mode or assumed operational mode of the device or system from which the initial values of the first fine tuning delay setting and the initial fine tuning delay setting were obtained. In some embodiments, the first fine tuning delay setting and the second fine tuning delay setting may be parameter values that are stored in association with the fine tuning delay circuit 72, in a memory location associated with the controller 32 or the processor 28, or downloaded from a test equipment interface. In some embodiments, the initial values for the first fine tuning delay setting and the second fine tuning delay setting may be provided via a network connection. As an example, the initial values for the first fine tuning delay setting and the second fine tuning delay setting may be provided via a network connection after a communication device is assigned to operate in an operational mode or a band of operation in a communication network. In other embodiments, the first fine tuning delay setting and the second fine tuning delay setting may be obtained from the memory associated with the controller 32, the processor 28, or the digital baseband circuit 14.

The initial values of the first fine tuning delay and the second fine tuning delay may depend on the architecture or control interface of the fine tuning delay circuit 72. As an example, some embodiments of the fine tuning delay circuit 72 may be configured to have a minimum fine tuning delay setting corresponding to a minimum fine tuning delay time and a maximum fine tuning delay setting corresponding to a maximum fine tuning delay time, as depicted in FIG. 12A-C. In some cases, the minimum fine tuning delay setting may correspond to a fine tuning delay setting equal to zero and the maximum fine tuning delay setting may correspond to a maximum number of fine tuning delay steps. Alternatively, in some embodiments, the fine tuning delay circuit 72 may be divided into a positive fine tuning delay and a negative fine tuning delay where the fine tuning delay settings includes positive and negative values relative to the mid-point fine tuning delay time, $T_{FINE\_TUNING\_CENTER}$. In this case, the fine tuning delay setting equal to zero corresponds to the mid-point fine tuning delay time, $T_{FINE\_TUNING\_CENTER}$.

In some alternative embodiments, the first fine tuning delay setting and the second fine tuning delay setting may be obtained by calculating the first fine tuning delay setting and the second fine tuning delay setting based on a maximum sensitivity fine tuning delay setting. For example, the maximum sensitivity fine tuning delay setting may correspond to a fine tuning delay setting relative to a known fine tuning delay setting. As a non-limiting example, for the purpose of simplification of description, the known fine tuning delay setting may be a fine tuning delay setting equal to zero, which corresponds to a fine tuning delay time, $T_{FINE\_TUNING}$, equal to zero. In this case, assuming that the first fine tuning delay setting corresponds to a positive fine tuning delay time, $T_{POSITVE\_FINE\_TUNING}$, and the second fine tuning delay setting corresponds to a negative fine tuning delay time, $T_{NEGATIVE\_FINE\_TUNING}$, the first fine tuning delay setting is set substantially equal to the maximum sensitivity fine tuning delay setting, which corresponds to the first maximum sensitivity fine tuning delay setting, and the second fine tuning delay setting is set substantially equal to the negative of the maximum sensitivity fine tuning delay setting, which corresponds to the second maximum sensitivity fine tuning delay setting.

Accordingly, relative to the known fine tuning delay setting, the first fine tuning delay setting corresponds to a first fine tuning delay time, $T_1$, and the second fine tuning delay setting corresponds to a second fine tuning delay time, $T_2$, wherein $T_1 = -T_2$. In this case, the control signal 48 is delayed more when the fine tuning delay circuit 72 is configured to provide a first fine tuning delay time, $T_1$, corresponding to the first fine tuning delay setting than when the fine tuning delay circuit 72 is configured to provide the second fine tuning delay time, $T_2$, corresponding to the second fine tuning delay setting. In some cases, the maximum sensitivity fine tuning delay setting may be obtained by sweeping the fine tuning delay settings of the fine tuning delay circuit 72 during the configuration process. The sweeping operation may be carried out in a region of fine tuning delay settings previously identified as most likely to correspond to the maximum sensitivity fine tuning delay setting based on a simulation of the open loop envelope tracking system 12 or previously gathered data.

Alternatively, in some embodiments, an initial fine tuning delay referenced to a known starting point may be obtained and used to obtain the first fine tuning delay and the second fine tuning delay. For example, the known starting point may be an initial fine tuning delay setting referenced to a fine tuning delay setting of the fine tuning delay circuit 72 that corresponds to the mid-point fine tuning delay time, $T_{FINE\_TUNING\_CENTER}$. Alternatively, the known starting point may be an initial fine tuning delay setting based on the operational mode of the communication device 10. In this case, the first fine tuning delay setting may be set equal to the initial fine tuning delay plus the maximum sensitivity fine tuning delay setting and the second fine tuning delay setting is set equal to the initial fine tuning delay less the maximum sensitivity fine tuning delay setting. In this case, the first fine tuning delay setting corresponds to a positive fine tuning delay time, $T_{POSITVE\_FINE\_TUNING}$, and the second fine tuning delay setting corresponds to a negative fine tuning delay time, $T_{NEGATIVE\_FINE\_TUNING}$.

Alternatively, the processor 28 or the controller 32 may obtain a fine tuning offset delay setting corresponding to an initial fine tuning offset delay time, $T_{OFFSET\_INITIAL}$, related to the operational mode. Alternatively, the initial fine tuning offset delay setting may be substantially equal to one-half of a maximum fine tuning delay setting of the fine tuning delay circuit 72. In this case, the initial first fine tuning delay setting may be equal to the initial fine tuning offset delay setting plus the maximum fine tuning delay setting and the initial second fine tuning delay setting may be equal to the initial fine tuning delay offset setting less the maximum fine tuning delay setting.

In still other embodiments, the initial fine tuning delay offset setting may be substantially equal to one-half a sum of a maximum fine tuning delay setting plus a minimum fine tuning delay setting. In this case, the initial first fine tuning delay setting may be equal to the initial fine tuning offset delay setting plus the maximum fine tuning delay setting and the initial second fine tuning delay setting may be equal to the initial fine tuning delay offset setting less the maximum fine tuning delay setting. In yet other embodiments, the initial values of the first fine tuning delay setting and the second fine tuning delay setting may near or within a particular range of the respective first maximum sensitivity fine tuning delay setting and the second maximum fine tuning delay setting. As an example, as previously described with respect to FIG. 10, the magnitude of a slope of the measured output power, $P_{MEAS}(T_{FINE\_TUNING})$, has a maximum magnitude near or at the first maximum fine tuning delay setting and the second maximum fine tuning delay setting. However, in some embodiments, the initial values of the first fine tuning delay setting and the second fine tuning delay setting may be set to a fine tuning delay setting where the slope of the measured output power, $P_{MEAS}(T_{FINE\_TUNING})$, is within a range of the maximum slope of the measured output power, $P_{MEAS}(T_{FINE\_TUNING})$. For example, the initial values of the first fine tuning delay setting and the second fine tuning delay setting may be set to fine tuning delay settings where the magnitude of the slope of the measured output power, $P_{MEAS}(T_{FINE\_TUNING})$, is equal to at least equal to one-half the maximum slope. In some embodiments, the initial values of the first fine tuning delay setting and the second fine tuning delay setting may be set to a fine tuning delay settings where the magnitude of the slope of the measured output power, $P_{MEAS}(T_{FINE\_TUNING})$, is equal to at least between 75 percent and 90 percent of the maximum slope. In still other embodiments, the initial values of the first fine tuning delay setting and the second fine tuning delay setting may be set to fine tuning delay settings where the magnitude of the slope of the measured output power, $P_{MEAS}(T_{FINE\_TUNING})$, is equal to at least 90 percent of the maximum slope.

The processor 28 or the controller 32 may configure the envelope tracking digital/analog section 66 to provide a control signal 48 to the envelope tracker power converter 16 based on the test signal and the first fine tuning delay setting. (Step 608) The processor 28 or the controller 32 may configure the gain control, $G_{CONTROL}$, at the gain control interface 44 such that the magnitude of the control signal 48 to be generated has an appropriate amplitude with respect to the modulated signal provided to the radio frequency power amplifier 18. In addition, as a non-limiting example, the processor 28 or the controller 32 may configure the look up table 70 to use one of the one or more tables depending upon at least one or more of a band of operation in which the open loop envelope tracking system 12 is being configured to operate, a power mode of operation of the communication device 10, a spectrum target, and an error vector magnitude target. In addition, the processor 28 or the controller 32 may configure the digital pre-distortion compensation filter (FIR/IIR) 74 to provide a desired pre-distortion filtering. The processor 28 or the controller 32 configure the fine tuning delay circuit 72 to provide a fine tuning delay time, $T_{FINE\_TUNING}$, based on the first fine tuning delay setting. Based on the configuration of the envelope tracking digital/analog section 66, the digital baseband circuit 14 generates a control signal 48, which is provided to the envelope tracker power converter 16. In other words, the control signal 48 is delayed in time by a first fine tuning delay setting time, $T_{FIRST\_DELAY}$, as a function of the fine tuning delay circuit 72 being configured to provide the fine tuning delay time, $T_{FINE\_TUNING}$, based on the first fine tuning delay setting.

Based on the control signal 48, the envelope tracker power converter 16 generates a modulated power amplifier supply voltage 58, $V_{CC}$. (Step 610) The envelope tracker power converter may provide the modulated power amplifier supply voltage 58, $V_{CC}$, to the radio frequency power amplifier 18. (Step 612) In response to the modulated power amplifier supply voltage 58, $V_{CC}$, and the modulated signal 56, $P_{IN}$, the radio frequency power amplifier 18 generates the radio frequency power amplifier output signal 24 at an output of the radio frequency power amplifier 18. The detector 20 measures an output power at the output of the radio frequency power amplifier 18 to obtain a first measured output power. (Step 614) The detector 20 may provide the first measured output power to either the processor 28 or the controller 32. In some embodiments, the processor 28 or the controller 32 may read a register in the detector 20 to obtain the first measured output power. In some embodiments, the detector 20 may be configured to provide an average power of the radio frequency power amplifier output signal 24.

The processor 28 or the controller 32 may configure the fine tuning delay circuit 72 to provide a fine tuning delay time, $T_{FINE\_TUNING}$, based on the second fine tuning delay setting. Thereafter, the digital baseband circuit 14 may provide the control signal 48 to the envelope tracker power converter 16 based on the test signal and the second fine tuning delay setting. (Step 616) As a result, the control signal 48 is delayed in time by a second fine tuning delay setting time, $T_{SECOND\_DELAY}$, as a function of the fine tuning delay circuit 72 being configured to provide the fine tuning delay time, $T_{FINE\_TUNING}$, based on the second fine tuning delay setting.

In response to receiving the control signal 48 generated based on the second fine tuning delay time, the envelope tracker power converter 16 generates the modulated power amplifier supply voltage 58, $V_{CC}$, based on the control signal 48. (Step 618) The envelope tracker power converter 16 may provide the modulated power amplifier supply voltage 58, $V_{CC}$, to the radio frequency power amplifier 18. (Step 620)

In response to the modulated power amplifier supply voltage 58, $V_{CC}$, and the modulated signal 56, $P_{IN}$, the radio frequency power amplifier 18 generates the radio frequency power amplifier output signal 24 at the output of the radio frequency power amplifier 18 as a function of the second fine tuning delay setting. The detector 20 measures the output power at the output of the radio frequency power amplifier 18 to obtain a second measured output power. (Step 622) The detector 20 may provide the second measured output power to either the processor 28 or the controller 32. Similar to before, the processor 28 or the controller 32 may read the register in the detector 20 to obtain the second measured output power. In some embodiments, the detector 20 may be configured to provide an average power of the radio frequency power amplifier output signal 24.

The processor 28 or the controller 32 may be configured to determine whether the first measured output power substantially equals the second measured output power. (Step 624) In the case where the first measured output power is substantially unequal to the second measured output power, (NO), the method 600 continues to Step 626 in order to further adjust at least one of the first fine tuning delay setting and the second fine tuning delay setting until the first measured output power associated with the first fine tuning delay setting is substantially equal to the second measured output power associated with the second fine tuning delay setting. In the case where the first measured output power substantially equals the second measured output power, (YES), the method 600 continues to the Step 628, depicted in FIG. 14C. In the case where the first measured output power substantially equals the second measured output power, the first fine tuning delay setting and the second fine tuning delay setting are located near or at a fine tuning delay setting that corresponds to a maximum sensitivity of the open loop envelope tracking system 12 to a group delay mismatch.

In some embodiments of Step 624, the processor 28 or the controller 32 may be configured to subtract the first measured output power from the second measured output power to obtain a power difference to determine whether the first measured output power substantially equals the second measured output power. In some embodiments, the processor 28 or the controller 32 may compare magnitude of the power difference to a maximum power difference threshold. The maximum power difference threshold may be a parameter that is stored in a memory location or a register associated with the processor 28 or the controller 32. The maximum power difference threshold represents a maximum value of the power difference between the first measured output power and the second measured output power at which a calibrated fine tuning offset delay may be obtained.

For the case where the magnitude of the power difference does not exceed the maximum error threshold, the first measured output power substantially equals the second measured output power and the method 600 continues to the Step 628, depicted in FIG. 14C, to determine a calibrated fine tuning delay offset setting.

However, for the case where the magnitude of the power difference exceeds the maximum error threshold, the first measured output power is substantially unequal to the second measured output power and the method 600 continues to Step 626, depicted in FIG. 14C. The processor 28 or the controller 32 may adjust the fine tuning delay setting of the fine tuning delay circuit 72 of the open loop envelope tracking system 12 to determine values for the first fine tuning delay setting and the second fine tuning delay setting at which the first measured output power substantially equals the second measured output power. (Step 626) In some embodiments, the processor 28 or the controller 32 may adjust either only the first fine tuning delay setting or only the second fine tuning delay setting to determine the first fine tuning delay setting and the second fine tuning delay setting that result in the first measured output power being substantially equal to the second measured output power. Alternatively, in some embodiments, the processor 28 or the controller 32 may adjust both the first fine tuning delay setting and the second fine tuning delay setting to determine values for the first fine tuning delay setting and the second fine tuning delay setting that result in the first measured output power being substantially equal to the second measured output power. Example embodiments for adjusting at least one of the first fine tuning delay setting and the second fine tuning delay setting to determine the first fine tuning delay setting and the second fine tuning delay setting that generate the first measured output power substantially equal to the second output measured power will be described relative to FIGS. 15-18 and FIGS. 19A-B.

Based on the first fine tuning delay setting and the second fine tuning delay setting, the processor 28 or the controller 32 may determine a calibrated fine tuning offset delay setting for fine tuning delay circuit 72. (Step 628) The manner of determining the calibrated offset delay setting may depend on the architecture of the fine tuning delay circuit 72 and/or the process by which the initial first fine tuning delay setting and initial second fine tuning delay setting are obtained. For example, for the case where the first fine tuning delay setting is greater than zero and corresponds to a positive fine tuning delay time, $T_{POSITIVE\_FINE\_TUNING}$, and the second fine tuning delay setting is less than zero and corresponds to a negative fine tuning delay time, $T_{NEGATIVE\_FINE\_TUNING}$, the calibrated fine tuning offset delay setting is substantially equal to one-half of the sum of the first fine tuning delay setting and second fine tuning delay setting. For example, for the case where the final value of the first fine tuning delay setting is equal to +28 and the final value of the second fine tuning delay setting is equal to −32, the calibrated fine tuning offset delay setting is equal to negative two. In some cases, the processor 28 or the controller 32 may be configured such that the second fine tuning delay is a magnitude value. For example, the first fine tuning delay may equal +28 and the second fine tuning delay may be equal to +32. In this case, the calibrated fine tuning offset delay setting is substantially equal to the first fine tuning delay setting less the second fine tuning delay setting.

Alternatively, for the case where the fine tuning delay circuit 72 is configured to have a minimum fine tuning delay and a maximum fine tuning delay, as depicted in FIGS. 12A-C, the initial values for the first fine tuning delay setting and the second fine tuning delay setting may be reference to the minimum fine tuning delay setting. In this case, the calibrated fine tuning offset delay setting may equal one-half the sum of the first fine tuning delay setting and second fine tuning delay setting. For example, for the case where the fine tuning delay circuit 72 has a maximum fine tuning delay setting equal to 100, the second fine tuning delay setting may equal 10 while the first fine tuning delay setting equals 70. In this case, the calibrated fine tuning offset delay setting is equal to 40. In the case where the calculated value of the calibrated fine tuning offset delay setting is not a whole number, the processor 28 or the controller 32 may selective round up or round down the calculated value to obtain the calibrated fine tuning offset delay setting. In some embodiments, the processor 28 or the controller 32 may determine to round up or round down the calculated value based on a previous value of the first fine tuning delay setting or a previous value of the second fine tuning delay setting.

For example, for the case where either only the first fine tuning delay setting or only the second fine tuning delay setting is being adjusted, the processor 28 or the controller 32 may determine whether to round up or round down the calculated value of the calibrated fine tuning offset delay setting based on a direction in which the first fine tuning delay setting or the second fine tuning delay setting is being adjusted. For example, in the case where the first fine tuning delay setting represents a greater fine tuning delay time than the second fine tuning delay setting, if the first fine tuning delay setting was reduced in value to meet the condition that the first measured output power substantially equals the second measured output power, the processor 28 or the controller 32 may round down the calculated value of the calibrated fine tuning offset delay setting. However, if the first fine tuning delay setting was increased in value to meet the condition that the first measured output power substantially equals the second measured output power, the processor 28 or the controller 32 may round up the calculated value of the calibrated fine tuning offset delay setting.

Similarly, if the second fine tuning delay setting represents a fine tuning delay time that is less than the fine tuning delay time represented by the first fine tuning delay setting and the second fine tuning delay time was reduced in value to meet the condition that the first measured output power substantially equals the second measured output power, the processor 28 or the controller 32 may round down the calculated value of the calibrated fine tuning offset delay setting. However, if the second fine tuning delay setting was increased in value to meet the condition that the first measured output power substantially equals the second measured output power, the processor 28 or the controller 32 may round up the calculated value of the calibrated fine tuning offset delay setting.

As yet another alternative embodiment, the processor 28 and the controller 32 may be configured to determine whether to round up or round down the calculated value of the calibrated fine tuning offset delay setting by measuring the impact of effectively rounding up or rounding down the first fine tuning delay setting or the second fine tuning delay setting on the power difference between the first measured output power and the second measured output power.

After determining that the first measured output power substantially equals the second measured output power, the processor 28 or the controller 32 may be configured to obtain a temperature measurement from the envelope tracker power converter 16. (Step 630) As a non-limiting example, the controller 32 may configure the envelope tracker power converter 16 via the front-end control interface 36 to provide an analog temperature measurement to the analog-to-digital converter interface 46. The analog-to-digital converter 60 converts the analog temperature measurement from the envelope tracker power converter 16 into a digital temperature measurement. The digital temperature measurement is a calibrated temperature related to the calibrated fine tuning offset delay setting that may be used to adjust the fine tuning offset delay of the fine tuning delay circuit 72 during normal operation of the open loop envelope tracking system 12.

Similarly, the processor 28 or the controller 32 may be configured to obtain a supply voltage measurement from the envelope tracker power converter 16. (Step 632) As a non-limiting example, the controller 32 may configure the envelope tracker power converter 16 via the front-end control interface 36 to provide an analog supply voltage measurement to the analog-to-digital converter interface 46. The analog-to-digital converter 60 converts the analog supply voltage measurement from the envelope tracker power converter 16 into a digital supply voltage measurement. The digital supply voltage measurement is a calibrated supply voltage related to the calibrated fine tuning offset delay setting that may be used to adjust the fine tuning offset delay of the fine tuning delay circuit 72 during normal operation of the open loop envelope tracking system 12.

Thereafter, in some embodiments of method 600, the processor 28 or the controller 32 store the calibrated fine tuning offset delay setting in association with the calibration temperature and the calibrated supply voltage in the memory of the communication device. (Step 634)

In some embodiments of method 600, the processor 28 or the controller 32 may also determine a calibrated operational mode delay related to the operational mode of the open loop envelope tracking system 12. (Step 636) For example, based on the operational mode of the open loop envelope tracking system 12, the processor 28 or the controller 32 may determine the relative group delay between the modulated power supply voltage, $V_{CC}$, 58 and the modulated signal 56, $F_{IN}$, received by the radio frequency power amplifier 18. Based on the calibrated operation mode delay, the processor 28 or the controller 32 may adjust the fine tuning delay setting of the fine tuning delay circuit 72 depending on the operation mode of the open loop envelope tracking system 12.

In this case, the processor 28 or the controller 32 may store the calibrated operational mode delay related to the operational mode of the open loop envelope tracking system 12 in association with the calibrated fine tuning offset delay setting, the calibrated temperature, and the calibration supply voltage. (Step 638)

Figure 15:
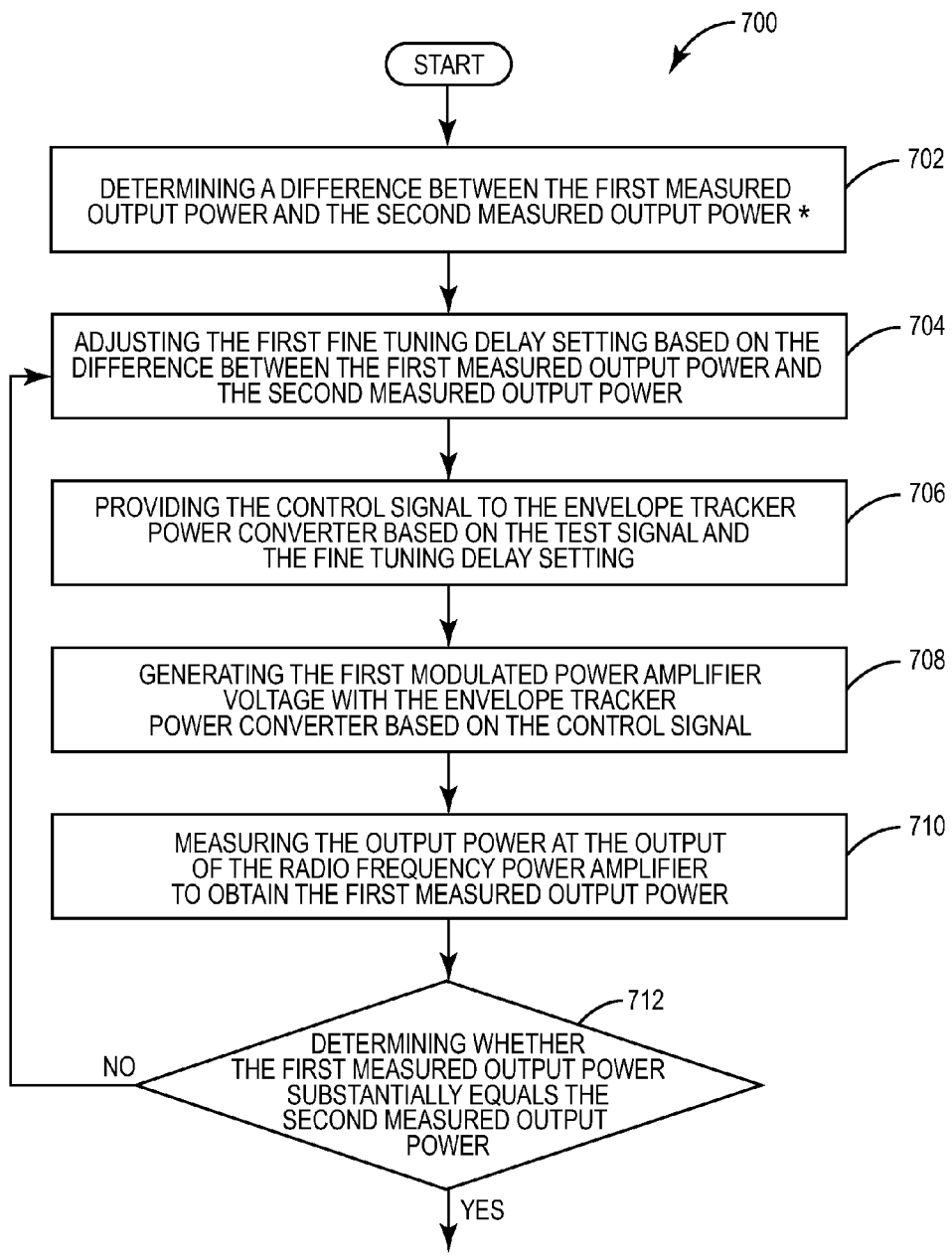
FIG. 15 depicts an embodiment for determining a first fine tuning delay setting and a second fine tuning delay setting such that the first measured output power corresponding to the first fine tuning delay setting substantially equals the second measured output power corresponding to the second fine tuning delay setting by adjusting only one of the first offset delay setting and the second offset delay setting of the fine tuning delay circuit.

FIG. 15 depicts a method 700, which is a non-limiting example embodiment of the Step 626, depicted in FIG. 14C, for determining a calibrated fine tuning delay offset setting for fine tuning delay circuit based on the first fine tuning delay setting and the second fine tuning delay setting. The description of the method 700 will be carried out with continuing reference to FIGS. 1, 2, 9-11, FIGS. 12A-C, FIGS. 13A-C, and FIGS. 14A-C. In addition, the calibration of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

The method 700 describes a technique for determining the first fine tuning delay setting and the second fine tuning delay setting that result in the first measured output power being substantially equal to the second measured output power by adjusting only the first fine tuning delay setting or only the second fine tuning delay setting. The selection of whether to adjust only the first fine tuning delay setting or only the second fine tuning delay setting may be predetermined. For example, as a non-limiting example, FIG. 15 depicts an embodiment of the method 700 where only the first fine tuning delay setting is adjusted until the first measured output power associated with the first fine tuning delay setting is substantially equal to the second measured output power associated with the second fine tuning delay setting. In other embodiments of the method 700, only the second fine tuning delay setting is adjusted until the first measured output power associated with the first fine tuning delay setting is substantially equal to the second measured output power associated with the second fine tuning delay setting.

As a non-limiting example, the processor 28 or the controller 32 may determine a difference between the first measured output power and the second measured output power. (Step 702) In some embodiments, the processor 28 or the controller 32 may be configured to use the power difference calculated in the Step 624 to determine the difference between the first measured output power and the second measured output power. In this case, the Step 702 may be eliminated.

Based on the power difference, the processor 28 or the controller 32 may adjust the first fine tuning delay setting. (Step 704) As a non-limiting example, in order to simplify the description of the adjustment process, the first fine tuning delay setting corresponds to a first fine tuning delay setting time, $T_{FIRST\_DELAY}$, which is assumed to be greater than a second fine tuning delay setting time, $T_{SECOND\_DELAY}$. The processor 28 or controller 32 may either increment or decrement the first fine tuning delay setting by a fine tuning delay setting step size to reduce the difference between the first measured output power and the second measured output power. The fine tuning delay setting step size may be configured by the processor 28 or controller 32 dependent upon the magnitude of the power difference. As the magnitude of the power difference is reduced, the processor 28 or controller 32 may reduce the fine tuning delay setting step size. Alternatively, in some embodiments, the fine tuning delay step size is equal to a minimum fine tuning delay setting step size. In this case, the processor 28 or controller 32 may increment or decrement the first fine tuning delay setting by a value of one. If the power difference is greater than zero, the second measured output power is greater than the first measured output power. Accordingly, because the first fine tuning delay setting time, $T_{FIRST\_DELAY}$, is assumed to be greater than the second fine tuning delay setting time, $T_{SECOND\_DELAY}$, the processor 28 or the controller 32 reduces the value of the first fine tuning delay setting. If the power difference is less than zero, the second measured output power is less than the first measured output power. As a result, the processor 28 or controller 32 increases the first fine tuning delay setting. As depicted in FIG. 9, based on the above assumption, decreasing the first fine tuning delay setting will reduce the first fine tuning delay setting time, $T_{FIRST\_DELAY}$, which will increase the first measured output power. In addition, increasing the first fine tuning delay setting will decrease the first fine tuning delay setting.

Alternatively, if the first fine tuning delay setting time, $T_{FIRST\_DELAY}$, is assumed to be less than the second fine tuning delay setting time, $T_{SECOND\_DELAY}$, the processor 28 or controller 32 would decrease the first fine tuning delay setting in the case where the power difference is less than zero and increase the first fine tuning delay setting in the case where the power difference is greater than zero.

The processor 28 or controller 32 may configure the fine tuning delay circuit 72 to provide a fine tuning delay, $T_{FINE\_TUNING}$, based on the adjusted value of the first fine tuning delay setting. Based on the updated value of the first fine tuning delay setting and the test signal, the digital baseband circuit 14 provides the control signal 48 to the envelope tracker power converter 16. (Step 706) In response to the control signal 48, the envelope tracker power converter 16 generates the modulated power amplifier supply voltage 58, $V_{CC}$. (Step 708)

In response to the modulated power amplifier supply voltage 58, $V_{CC}$, and the modulated signal 56, $P_{IN}$, the radio frequency power amplifier 18 generates the radio frequency power amplifier output signal 24 at an output of the radio frequency power amplifier 18. The detector 20 measures the output power at the output of the radio frequency power amplifier 18 to obtain the first measured output power based on the adjusted first fine tuning delay setting. (Step 710)

Thereafter, the processor 28 or controller 32 may be configured to determine whether the first measured output power substantially equals the second measured output power. (Step 712) In the case where the first measured output power is substantially unequal to the second measured output power, (NO), the method 700 returns to Step 704 to further adjust the first fine tuning delay setting. In the case where the first measured output power substantially equals the second measured output power, (YES), the method 700 is substantially complete. As a result, referring to FIG. 14C, after completion of the method 700, method 600 continues to the Step 628.

In some embodiments of the Step 712, the processor 28 or the controller 32 may be configured to subtract the first measured output power from the second measured output power to obtain a power difference to determine whether the first measured output power substantially equals the second measured output power. In some embodiments, the processor 28 or the controller 32 may compare the magnitude of the power difference to the maximum power difference threshold. For the case where the magnitude of the power difference does not exceed the maximum power difference threshold, the first measured output power substantially equals the second measured output power. However, for the case where the magnitude of the power difference exceeds the maximum power difference threshold, the first measured output power is substantially unequal to the second measured output power.

In addition, some embodiments of the Step 712 of the method 700 may use different techniques to determine whether the first measured output power is substantially equal to the second measured output power. In other embodiments of the Step 712 of the method 700, the processor 28 or the controller 32 may determine whether the power difference between the first measured output power and the second measured output power is minimized to determine whether the first measured output power substantially equals the second measured output power. In some embodiments, the processor 28 or the controller 32 may compare the previously calculated power difference to the current power difference to determine whether the present power difference associated with the present value of the first fine tuning delay setting is a minimum power difference.

As an example, the processor 28 or the controller 32 may determine whether the sign (+/−) of the previously calculated power difference is the same as the sign (+/−) of the present power difference. In some embodiments, the processor 28 or the controller 32 may retrieve the previously calculated power difference from a memory location or a register location. Alternatively, the processor 28 or the controller 32 may retrieve the previous value of the first measured output power to determine the previously calculated power difference. In the case where the sign (+/−) of the previously calculated power difference is different from the sign (+/−) of the present power difference, the processor 28 or controller 32 may determine whether the magnitude of the previously calculated power difference is greater than the magnitude of the present power difference. In the case where the processor 28 or the controller 32 determine that the magnitude of the present power difference is less than the magnitude of the previous power difference, the present value of the first fine tuning delay setting corresponds to the minimum power difference. However, in the case where the processor 28 or the controller 32 determine that the magnitude of the present power difference is greater than the magnitude of the previous power difference, the present value of the first fine tuning delay setting does not correspond to the minimum power difference. Instead, the previous value of the first fine tuning delay setting corresponds to the minimum power difference. Based on the determination that the previous value of the first fine tuning delay setting corresponds to the minimum power difference, the processor 28 or the controller 32 may set the first fine tuning delay setting equal to the previous value of the fine tuning delay setting.

As yet another alternative embodiment of the Step 712 of the method 700, the processor 28 and the controller 32 may determine that the first measured output power and the second measured output power are substantially equal based on the determination that the sign (+/−) of the previously calculated power difference is different from the sign (+/−) of the present power difference. Upon determination that the sign (+/−) of the previously calculated power difference is different from the sign (+/−) of the present power difference, the processor 28 or controller 32 determines that first measured output power is substantially equal to the second measured output power.

Figure 16:
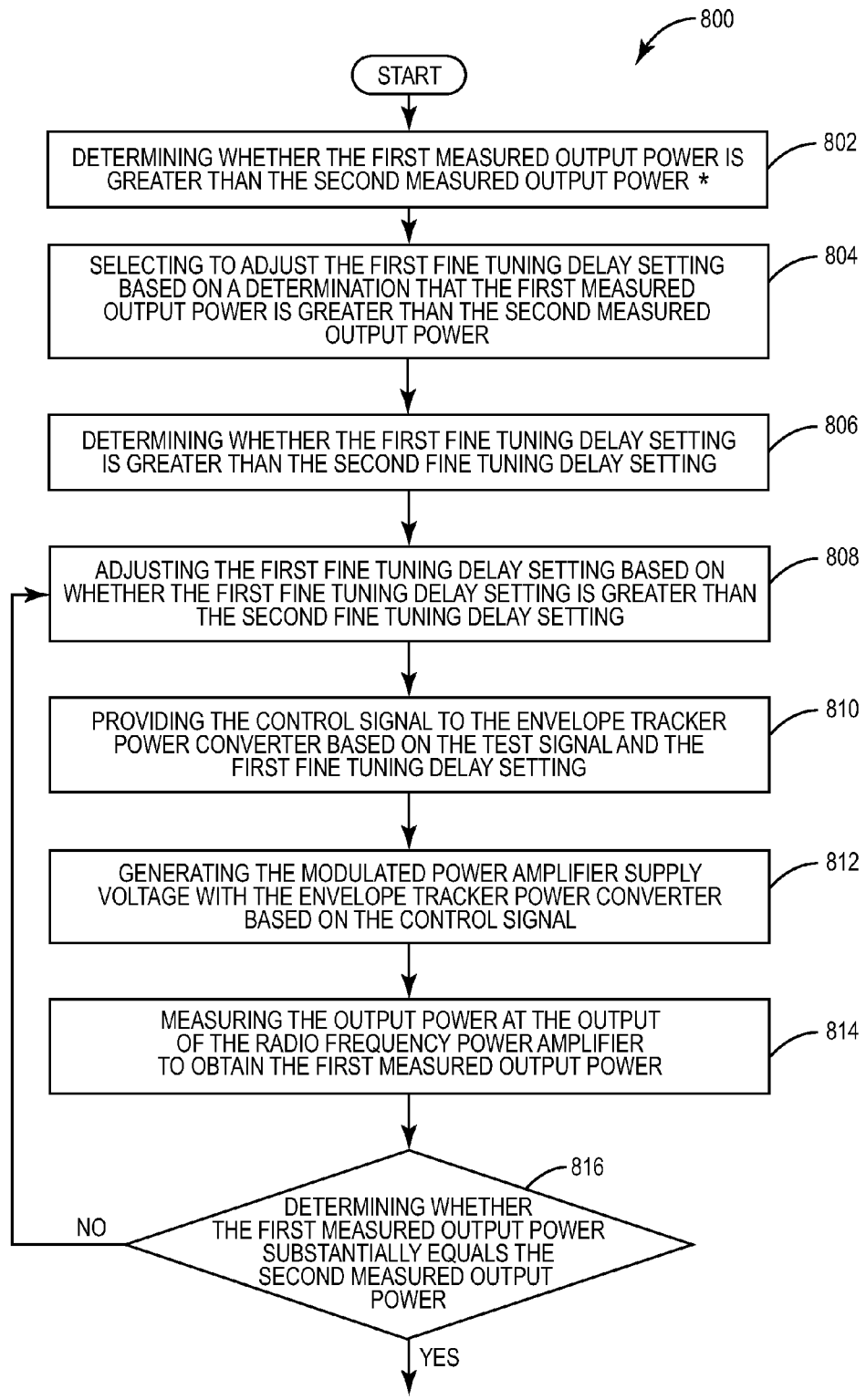
FIG. 16 depicts an embodiment for determining a first fine tuning delay setting and a second fine tuning delay setting such that the first measured output power corresponding to the first fine tuning delay setting substantially equals the second measured output power corresponding to the second fine tuning delay setting by adjusting a one of the first offset delay setting and the second offset delay setting that corresponds to a maximum measured output power.

FIG. 16 depicts a method 800, which is another non-limiting example embodiment of the Step 626, depicted in FIG. 14C, for determining a calibrated fine tuning delay offset setting for the fine tuning delay circuit 72 based on the first fine tuning delay setting and the second fine tuning delay setting. The description of the method 800 will be carried out with continuing reference to FIGS. 1, 2, 9-11, FIGS. 12A-C, FIGS. 13A-C, and FIGS. 14A-C. In addition, the calibration of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

The method 800 describes an embodiment for selecting to adjust only the first fine tuning delay setting or the second fine tuning delay setting based on the first measured output power and the second measured output power. In some embodiments of method 800, the processor 28 or controller 32 may be configured to adjust the one of the first fine tuning delay setting and the second fine tuning delay setting that causes the output power at the output of the radio frequency power amplifier 18 to have the greatest magnitude. For example, in this case, if the first measured output power is greater than the second measured output power, the processor 28 or controller 32 may be configured to adjust only the first fine tuning delay setting until the first measured output power associated with the first fine tuning delay setting is substantially equal to the second measured output power associated with the second fine tuning delay setting. As an alternative example, in some embodiments of method 800, the processor 28 or controller 32 may be configured to adjust the one of the first fine tuning delay setting and the second fine tuning delay setting that causes the output power at the output of the radio frequency power amplifier 18 to have the least magnitude. For example, in this case, if the first measured output power is greater than the second measured output power, the processor 28 or controller 32 may be configured to adjust only the second fine tuning delay setting until the first measured output power associated with the first fine tuning delay setting is substantially equal to the second measured output power associated with the second fine tuning delay setting. For the sake of simplicity, and not by way of limitation, FIG. 16 depicts the case where the first fine tuning delay setting is adjusted.

As a non-limiting example, the processor 28 or the controller 32 may determine whether the first measured output power is greater than the second measured output power. (Step 802) In some embodiments, the processor 28 or the controller 32 may be configured to use the power difference calculated in the Step 624 to determine whether the first measured output power is greater than the second measured output power. For example, in the case where the power difference is greater than zero, the second measured output power is greater than the first measured output power. However, in the case where the power difference is less than zero, the first measured output power is greater than the second measured output power.

Thereafter, the processor 28 or controller 32 may be configured to adjust the one of the first fine tuning delay setting and the second fine tuning delay setting that generates the highest output power at the output of the radio frequency power amplifier 18. As a non-limiting example, for the sake of simplicity of description and not by way of limitation, the processor 28 or controller 32 may select to adjust the first fine tuning delay setting based on a determination that the first measured output power is greater than the second measured output power. (Step 804) In some embodiments of the method 800, the processor 28 or controller 32 may be configured for a general case where it is not known a priori whether the first fine tuning delay setting is greater than the second fine tuning delay setting. In this case, the processor 28 or the controller 32 may determine whether the first fine tuning delay setting is greater than the second fine tuning delay setting. (Step 806)

Similar to Step 704 of method 700, depicted in FIG. 15, the processor 28 or the controller 32 may adjust the first fine tuning delay setting based on whether the first fine tuning delay setting is greater than the second fine tuning delay setting. (Step 808) For the case where the first fine tuning delay setting is greater than the second fine tuning delay setting, the processor 28 or controller 32 will increase the value of the first fine tuning delay setting to obtain a decrease in the first measured output power. Alternatively, for the case where the first fine tuning delay setting is less than the second fine tuning delay setting, the processor 28 or controller 32 will decrease the value of the first fine tuning delay setting to obtain a decrease in the first measured output power. The processor 28 or controller 32 may be configured to increase or decrease the value of the first fine tuning delay setting in a manner similar to that described above with respect to the method 700 of FIG. 15. Accordingly, details of the adjusting process are omitted here.

The processor 28 or controller 32 may configure the fine tuning delay circuit 72 to provide a fine tuning delay, $T_{FINE\_TUNING}$, based on the adjusted value of the first fine tuning delay setting. Based on the updated value of the first fine tuning delay setting and the test signal, the digital baseband circuit 14 provides the control signal 48 to the envelope tracker power converter 16. (Step 810) In response to the control signal 48, the envelope tracker power converter 16 generates the modulated power amplifier supply voltage 58, $V_{CC}$. (Step 812)

In response to the modulated power amplifier supply voltage 58, $V_{CC}$, and the modulated signal 56, $P_{IN}$, the radio frequency power amplifier 18 generates the radio frequency power amplifier output signal 24 at the output of the radio frequency power amplifier 18. The detector 20 measures the output power at the output of the radio frequency power amplifier 18 to obtain the first measured output power based on the adjusted first fine tuning delay setting. (Step 814)

Thereafter, the processor 28 or controller 32 may be configured to determine whether the first measured output power substantially equals the second measured output power. (Step 816) As a non-limiting example, the various embodiments of the Step 816 may employ the techniques previously described with respect to the Step 712 of the method 700, depicted in FIG. 15, to determine whether the first measured output power substantially equals the second measured output power. Accordingly, the details of the previously described techniques to determine whether the first measured output power substantially equals the second measured output power are omitted here for the sake of brevity.

In the case where the first measured output power is substantially unequal to the second measured output power, (NO), the method 800 returns to the Step 808 to further adjust the first fine tuning delay setting. In the case where the first measured output power substantially equals the second measured output power, (YES), the method 800 is substantially complete. As a result, referring to FIG. 14C, after completion of the method 800, the method 600 continues to the Step 628.

Figure 17:
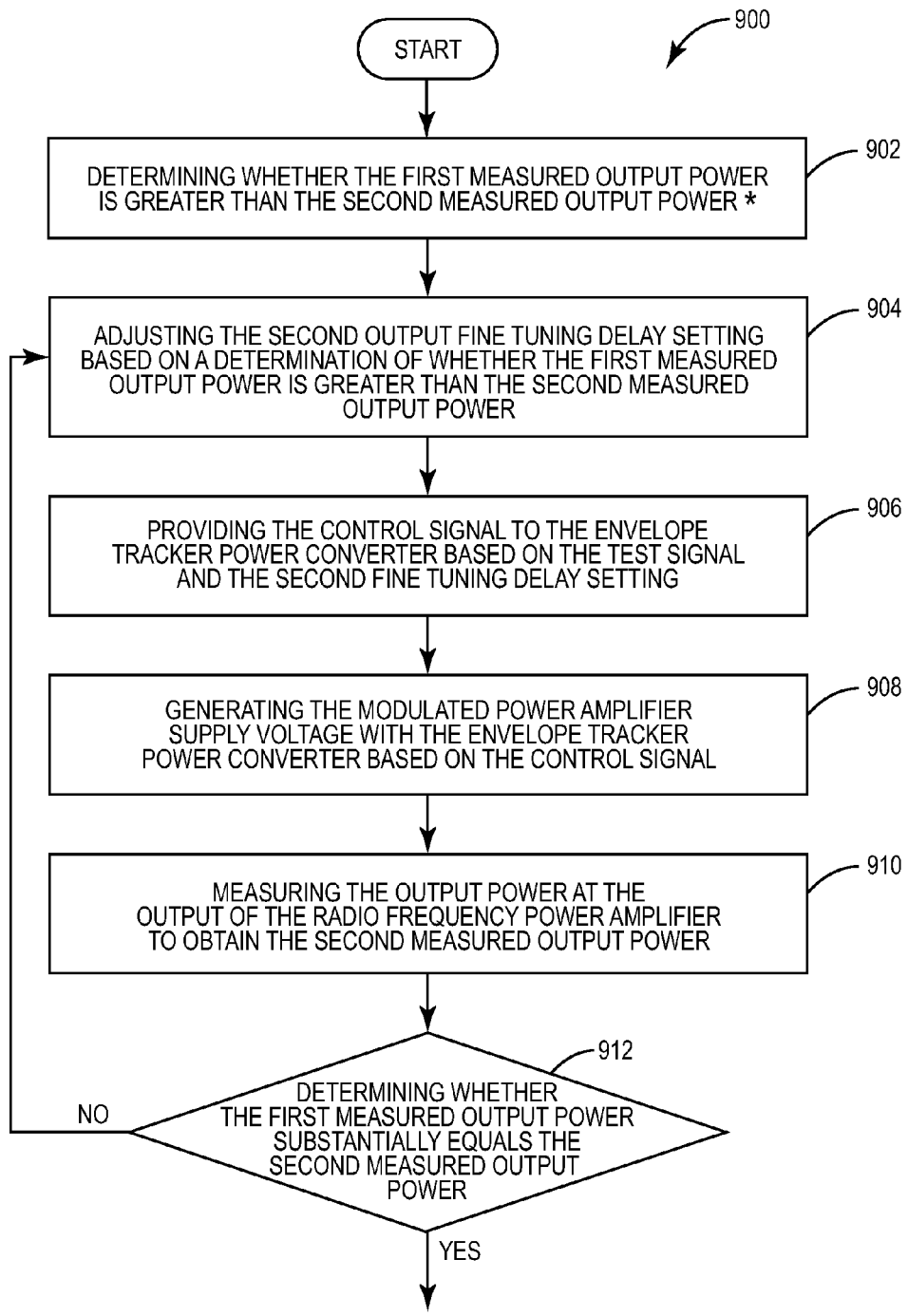
FIG. 17 depicts an embodiment for determining a first fine tuning delay setting and a second fine tuning delay setting such that the first measured output power corresponding to the first fine tuning delay setting substantially equals the second measured output power corresponding to the second fine tuning delay setting by adjusting a one of the first offset delay setting and the second offset delay setting that corresponds to a first tuning delay time that provides the least delay until the first measured output power substantially equals the second measured output power.

FIG. 17 depicts a method 900, which is a non-limiting example embodiment of the Step 626, depicted in FIG. 14C, for determining a calibrated fine tuning delay offset setting for the fine tuning delay circuit 72 based on the first fine tuning delay setting and the second fine tuning delay setting. The description of the method 900 will be carried out with continuing reference to FIGS. 1, 2, 9-11, FIGS. 12A-C, FIGS. 13A-C, and FIGS. 14A-C. In addition, the calibration of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

As depicted in FIG. 17, the method 900 determines the first fine tuning delay setting and the second fine tuning delay setting such that the first measured output power substantially equals the second measured output power by adjusting the only one of the first fine tuning delay setting and the second fine tuning delay setting that corresponds to a minimum delay time. For example, in the case where the fine tuning delay circuit 72 is configured to have a first fine tuning delay setting greater than zero, which corresponds to a positive fine tuning delay time, $T_{POSITIVE\_FINE\_TUNING}$, and a second fine tuning delay setting is less than zero, which corresponds to a negative fine tuning delay time, $T_{NEGATIVE\_FINE\_TUNING}$, the method 900 only adjusts the second fine tuning delay setting. For the sake of brevity, and not by way of limitation, FIG. 17 depicts method 900 based on an a priori knowledge that the second fine tuning delay setting is less than the first fine tuning delay setting.

As a non-limiting example, the processor 28 or the controller 32 may determine whether the first measured output power is greater than the second measured output power. (Step 902) In some embodiments, the processor 28 or the controller 32 may be configured to use the power difference calculated in the Step 624 to determine whether the first measured output power is greater than the second measured output power, as described above.

Thereafter, the processor 28 or controller 32 may be configured to adjust the second fine tuning delay setting based on a determination of whether the first measured output power is greater than the second measured output power. (Step 904) In the case where the power difference is greater than zero, the processor 28 and the controller 32 may decrease the second fine tuning delay setting so as to reduce the second fine tuning delay setting time, $T_{SECOND\_DELAY}$. In the case where the second fine tuning delay setting corresponds to a negative fine tuning delay time, $T_{NEGATIVE\_FINE\_TUNING}$, the processor 28 or controller 32 may decrease the value of the second fine tuning delay setting such that the magnitude of the second fine tuning delay setting increases, which reduces the second fine tuning delay setting time, $T_{SECOND\_DELAY}$.

Alternatively, in the case where the power difference is less than zero, the processor 28 and the controller 32 may increase the second fine tuning delay setting so as to increase the second fine tuning delay setting time, $T_{SECOND\_DELAY}$. In the case where the second fine tuning delay setting corresponds to the negative fine tuning delay time, $T_{NEGATIVE\_FINE\_TUNING}$, the processor 28 or controller 32 may increase the value of the second fine tuning delay setting such that the magnitude of the second fine tuning delay is reduces, which increases the second fine tuning delay setting time, $T_{SECOND\_DELAY}$. As previously described, the processor 28 or controller 32 may be configured to increase or decrease the value of the second fine tuning delay setting in a manner similar to that described above with respect to increasing and decreasing the value of the first fine tuning delay setting, as described with respect to the method 700 of FIG. 15. Accordingly, details of the adjusting process are omitted here.

Thereafter, the processor 28 or controller 32 may configure the fine tuning delay circuit 72 to provide a fine tuning delay, $T_{FINE\_TUNING}$, based on the adjusted value of the second fine tuning delay setting. Based on the updated value of the second fine tuning delay setting and the test signal, the digital baseband circuit 14 provides the control signal 48 to the envelope tracker power converter 16. (Step 906) In response to the control signal 48, the envelope tracker power converter 16 generates the modulated power amplifier supply voltage 58, $V_{CC}$. (Step 908)

In response to the modulated power amplifier supply voltage 58, $V_{CC}$, and the modulated signal 56, $P_{IN}$, the radio frequency power amplifier 18 generates the radio frequency power amplifier output signal 24 at an output of the radio frequency power amplifier 18. The detector 20 measures the output power at the output of the radio frequency power amplifier 18 to obtain the second measured output power based on the adjusted value of the second fine tuning delay setting. (Step 910)

Thereafter, the processor 28 or controller 32 may be configured to determine whether the first measured output power substantially equals the second measured output power. (Step 912) As a non-limiting example, the various embodiments of Step 912 may employ the techniques previously described with respect to Step 712 of method 700, depicted in FIG. 15, to determine whether the first measured output power substantially equals the second measured output power. Accordingly, the details of the previously described techniques to determine whether the first measured output power substantially equals the second measured output power are omitted here for the sake of brevity.

In the case where the first measured output power is substantially unequal to the second measured output power, (NO), the method 900 returns to the Step 904 to further adjust the second fine tuning delay setting. In the case where the first measured output power substantially equals the second measured output power, (YES), the method 900 is substantially complete. As a result, referring to FIG. 14C, after completion of the method 900, the method 600 continues to the Step 628.

Figure 18:
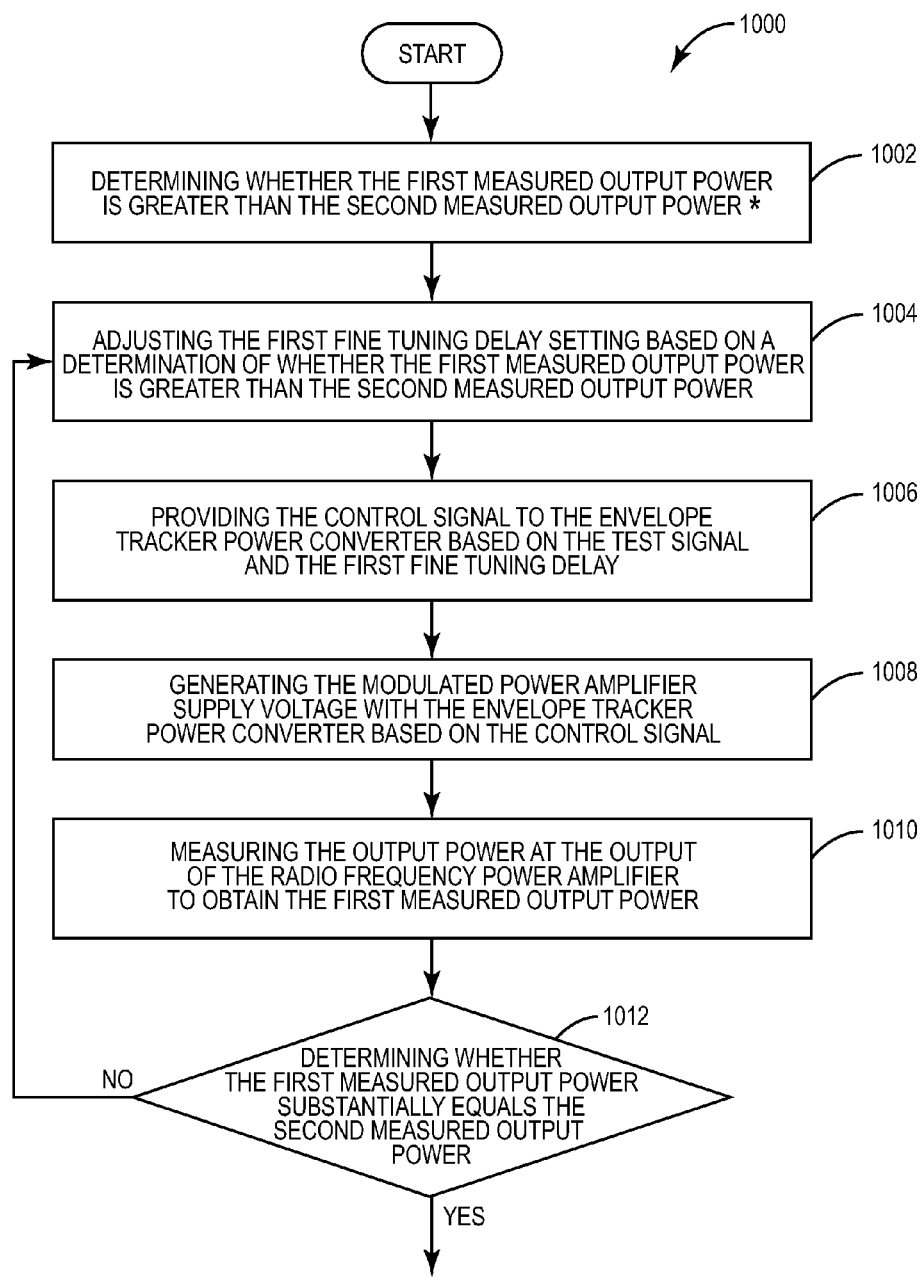
FIG. 18 depicts an embodiment for determining a first fine tuning delay setting and a second fine tuning delay setting such that the first measured output power corresponding to the first fine tuning delay setting substantially equals the second measured output power corresponding to the second fine tuning delay setting by adjusting a one of the first offset delay setting and the second offset delay setting that corresponds to a fine tuning delay time that provides the greatest delay.

FIG. 18 depicts a method 1000, which is still another non-limiting example embodiment of the Step 626, depicted in FIG. 14C, for determining a calibrated fine tuning delay offset setting for the fine tuning delay circuit 72 based on the first fine tuning delay setting and the second fine tuning delay setting. The description of the method 1000 will be carried out with continuing reference to FIGS. 1, 2, 9-11, FIGS. 12A-C, FIGS. 13A-C, and FIGS. 14A-C. In addition, the calibration of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

The method 1000, depicted in FIG. 18, is similar to the method 900, depicted in FIG. 17, except the method 1000 determines the first fine tuning delay setting and the second fine tuning delay setting such that the first measured output power substantially equals the second measured output power by adjusting only one of the first fine tuning delay setting and the second fine tuning delay setting that corresponds to a maximum delay time. For example, in the case where the fine tuning delay circuit 72 is configured to have a first fine tuning delay setting greater than zero, which corresponds to a positive fine tuning delay time, $T_{POSITIVE\_FINE\_TUNING}$, and a second fine tuning delay setting less than zero, which corresponds to a negative fine tuning delay time, $T_{NEGATIVE\_FINE\_TUNING}$, the method 1000 only adjusts the first fine tuning delay setting. For the sake of brevity, and not by way of limitation, FIG. 18 depicts the method 1000 based on an a priori knowledge that the first fine tuning delay setting is greater than the first fine tuning delay setting.

As a non-limiting example, the processor 28 or the controller 32 may determine whether the first measured output power is greater than the second measured output power. (Step 1002) In some embodiments, the processor 28 or the controller 32 may be configured to use the power difference calculated in the Step 624 to determine whether the first measured output power is greater than the second measured output power, as described above.

Thereafter, the processor 28 or controller 32 may be configured to adjust the first fine tuning delay setting based on a determination of whether the first measured output power is greater than the second measured output power. (Step 1004) In the case where the power difference is greater than zero, the first measured output power is less than the second measured output power. In this case, the processor 28 and the controller 32 may decrease the first fine tuning delay setting so as to decrease the first fine tuning delay setting time, $T_{FIRST\_DELAY}$, which tends to increase the first measured output power. In the case where the first fine tuning delay setting corresponds to a positive fine tuning delay time, $T_{POSITVE\_FINE\_TUNING}$, the processor 28 or controller 32 may decrease the value of the first fine tuning delay setting such that the first fine tuning delay becomes less in magnitude.

Alternatively, in the case where the power difference is less than zero, the first measured output power is greater than the second measured output power. In this case, the processor 28 and the controller 32 may increase the first fine tuning delay setting so as to increase the first fine tuning delay setting time, $T_{FIRST\_DELAY}$. In the case where the first fine tuning delay setting corresponds to a positive fine tuning delay time, $T_{POSITIVE\_FINE\_TUNING}$, the processor 28 or controller 32 may increase the value of the first fine tuning delay setting such that the first fine tuning delay setting increases in magnitude. The processor 28 or controller 32 may be configured to increase or decrease the value of the first fine tuning delay setting in a manner similar to that described above with respect to the method 700 of FIG. 15. Accordingly, details of the adjusting process are omitted here.

Thereafter, the processor 28 or controller 32 may configure the fine tuning delay circuit 72 to provide a fine tuning delay, $T_{FINE\_TUNING}$, based on the adjusted value of the first fine tuning delay setting. Based on the updated value of the first fine tuning delay setting and the test signal, the digital baseband circuit 14 provides the control signal 48 to the envelope tracker power converter 16. (Step 1006) In response to the control signal 48, the envelope tracker power converter 16 generates the modulated power amplifier supply voltage 58, $V_{CC}$. (Step 1008)

In response to the modulated power amplifier supply voltage 58, $V_{CC}$, and the modulated signal 56, $P_{IN}$, the radio frequency power amplifier 18 generates the radio frequency power amplifier output signal 24 at an output of the radio frequency power amplifier 18. The detector 20 measures the output power at the output of the radio frequency power amplifier 18 to obtain the first measured output power based on the adjusted value of the first fine tuning delay setting. (Step 1010)

Thereafter, the processor 28 or controller 32 may be configured to determine whether the first measured output power substantially equals the second measured output power. (Step 1012) As a non-limiting example, the various embodiments of Step 1012 may employ the techniques previously described with respect to Step 712 of method 700, depicted in FIG. 15, to determine whether the first measured output power substantially equals the second measured output power. Accordingly, the details of the previously described techniques to determine whether the first measured output power substantially equals the second measured output power are omitted here for the sake of brevity.

In the case where the first measured output power is substantially unequal to the second measured output power, (NO), the method 1000 returns to the Step 1004 to further adjust the second fine tuning delay setting. In the case where the first measured output power substantially equals the second measured output power, (YES), the method 1000 is substantially complete. As a result, referring to FIG. 14C, after completion of the method 1000, the method 600 continues to the Step 628.

Figure 19A:
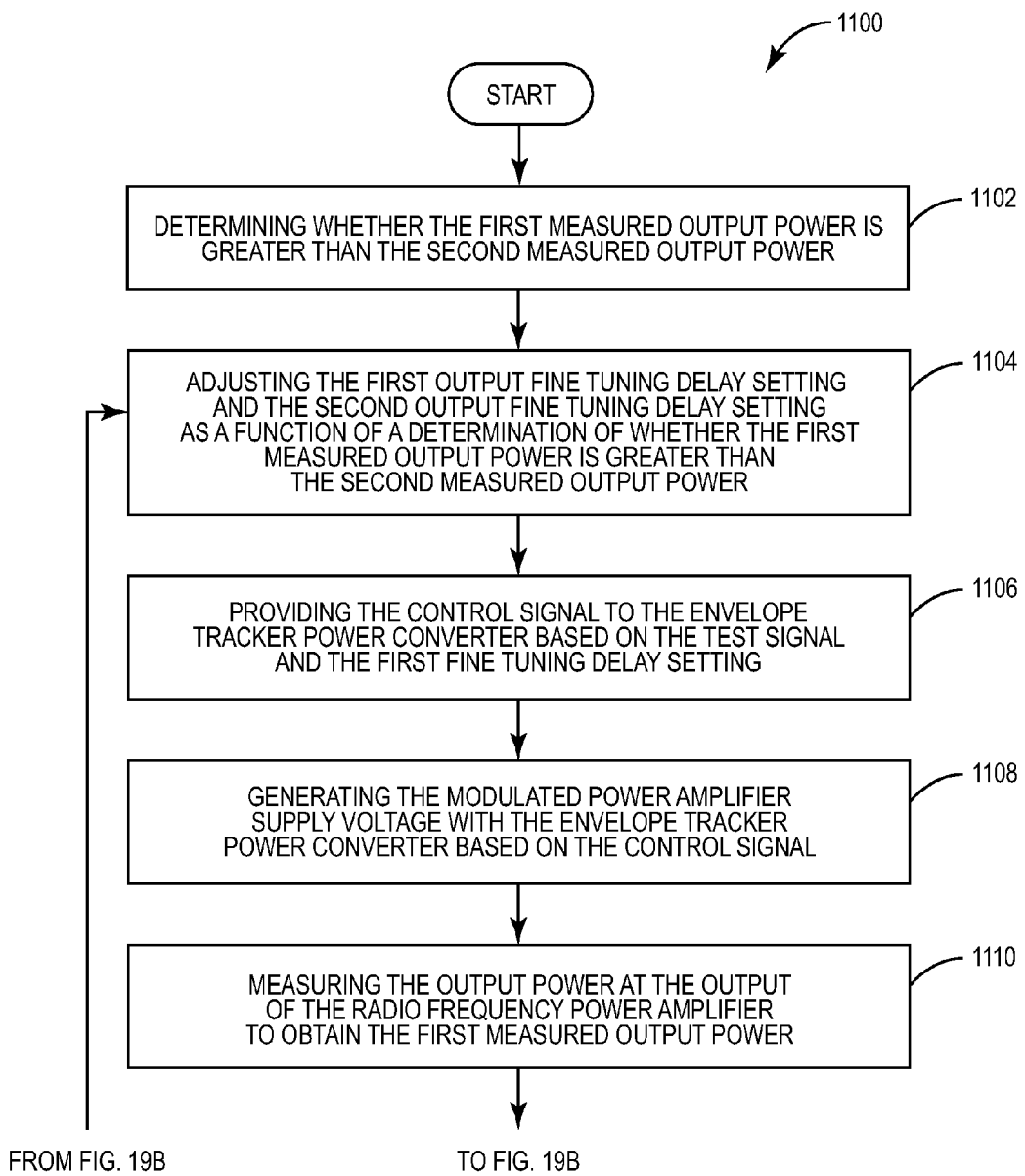
FIG. 19A and FIG. 19B depict an embodiment for determining a first fine tuning delay setting and a second fine tuning delay setting such that the first measured output power corresponding to the first fine tuning delay setting substantially equals the second measured output power corresponding to the second fine tuning delay setting by adjusting both the first offset delay and the second offset delay.
Figure 19B:
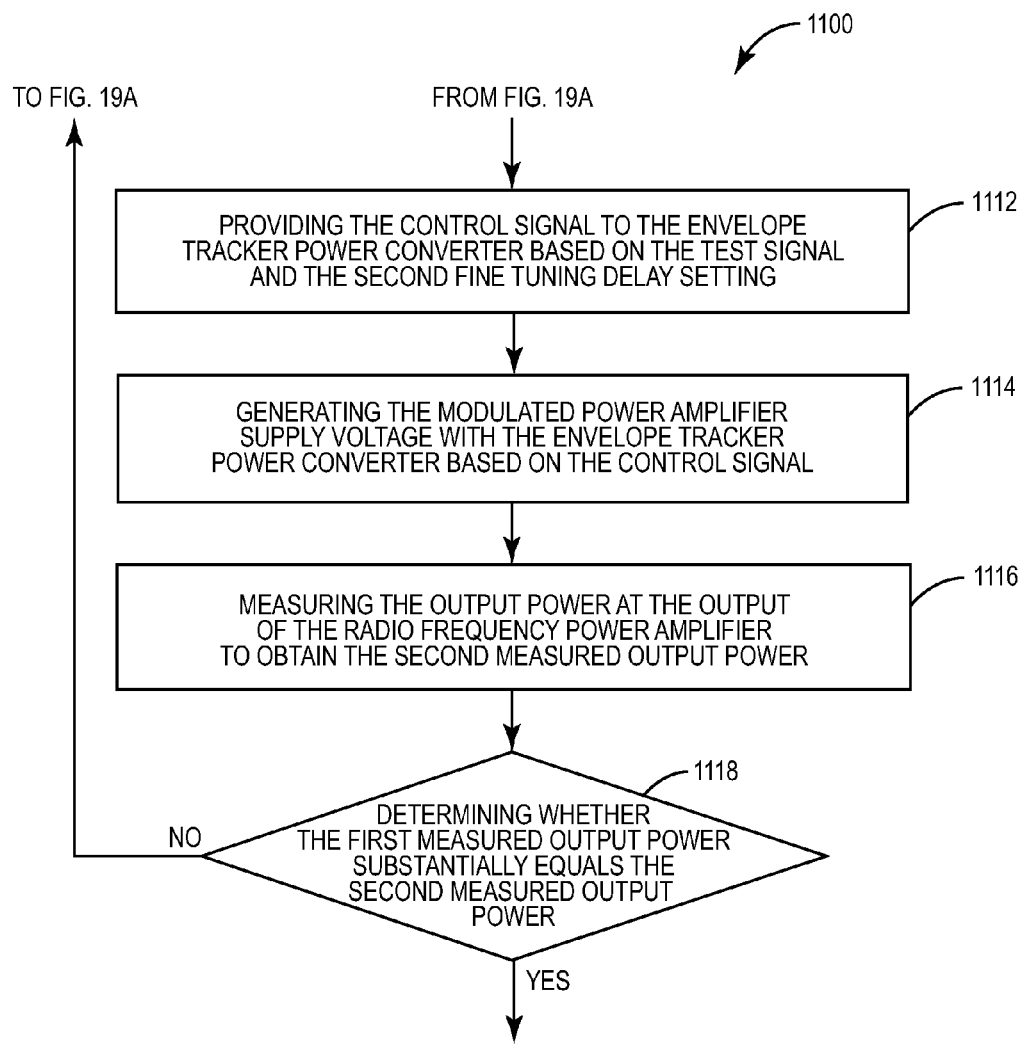

FIG. 19A and FIG. 19B depict a method 1100, which is yet another non-limiting example embodiment of the Step 626, depicted in FIG. 14C, for determining a calibrated fine tuning delay offset setting for fine tuning delay circuit based on the first fine tuning delay setting and the second fine tuning delay setting. The description of the method 1100 will be carried out with continuing reference to FIGS. 1, 2, 9-11, FIGS. 12A-C, FIGS. 13A-C, and FIGS. 14A-C. In addition, the calibration of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

The method 1100 determines a first fine tuning delay setting and a second fine tuning delay setting such that the first measured output power associated with the first fine tuning delay setting and the second output power associated with the second fine tuning delay setting are substantially equal by adjusting both the first fine tuning delay setting and the second fine tuning delay setting. The non-limiting example embodiment of method 1100 depicted in FIG. 19A and FIG. 19B is based on an a priori knowledge that the first fine tuning delay setting corresponds to a first fine tuning delay setting time, $T_{FIRST\_DELAY}$, and the second fine tuning delay setting corresponds to a second fine tuning delay setting time, $T_{SECOND\_DELAY}$, where the first fine tuning delay setting time, $T_{FIRST\_DELAY}$, is greater than the second fine tuning delay setting time, $T_{SECOND\_DELAY}$.

As a non-limiting example, the processor 28 or the controller 32 may determine whether the first measured output power is greater than the second measured output power. (Step 1102) In some embodiments, the processor 28 or the controller 32 may be configured to use the power difference calculated in the Step 624 to determine the whether the first measured output power is greater than the second measured output power. For example, in the case where the power difference is greater than zero, the second measured output power is greater than the second measured output power. However, in the case where the power difference is less than zero, the first measured output power is greater than the second measured output power.

Thereafter, the processor 28 or the controller 32 may be configured to adjust the first output fine tuning delay setting and the second output fine tuning delay setting as a function of a determination of whether the first measured output power is greater than the second measured output power. (Step 1104) For example, in the case where the power difference indicates that the first measured output power is greater than the second measured output power, the processor 28 or the controller 32 may adjust the first fine tuning delay setting and the second fine tuning delay setting to increase the first fine tuning delay setting time, $T_{FIRST\_DELAY}$, and the second fine tuning delay setting time, $T_{SECOND\_DELAY}$. As an example, the processor 28 or the controller 32 may increment both the first fine tuning delay setting and the second fine tuning delay setting by a fine tuning delay setting step size. In the case where the fine tuning delay circuit 72 is configured to have a positive fine tuning delay setting and a negative fine tuning delay setting corresponding respectively to a positive fine tuning delay time, $T_{POSITIVE\_FINE\_TUNING}$, and a negative fine tuning delay time, $T_{NEGATIVE\_FINE\_TUNING}$, the processor 28 and the controller 32 may be configured to decrease the magnitude of the negative fine tuning delay setting and increase the magnitude of the positive fine tuning delay setting.

Alternatively, in the case where the power difference indicates that the first measured output power is less than the second measured output power, the processor 28 or the controller 32 may adjust the first fine tuning delay setting and the second fine tuning delay setting to decrease the first fine tuning delay setting time, $T_{FIRST\_DELAY}$, and the second fine tuning delay setting time, $T_{SECOND\_DELAY}$. As an example, the processor 28 or the controller 32 may decrement both the first fine tuning delay setting and the second fine tuning delay setting by a fine tuning delay setting step size. In the case where the fine tuning delay circuit 72 is configured to have a positive fine tuning delay setting and a negative fine tuning delay setting corresponding respectively to a positive fine tuning delay time, $T_{POSITIVE\_FINE\_TUNING}$, and a negative fine tuning delay time, $T_{-NEGATIVE\_FINE\_TUNING}$, the processor 28 and the controller 32 may be configured to increase the magnitude of the negative fine tuning delay setting and decrease the magnitude of the positive fine tuning delay setting.

As previously described, the processor 28 or controller 32 may be configured to increase or decrease the value of the first fine tuning delay setting and the second fine tuning delay setting in a manner similar to that described above with respect to increasing and decreasing the value of the first fine tuning delay and the second fine tuning delay setting. Accordingly, details of the adjusting process are omitted here.

Thereafter, the processor 28 or controller 32 may configure the fine tuning delay circuit 72 to provide a fine tuning delay, $T_{FINE\_TUNING}$, based on the adjusted value of the first fine tuning delay setting. Based on the updated value of the first fine tuning delay setting and the test signal, the digital baseband circuit 14 provides the control signal 48 to the envelope tracker power converter 16. (Step 1106) In response to the control signal 48, the envelope tracker power converter 16 generates the modulated power amplifier supply voltage 58, $V_{CC}$. (Step 1108)

In response to the modulated power amplifier supply voltage 58, $V_{CC}$, and the modulated signal 56, $P_{IN}$, the radio frequency power amplifier 18 generates the radio frequency power amplifier output signal 24 at an output of the radio frequency power amplifier 18. The detector 20 measures the output power at the output of the radio frequency power amplifier 18 to obtain the first measured output power based on the adjusted value of the first fine tuning delay setting. (Step 1110)

Thereafter, the processor 28 or controller 32 may configure the fine tuning delay circuit 72 to provide a fine tuning delay, $T_{FINE\_TUNING}$, based on the adjusted value of the second fine tuning delay setting. Based on the updated value of the second fine tuning delay setting and the test signal, the digital baseband circuit 14 provides the control signal 48 to the envelope tracker power converter 16. (Step 1112) In response to the control signal 48, the envelope tracker power converter 16 generates the modulated power amplifier supply voltage 58, $V_{CC}$. (Step 1114)

In response to the modulated power amplifier supply voltage 58, $V_{CC}$, and the modulated signal 56, $P_{IN}$, the radio frequency power amplifier 18 generates the radio frequency power amplifier output signal 24 at an output of the radio frequency power amplifier 18. The detector 20 measures the output power at the output of the radio frequency power amplifier 18 to obtain the second measured output power based on the adjusted value of the second fine tuning delay setting. (Step 1116)

Thereafter, the processor 28 or controller 32 may be configured to determine whether the first measured output power substantially equals the second measured output power. (Step 1118) As a non-limiting example, the various embodiments of Step 1118 may employ the techniques previously described with respect to Step 712 of method 700, depicted in FIG. 15, to determine whether the first measured output power substantially equals the second measured output power. Accordingly, the details of the previously described techniques to determine whether the first measured output power substantially equals the second measured output power are omitted here for the sake of brevity.

In the case where the first measured output power is substantially unequal to the second measured output power, (NO), the method 1100 returns to the Step 1104 to further adjust the first fine tuning delay setting and the second fine tuning delay setting. In the case where the first measured output power substantially equals the second measured output power, (YES), the method 1100 is substantially complete. As a result, referring to FIG. 14C, after completion of the method 1100, the method 600 continues to the Step 628.

Figure 20A:
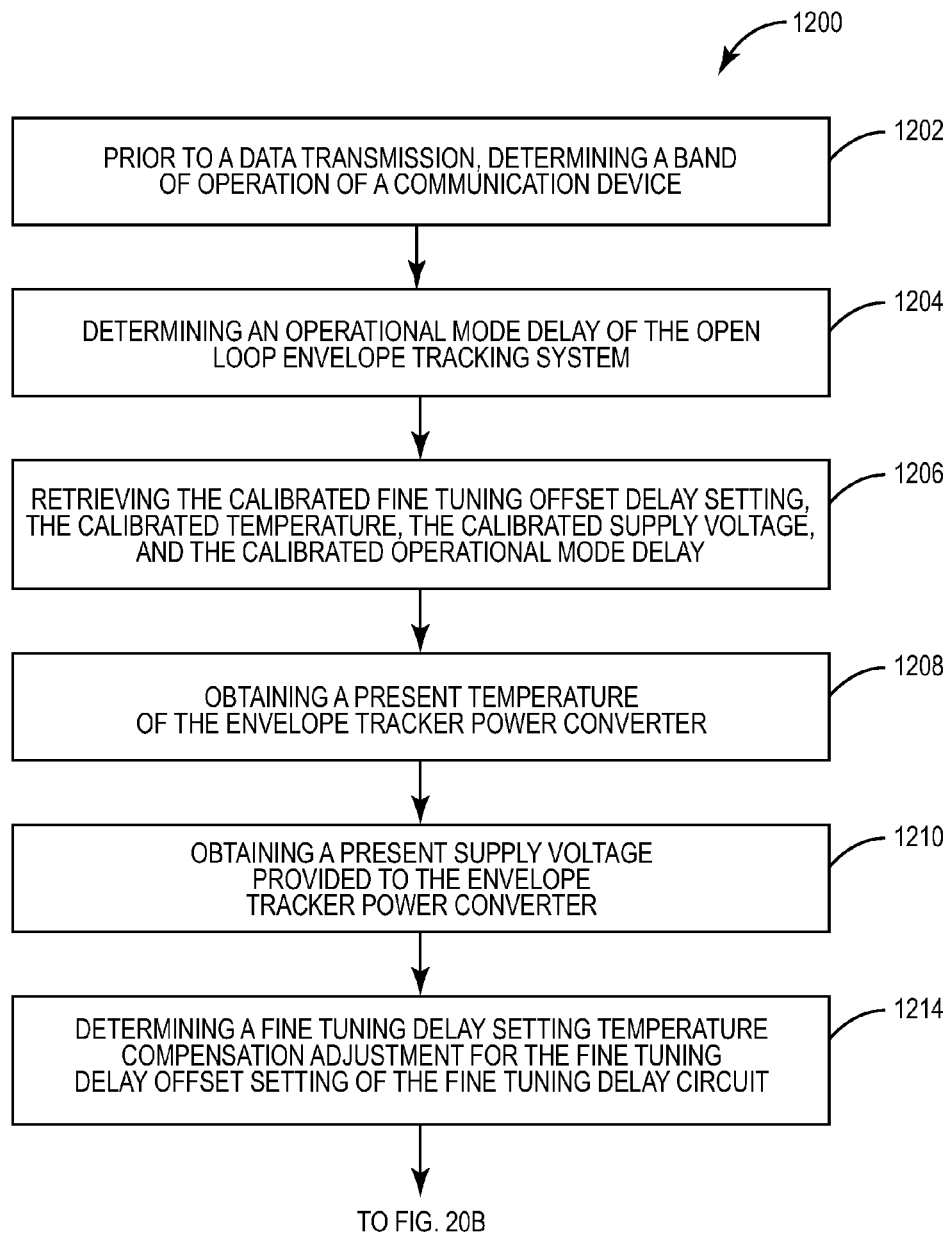
FIG. 20A and FIG. 20B depict an embodiment for transmitting data with an open loop envelope tracker system.
Figure 20B:
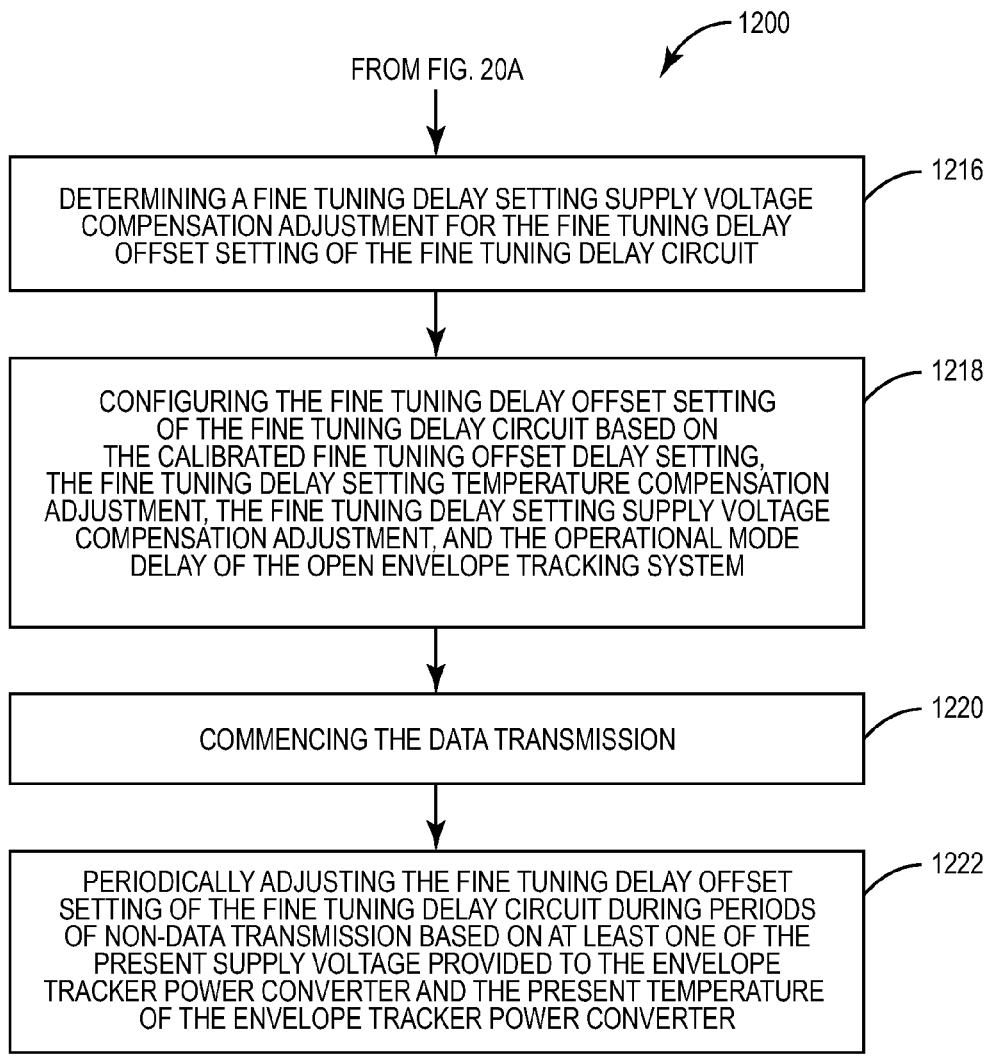

FIG. 20A and FIG. 20B depict a method 1200 for sending a data transmission using the open loop envelope tracking system 12. The description of the method 1200 will be carried out with continuing reference to FIGS. 1, 2, 9-11, FIGS. 12A-C, FIGS. 13A-C, and FIGS. 14A-C. In addition, the setup of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

In some embodiments of the method 1200, the processor 28 or the controller 32 determines a band of operation of a communication device prior to a data transmission. (Step 1202) As an example, prior to an initial data transmission, the communication device 10 may be assigned a band of operation within a communication network. The processor 28 or the controller 32 may further determine an operational mode delay of the open loop envelope tracking system 12 based on an operational mode of the communication device 10. (Step 1204) As previously described, the operational mode of the open loop envelope tracking system 12 may depend upon various factors that impact propagation of the control signal 48 and the modulated signal 56, $P_{IN}$. Thereafter, the processor 28 or the controller 32 may retrieve the calibrated fine tuning offset delay setting, the calibrated temperature, the calibrated supply voltage, and the calibrated operational mode delay based on the operational mode of the open loop envelope tracking system 12 from a memory location associated with the respective processor 28 or the controller 32. (Step 1206) The processor 28 or the controller 32 may obtain a present temperature of the envelope tracker power converter 16. (Step 1208) As previously described, the envelope tracker power converter 16 may be configured to provide an analog temperature measurement to the analog-to-digital converter 60. In addition, the processor 28 or the controller may obtain a measurement of a present supply voltage provided to the envelope tracker power converter 12. (Step 1210) As previously discussed, the envelope tracker power converter 16 may be configured to provide an analog supply voltage measurement to the analog-to-digital converter 60.

Based on the present temperature of the envelope tracker power converter 16 and the calibrated temperature, the processor 28 or the controller 32 may determine a fine tuning delay setting temperature compensation adjustment for the fine tuning delay offset setting of the fine tuning delay circuit 72. (Step 1214) For example, in some embodiments, the fine tuning delay setting temperature compensation adjustment may be determined based on a fine tuning delay temperature sensitivity slope and a difference between the present temperature of the envelope tracker power converter 16 and the calibrated temperature, as described relative to the method 1300 depicted in FIG. 21.

Figure 22A:
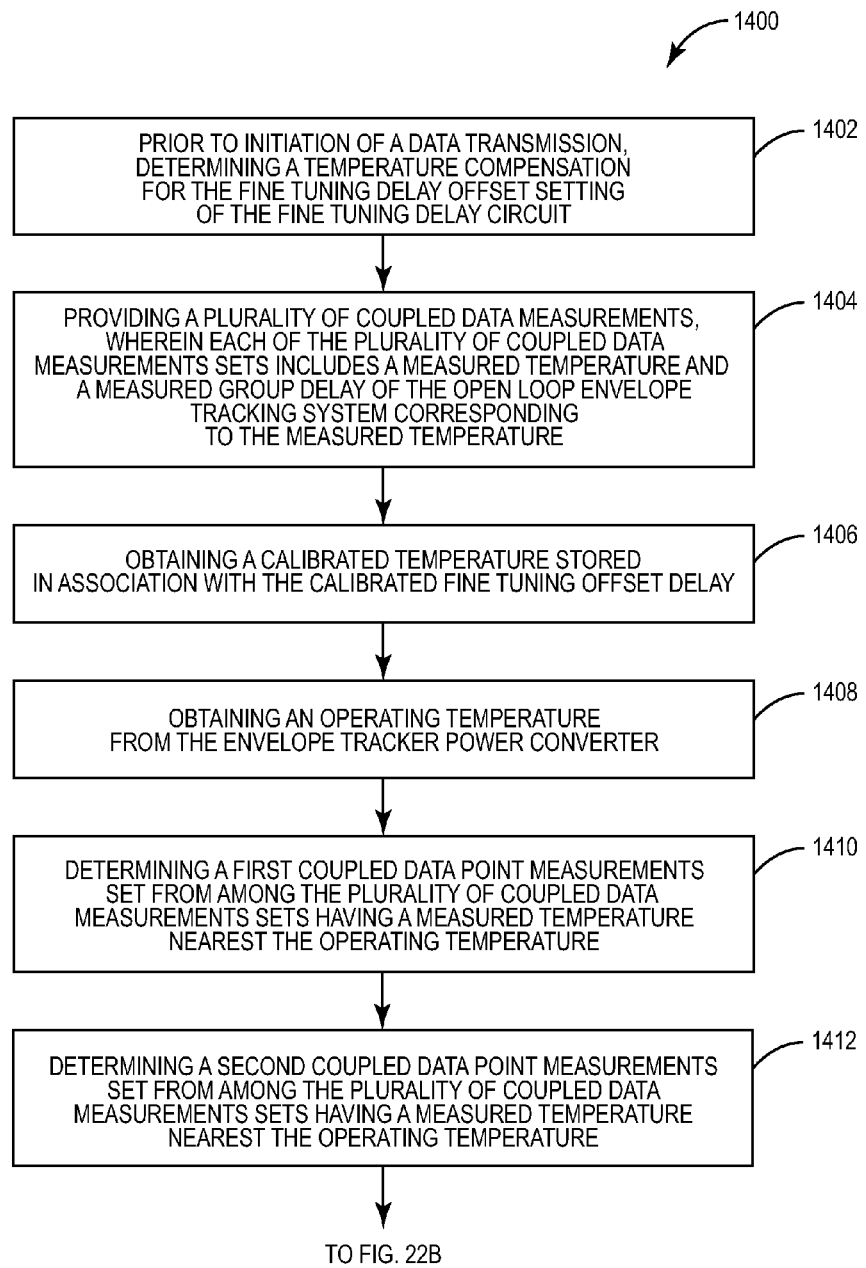
FIG. 22A and FIG. 22B depict an alternative embodiment for determining a temperature adjustment for the fine tuning delay circuit.
Figure 22B:
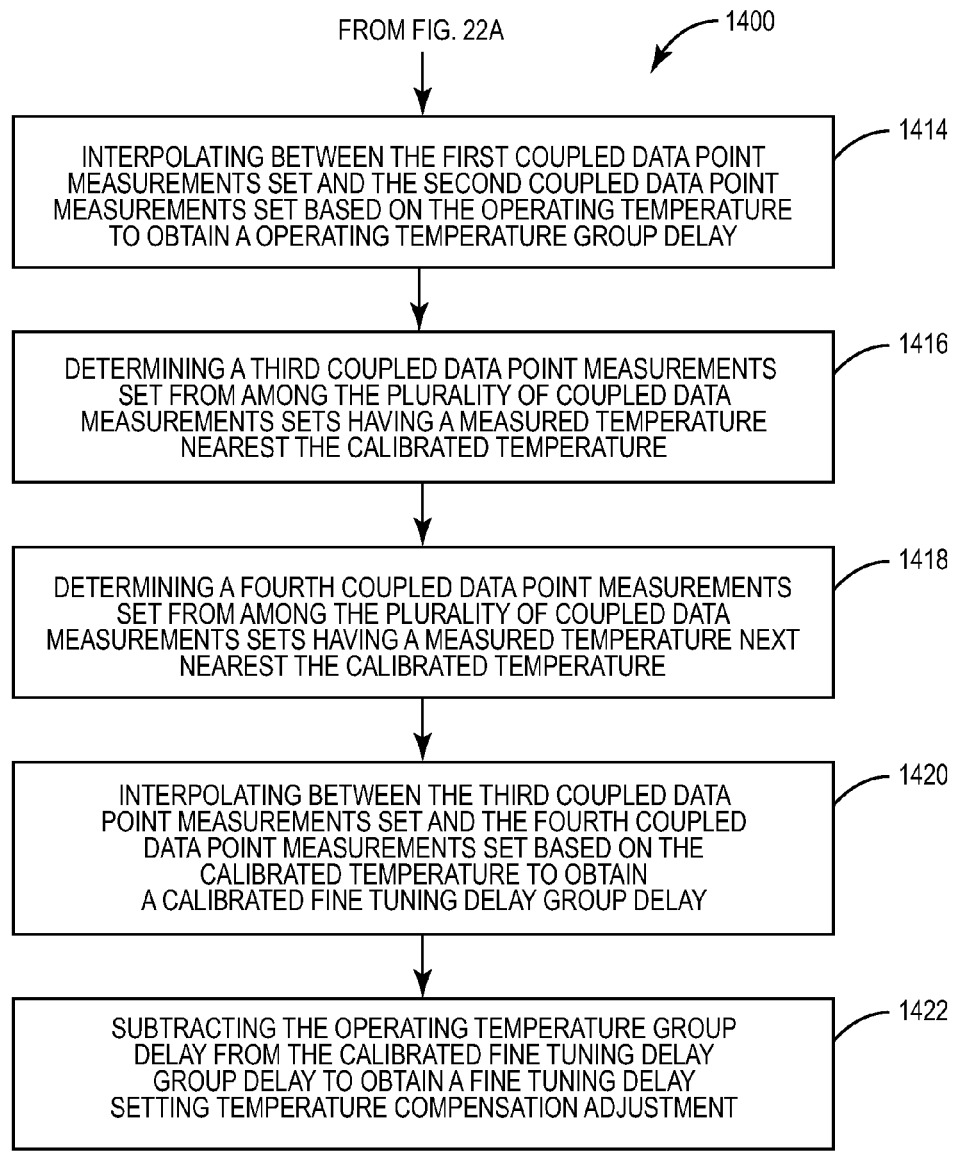

In other embodiments, the fine tuning delay setting temperature compensation adjustment may be determined based on a group delay temperature adjustment function, the present temperature of the envelope tracker power converter 16 and the calibrated temperature, as described relative to the method 1400 depicted in FIGS. 22A-B. In some cases, the group delay temperature adjustment function may be a linear function. In other cases, the group delay temperature adjustment function may be a polynomial function.

Figure 23:
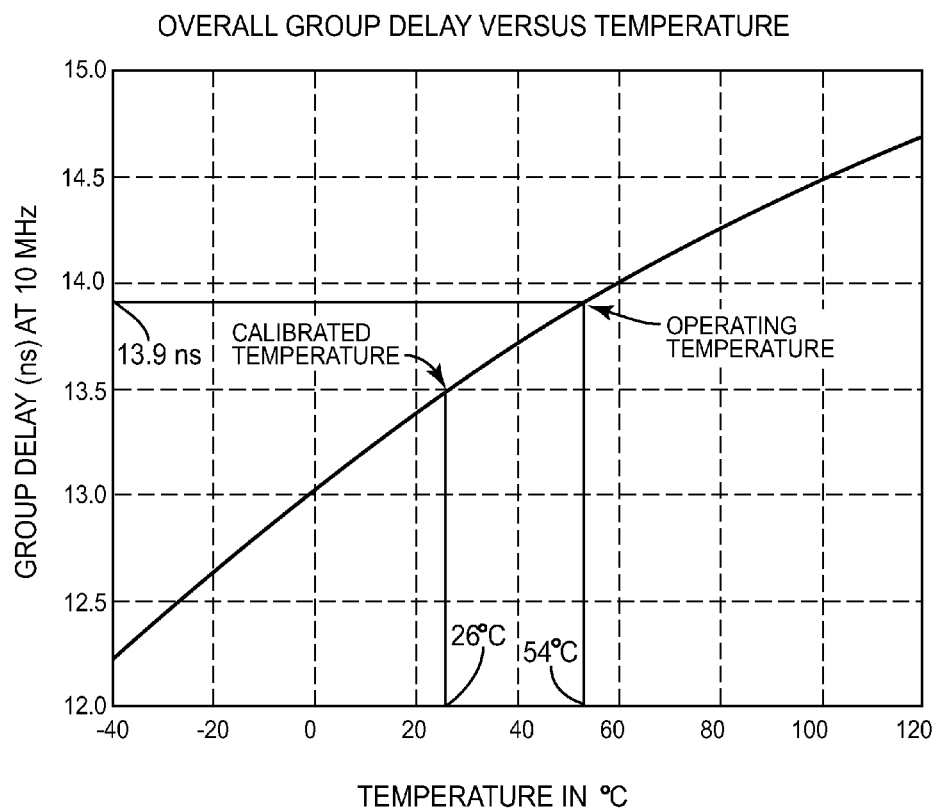
FIG. 23 depicts another embodiment for determining a temperature adjustment for the fine tuning delay circuit.

In still other embodiments, the group delay temperature adjustment function may be described based on a plurality of coupled data measurements sets, wherein each of the plurality of coupled data measurements sets includes a measured temperature and a measured group delay of the open loop envelope tracking system corresponding to the measured temperature, as depicted in FIG. 23. In still other embodiments, the plurality of coupled data measurements sets may be obtained based on a simulation of the open loop envelope tracking system 12.

Thereafter, the processor 28 and the controller 32 may determine a fine tuning delay setting supply voltage compensation adjustment for the fine tuning delay offset setting of the fine tuning delay circuit based on the calibrated supply voltage and the present supply voltage. (Step 1216) For example, the processor 28 and the controller 32 may determine a supply voltage difference by subtracting the present supply voltage from the calibrated supply voltage. Thereafter, the supply voltage difference is multiplied by a fine tuning delay supply voltage sensitivity slope to determine the fine tuning delay setting supply voltage compensation adjustment.

Based on the operational mode delay of the open loop envelope tracking system 12 and the calibrated operational mode delay, an operational mode compensation adjustment may be determined. For example, in some embodiments, the operational mode compensation adjustment may be determined by subtracting the operational mode delay of the open loop envelope tracking system 12 from the calibrated operational mode delay. The processor 28 and the controller 32 may then determine an overall fine tuning offset delay adjustment to the calibrated fine tuning offset delay by summing the fine tuning delay setting temperature compensation adjustment, the fine tuning delay setting supply voltage compensation adjustment, and the operational mode compensation adjustment. In some embodiments, the processor 28 and the controller 32 may convert the overall fine tuning offset delay adjustment from a time domain value into a fine tuning delay setting step size. For example, in the case where the overall fine tuning offset delay adjustment is approximately 3.3 ns, the processor 28 or controller 32 may divide the overall fine tuning offset delay adjustment by the minimum fine tuning delay step size to determine a fine tuning offset delay setting adjustment. In the case where the minimum fine tuning delay step size is 1.08 nanoseconds, the processor 28 or controller 32 may be configured to round the fine tuning offset delay setting adjustment to a value of three. The processor 28 or controller 32 may add the fine tuning offset delay setting adjustment to the calibrated fine tuning offset delay offset to obtain a fine tuning offset delay setting for the operational mode of the communication device 10. Thereafter, the processor 28 or the controller 32 may configure the fine tuning offset delay setting of the fine tuning delay circuit 72 based on the calibrated fine tuning offset delay setting, the fine tuning delay setting temperature compensation adjustment, the fine tuning delay setting supply voltage compensation adjustment, and the operational mode delay of the open loop envelope tracker system. (Step 1218) Thereafter, the communication device 10 may be configured to commence a data transmission. (Step 1220) In some embodiments of the method 1200, the processor 28 or controller 32 may be further configured to periodically adjust the fine tuning delay offset setting of the fine tuning delay circuit 72 during periods of non-data transmission based on at least one of the present supply voltage provided to the envelope tracker power converter 16 and the present temperature of the envelope tracker power converter 16. (Step 1222)

Figure 21:
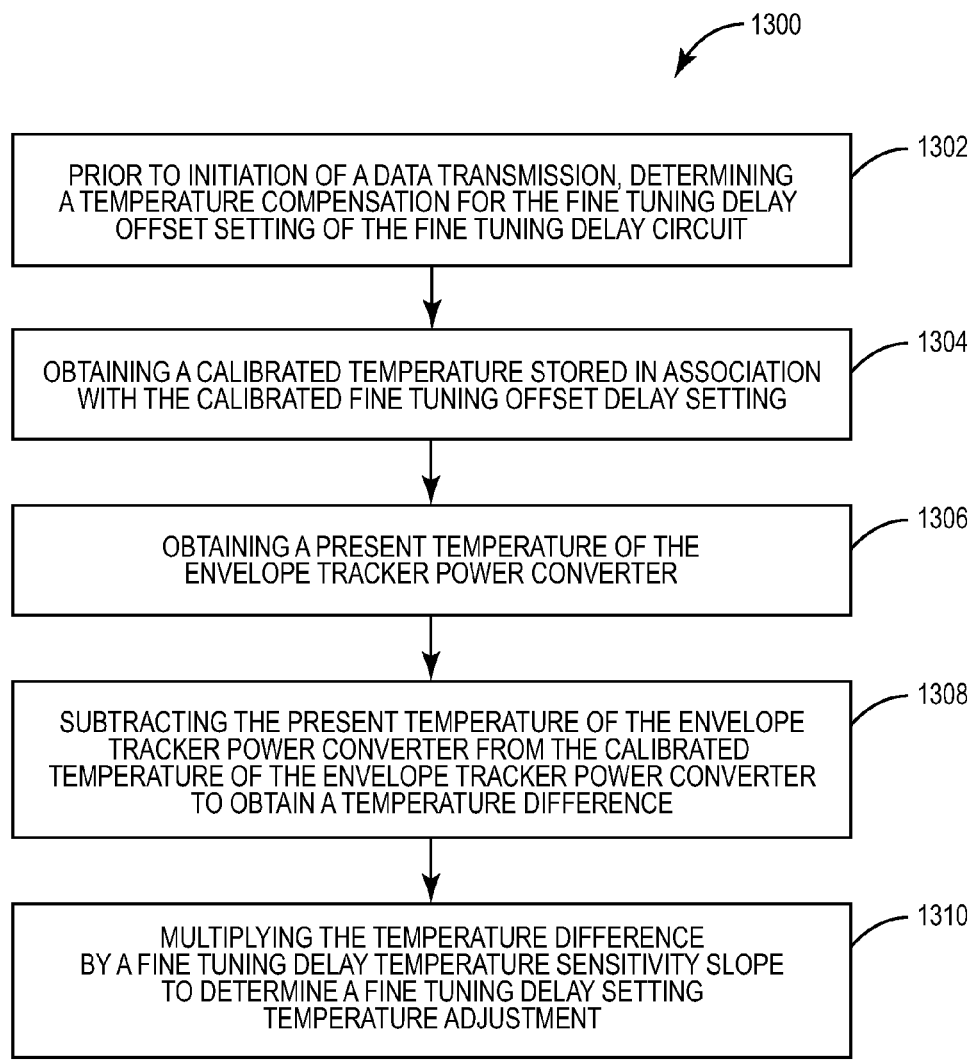
FIG. 21 depict an embodiment for determining a temperature adjustment for the fine tuning delay circuit.

FIG. 21 depicts an embodiment of a method 1300 for determining a fine tuning delay setting temperature compensation adjustment for the fine tuning delay offset setting of the fine tuning delay circuit 72. The description of the method 1300 will be carried out with continuing reference to FIGS. 1-2, FIGS. 14A-C, and FIGS. 20A-B. In addition, the control of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions. Some embodiments of the method 1300 may include, prior to initiation of a data transmission, the processor 28 or controller 32 determining a temperature compensation adjustment for the fine tuning delay offset setting of the fine tuning delay setting of the fine tuning delay circuit 72. (Step 1302) In some alternative embodiments of method 1300, the fine tuning delay setting temperature adjustment may be carried out periodically between active transmissions of data by the communication device 10. To determine a fine tuning delay setting temperature compensation adjustment for the fine tuning delay offset setting of the fine tuning delay circuit 72, the processor 28 or the controller 32 may obtain a calibrated temperature stored in association with the calibrated fine tuning offset delay setting. (Step 1304) The calibrated temperature may be stored in a memory location accessible by the processor 28 or the controller 32. The processor 28 or the controller 32 may obtain a present temperature of the envelope tracker power converter 16. (Step 1306) For example, the envelope tracker power converter 16 may be configured to provide an analog temperature measurement signal to the analog-to-digital converter interface 46. The analog-to-digital converter 60 may convert the analog temperature measurement from the envelope tracker power converter 16 into a digital temperature measurement. Alternatively, in some embodiments, the envelope tracker power converter 16 may provide a digital temperature measurement directly to the processor 28 or the controller 32. Thereafter, the processor 28 or controller 32 may subtract the present temperature of the envelope tracker power converter 16 from the calibrated temperature of the envelope tracker power converter 16 to obtain a temperature difference. (Step 1308) The temperature difference may be multiplied by a fine tuning delay temperate sensitivity slope to determine the fine tuning delay setting temperature adjustment. (Step 1310) In some embodiments, the fine tuning delay setting temperature adjustment may represent a group delay adjustment in nanoseconds. In other embodiments, the fine tuning delay setting temperature adjustment may represent an adjustment to be made to the calibrated fine tuning offset delay setting based on a minimum fine tuning delay setting step size. For example, in the case where the fine tuning delay setting temperature adjustment may represent a group delay adjustment, the processor 28 or controller 32 may divide the fine tuning delay setting temperate adjustment by a minimum fine tuning delay step size to determine the adjustment to be made to the calibrated fine tuning offset delay setting.

FIGS. 22A-B depict an alternative embodiment of a method 1400 for determining a fine tuning delay setting temperature compensation adjustment for the fine tuning delay offset setting of the fine tuning delay circuit 72. The description of the method 1400 will be carried out with continuing reference to FIGS. 1-2, FIGS. 14A-C, FIGS. 20A-B, and FIG. 23. The control of the open loop envelope tracking system 12 may be carried out by the processor 28, the controller 32, firmware within the digital baseband circuit 14, and/or various combinations thereof. Accordingly, the specific description provided herein is a non-limiting example for the purposes of explanation. Accordingly, specific references to the processor 28 and the controller 32 are by ways of example and do not exclude the firmware within the digital baseband circuit 14 from carrying out the described functions.

As previously discussed, in some embodiments, the fine tuning delay setting temperature compensation adjustment may be determined based on a group delay temperature adjustment function, the present temperature of the envelope tracker power converter 16 and the calibrated temperature, as described relative to the method 1400 depicted in FIGS. 22A-B. As a non-limiting example, the method 1400 depicts a technique for determining a temperature compensation for the fine tuning delay offset setting of the fine tuning delay circuit 72, which may be carried output prior to initiation of a data transmission. (Step 1402) In some alternative embodiments of method 1400, the fine tuning delay setting temperature adjustment may be carried out periodically between active transmissions of data by the communication device 10.

As previously discussed, in some embodiments of method 1400, a group delay temperature adjustment function may be used to determine the fine tuning delay setting temperature adjustment. As a non-limiting example, FIG. 23 depicts a group delay temperature adjustment function that is described based on a plurality of coupled data measurements sets, wherein each of the plurality of coupled data measurements sets includes a measured temperature and a measured group delay of the open loop envelope tracking system 12 corresponding to the measured temperature. As an example, FIG. 24 depicts a relationship between the overall group delay of the open loop envelope tracking system 12 versus temperature. FIG. 24 depicts that the calibrated temperature is associated with a temperature equal to 26° C., which corresponds to a group delay of 13.9 nanoseconds for a modulated signal 56, $P_{IN}$, at 10 MHz. An example operating temperature is equal to 56° C., which corresponds to a group delay of approximately 13.9 nanoseconds.

The group delay temperature adjustment function may be developed by measuring a number of open loop envelope tracking systems 12. In other embodiments, the plurality of coupled data measurements sets may be obtained based on a simulation of the open loop envelope tracking system 12. In addition, the group delay temperature adjustment function may be adjusted based on temperature characteristics of the integrated circuits of the open loop envelope tracking system 12. In some embodiments, the open loop envelope tracking system 12 may have one or more group delay temperature adjustment functions, where each of the group delay temperature adjustment functions may depend on an operational mode of the open loop envelope tracking system 12. For example, the group delay temperature adjustment function may depend upon a frequency content of the modulated signal 56, $P_{IN}$, which may be related to a band of operation assigned to a communication device 10 in a communication network.

As a non-limiting example, a plurality of coupled data measurements sets may be provided in a memory location accessible to the processor 28 or controller 32, wherein each of the plurality of coupled data measurements sets includes a measured temperature and a measured group delay of the open loop envelope tracking system 12 corresponding to the measured temperature. (Step 1404) The processor 28 or controller 32 may obtain a calibrated temperature stored in association with the calibrated fine tuning offset delay setting. (Step 1406) Thereafter, as previously described above, the processor 28 or controller 32 may obtain an operating temperate from the envelope tracker power converter 16. (Step 1408) The operating temperature represents the present temperature of the envelope tracker power converter 16. In some alternative embodiments, where the open loop envelope tracking system 12 is a module or a single integrated chip, the operating temperature may represent a present temperature of the module or the single integrated chip. The operating temperature may be obtained as either a digital temperature measurement or an analog temperature measurement, as previously described.

Based on the operating temperature, the processor 28 or controller 32 may determine a first coupled data point measurements set from among the plurality of coupled data measurements sets having a measured temperature nearest the operating temperature. (Step 1410) For example, as depicted in FIG. 24, the first coupled data point measurement set may correspond to a coupled data measurement set having a measured temperature of 60° C. and a group delay of 14 nanoseconds. Based on the operating temperature, the processor 28 or controller 32 may determine a second coupled data point measurements set from among the plurality of coupled data measurements sets having a measured temperature nearest the operating temperature. (Step 1412) For example, as depicted in FIG. 24, the second coupled data point measurement set may correspond to a coupled data measurement set having a measured temperature of 40° C. and a group delay of around 13.75 nanoseconds. The processor 28 or controller 32 may interpolate between the first coupled data point measurements set and the second coupled data point measurements set based on the operating temperature to obtain an operating temperature group delay. (Step 1414) In some embodiments, the interpolation function may be a linear interpolation function.

Based on the calibrated temperature, the processor 28 or controller 32 may determine a third coupled data point measurements set from among the plurality of coupled data measurements sets having a measured temperature nearest the calibrated temperature. (Step 1416) For example, as depicted in FIG. 24, the third coupled data point measurement set may correspond to a coupled data measurement set having a measured temperature of 20° C. and a group delay of approximately 13.4 nanoseconds. Based on the operating temperature, the processor 28 or controller 32 may determine a fourth coupled data point measurements set from among the plurality of coupled data measurements sets having a measured temperature nearest the calibrated temperature. (Step 1418) For example, as depicted in FIG. 24, the fourth coupled data point measurement set may correspond to a coupled data measurement set having a measured temperature of 40° C. and a group delay of 13.75 nanoseconds. The processor 28 or controller 32 may interpolate between the third coupled data point measurements set and the fourth coupled data point measurements set based on the operating temperature to obtain a calibrated fine tuning delay group delay. (Step 1420) In some embodiments, the interpolation function may be a linear interpolation function. The processor 28 or controller 32 may then subtract the operating temperature group delay from the calibrated fine tuning delay group delay to obtain a fine tuning delay setting temperature compensation adjustment. (Step 1422) Illustratively, as depicted in FIG. 24, the fine tuning delay setting temperature compensation adjustment would be equal to approximately 0.4 nanoseconds, which may be used to adjust the fine tuning delay setting of the fine tuning delay circuit 72 in order to maintain a minimum group delay mismatch.

Those skilled in the art will recognize improvements and modifications to the embodiments of the present disclosure. All such improvements and modifications are considered within the scope of the concepts disclosed herein and the claims that follow.

What is claimed is:

1. A system for performing sample rate conversion and creating fractional delays to a signal, the system comprising:
    a filter;
    a look up table for storing coefficients for sample rate conversion and fractional delays, wherein the coefficients stored in the look up table comprise the coefficients required to generate delays in desired increments of a sample rate;
    control circuitry configured to use an indexing scheme to select one or more coefficients from the look up table for rate conversion and fractional delays, wherein the one or more coefficients necessary for a desired sample rate and fractional delay are selected from a single look up table.

2. The system of claim 1, wherein the look up table only stores one output period of delay coefficients for the fractional delay.

3. The system of claim 1, further comprising a buffer for implementing integer delays.

4. The system of claim 1, wherein the filter implements the fractional delay.

5. The system of claim 1, wherein the control circuitry comprises a modulo counter configured to select the coefficients.

6. The system of claim 5, wherein the modulo counter has a programmable delay value to determine a preset for the modulo counter.

7. The system of claim 6, wherein the preset is a function of the desired delay.

8. The system of claim 5, wherein for a given output sample rate, the control circuitry is configured to index into the look up table in increments that correspond to the desired delay.

9. The system of claim 5, wherein the control circuitry is configured to index through the look up table faster than the sample rate at fractional increments to interpolate and create fractional delays.

10. The system of claim 5, wherein the modulo counter has a programmable ratio value to determine an increment for the modulo counter.

11. The system of claim 10, wherein the increment is a function of an interpolation rate.

12. The system of claim 5, wherein the modulo counter has a control for controlling a buffer for implementing integer delays.

13. The system of claim 1, wherein the filter comprises a finite impulse response (FIR) filter.

14. The system of claim 1, wherein the fractional delay is 1/36.

15. The system of claim 14, wherein the look up table contains 36 sets of coefficients.

16. The system of claim 1, wherein the fractional delay is 1/18.

17. The system of claim 16, wherein the look up table contains 18 sets of coefficients.

18. A method for performing sample rate conversion and creating fractional delays to a signal, the method comprising:
    selecting one or more coefficients based on an indexing scheme from a look up table that stores coefficients for sample rate conversion and fractional delays, wherein the coefficients stored in the look up table comprise the coefficients required to generate delays in desired increments of a sample rate;
    providing the selected one or more coefficients to a filter to delay the signal based upon the input sample rate.

19. The method of claim 18, where the filter delays the signal by a fractional delay.

20. The method of claim 18, wherein the coefficients necessary for a desired sample rate and fractional delay are selected from a single look up table.

21. The method of claim 18, wherein the look up table only stores one output period of delay coefficients for the fractional delay.

22. The method of claim 18, further comprising implementing integer delays via a buffer.

23. The method of claim 18, wherein the selecting of the coefficients is performed by a modulo counter configured to perform the indexing scheme to select the coefficients.

24. The method of claim 18, further determining a preset value for the delay.

25. The method of claim 24, wherein the preset value is a function of the desired delay.

26. The method of claim 18, wherein for a given output sample rate, selecting the one or more coefficients comprises indexing into the look up table in an increment that corresponds to a desired delay.

27. The method of claim 26, further comprising programming a modulo counter with a programmable ratio value to determine the increment.

28. The method of claim 26, wherein the increment is a function of an interpolation rate.

29. The method of claim 18, wherein selecting the one or more coefficients comprises indexing through the look up table faster than the sample rate at fractional increments to interpolate and create fractional delays.

30. The method of claim 18, further comprising controlling a buffer for implementing integer delays.

31. The method of claim 18, wherein the fractional delay is 1/36.

32. The method of claim 31, wherein the look up table contains 36 sets of coefficients.

33. The method of claim 18, wherein the fractional delay is 1/18.

34. The method of claim 33, wherein the look up table contains 18 sets of coefficients.

* * * * *